(12) United States Patent
Song

(10) Patent No.: US 11,720,354 B2
(45) Date of Patent: Aug. 8, 2023

(54) PROCESSING-IN-MEMORY (PIM) SYSTEM AND OPERATING METHODS OF THE PIM SYSTEM

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 17/148,473

(22) Filed: Jan. 13, 2021

(65) Prior Publication Data

US 2021/0208880 A1    Jul. 8, 2021

Related U.S. Application Data

(63) Continuation-in-part of application No. 17/027,276, filed on Sep. 21, 2020, now Pat. No. 11,513,733.

(60) Provisional application No. 62/958,226, filed on Jan. 7, 2020.

(30) Foreign Application Priority Data

Jan. 17, 2020    (KR) .................. 10-2020-0006903

(51) Int. Cl.
  *G06F 15/78*    (2006.01)
  *G06F 9/30*     (2018.01)
  *H03K 19/20*    (2006.01)
  *G06F 9/38*     (2018.01)

(52) U.S. Cl.
  CPC ........ *G06F 9/3001* (2013.01); *G06F 9/30029* (2013.01); *G06F 9/30043* (2013.01); *G06F 9/30189* (2013.01); *G06F 9/3836* (2013.01); *G06F 15/7821* (2013.01); *H03K 19/20* (2013.01)

(58) Field of Classification Search
  None
  See application file for complete search history.

(56) References Cited

U.S. PATENT DOCUMENTS

| | | | |
|---|---|---|---|
| 7,400,326 B1 * | 7/2008 | Acocella | G06F 13/4018 345/520 |
| 10,042,639 B2 | 8/2018 | Gopal et al. | |
| 10,642,612 B2 * | 5/2020 | Kim | G06F 9/3001 |
| 2006/0069869 A1 * | 3/2006 | Lakshmanamurthy | G06F 12/0804 711/E12.04 |

(Continued)

*Primary Examiner* — John M Lindlof
(74) *Attorney, Agent, or Firm* — William Park & Associates Ltd.

(57) ABSTRACT

A processing-in-memory (PIM) controller includes a read/arithmetic queue logic circuit, a write queue logic circuit, and a scheduling logic circuit. The read/arithmetic queue logic circuit stores read queues and arithmetic queues, generates an arithmetic mode signal when an arithmetic queue exists in the read/arithmetic queue logic circuit, and outputs the arithmetic queue in response to an arithmetic mode enablement signal. The write queue logic circuit stores write queues, generates an arithmetic write signal when an arithmetic write queue exists in the write queue logic circuit, and outputs the write queue in response to an arithmetic write enablement signal. The scheduling logic circuit transmits the arithmetic mode enablement signal to the read/arithmetic queue logic circuit in response to the arithmetic mode signal and transmits the arithmetic write enablement signal to the write queue logic circuit in response to the arithmetic write signal.

30 Claims, 73 Drawing Sheets

(56) References Cited

U.S. PATENT DOCUMENTS

| | | | |
|---|---|---|---|
| 2008/0183903 A1* | 7/2008 | VanStee | G06F 13/161 |
| | | | 710/5 |
| 2011/0093665 A1* | 4/2011 | Walker | G11C 8/12 |
| | | | 711/E12.001 |
| 2018/0341430 A1 | 11/2018 | Chiu et al. | |
| 2020/0089472 A1 | 3/2020 | Pareek et al. | |
| 2020/0174749 A1 | 6/2020 | Kang et al. | |
| 2021/0072986 A1 | 3/2021 | Yudanov et al. | |

\* cited by examiner

PROCESSING-IN-MEMORY (PIM) SYSTEM AND OPERATING METHODS OF THE PIM SYSTEM

CROSS-REFERENCE TO RELATED APPLICATIONS

This is a continuation-in-part of U.S. patent application Ser. No. 17/027,276, filed Sep. 21, 2020, which claims the priority of provisional application No. 62/958,226, filed on Jan. 7, 2020, and Korean Application No. 10-2020-0006903, filed on Jan. 17, 2020, which are incorporated herein by reference in their entirety.

BACKGROUND

1. Technical Field

Various embodiments of the present disclosure relate to processing-in-memory (PIM) systems and, more particularly, to PIM systems including a PIM device and a controller and methods of operating the PIM systems.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks having increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

According to an embodiment, a PIM controller is configured to control a PIM device having a memory function and an arithmetic function. The PIM controller includes a read/arithmetic queue logic circuit, a write queue logic circuit, and a scheduling logic circuit. The read/arithmetic queue logic circuit is configured to store a read queue for requesting to read out data stored in the PIM device and an arithmetic queue for requesting an arithmetic operation of the PIM device, configured to generate an arithmetic mode signal having a first level when the arithmetic queue exists in the read/arithmetic queue logic circuit, and configured to output the arithmetic queue from the read/arithmetic queue logic circuit in response to receiving an arithmetic mode enablement signal having the first level. The write queue logic circuit is configured to store a write queue for requesting to write data in the PIM device, configured to generate an arithmetic write signal having the first level when an arithmetic write queue used for execution of the arithmetic function exists in the write queue logic circuit, and configured to output the write queue from the write queue logic circuit in response to receiving an arithmetic write enablement signal having the first level. The scheduling logic circuit is configured to perform a scheduling operation by adjusting an output sequence of the read queue, the arithmetic queue, and the write queue, configured to transmit the arithmetic mode enablement signal having the first level to the read/arithmetic queue logic circuit in response to receiving the arithmetic mode signal having the first level, and configured to transmit the arithmetic write enablement signal having the first level to the write queue logic circuit in response to receiving the arithmetic write signal having the first level.

According to another embodiment, a PIM controller is configured to control a PIM device having a memory function and an arithmetic function. The PIM controller includes a read queue logic circuit, an arithmetic queue logic circuit, a write queue logic circuit, and a scheduling logic circuit. The read queue logic circuit is configured to store a read queue for requesting to read out data stored in the PIM device. The arithmetic queue logic circuit is configured to store an arithmetic queue for requesting an arithmetic operation of the PIM device, configured to generate an arithmetic mode signal having a first level when the arithmetic queue exists in the arithmetic queue logic circuit, and configured to output the arithmetic queue from the arithmetic queue logic circuit in response to receiving an arithmetic mode enablement signal having the first level. The write queue logic circuit is configured to store a write queue for requesting to write data in the PIM device, configured to generate an arithmetic write signal having the first level when an arithmetic write queue necessary for execution of the arithmetic function exists in the write queue logic circuit, and configured to output the arithmetic write queue in response to receiving an arithmetic write enablement signal having the first level. The scheduling logic circuit is configured to perform a scheduling operation by adjusting an output sequence of the read queue, the arithmetic queue, and the write queue, configured to transmit the arithmetic mode enablement signal having the first level to the arithmetic queue logic circuit in response to receiving the arithmetic mode signal having the first level, and configured to transmit the arithmetic write enablement signal having the first level to the write queue logic circuit in response to receiving the arithmetic write signal having the first level.

Another embodiment is directed to a method of driving a PIM controller which is configured to control a PIM device having a memory function and an arithmetic function and which includes a read/arithmetic queue logic circuit for storing read queues and arithmetic queues and a write queue logic circuit storing memory write queues and arithmetic write queues. The method includes storing the read queue or the arithmetic queue in the read/arithmetic queue logic circuit when a read request or an arithmetic request, respectively, is transmitted from an external device to the PIM controller, storing the memory write queue or the arithmetic write queue in the write queue logic circuit when a write request is transmitted from the external device to the PIM controller, counting and increasing the total number of read queues and arithmetic queues stored in the read/arithmetic queue logic circuit to generate a first queue counted value when the read queue or the arithmetic queue is stored in the read/arithmetic queue logic circuit, and counting and increasing the total number of memory write queues and arithmetic write queues stored in the write queue logic circuit to generate a second queue counted value when the memory write queue or the arithmetic write queue is stored in the write queue logic circuit.

Another embodiment is directed to a method of driving a PIM controller which is configured to control a PIM device having a memory function and an arithmetic function and which includes a read/arithmetic queue logic circuit for storing read queues and arithmetic queues and a write queue logic circuit for storing write queues including memory write queues and arithmetic write queues. The method includes setting a first output priority for sequentially outputting the read queue and the write queue when at least one arithmetic queue does not exist in the read/arithmetic queue logic circuit and setting a second output priority for outputting the arithmetic queue in advance of the read queue when at least one arithmetic queue exists in the read/arithmetic queue logic circuit.

Another embodiment is directed to a method of driving a PIM controller which is configured to control a PIM device having a memory function and an arithmetic function and which includes a read queue logic circuit for storing read queues, an arithmetic queue logic circuit for storing arithmetic queues, and a write queue logic circuit for storing memory write queues and arithmetic write queues. The method includes storing the read queue in the read queue logic circuit when a read request is transmitted from an external device to the PIM controller, storing the arithmetic queue in the arithmetic queue logic circuit when an arithmetic request is transmitted from the external device to the PIM controller, storing the memory write queue or the arithmetic write queue in the write queue logic circuit when a write request is transmitted from the external device to the PIM controller, counting and increasing the number of read queues stored in the read queue logic circuit to generate a first queue counted value when at least one read queue is stored in the read queue logic circuit, counting and increasing the total number of memory write queues and arithmetic write queues stored in the write queue logic circuit to generate a second queue counted value when at least one memory write queue or arithmetic write queue is stored in the write queue logic circuit, and counting and increasing the number of arithmetic queues stored in the arithmetic queue logic circuit to generate a third queue counted value when at least one arithmetic queue is stored in the arithmetic queue logic circuit.

Another embodiment is directed to a method of driving a PIM controller which is configured to control a PIM device having a memory function and an arithmetic function and which includes a read queue logic circuit for storing read queues, an arithmetic queue logic circuit for storing arithmetic queues, and a write queue logic circuit for storing write queues including memory write queues and arithmetic write queues. The method includes setting a first output priority for sequentially outputting the read queue and the write queue when at least one arithmetic queue does not exist in the arithmetic queue logic circuit and setting a second output priority for outputting the arithmetic queue in advance of the read queue when at least one arithmetic queue exists in the arithmetic queue logic circuit.

BRIEF DESCRIPTION OF THE DRAWINGS

Certain features of the disclosed technology are illustrated in various embodiments with reference to the attached drawings.

DETAILED DESCRIPTION OF THE EMBODIMENTS

In the following description of embodiments, it will be understood that the terms "first" and "second" are intended to identify elements, but not used to define a particular number or sequence of elements. In some instances, the term "certain" is used in place of the term "first" or "second" to identify an element. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to PIM systems and methods of operating the PIM systems.

Figure 1:
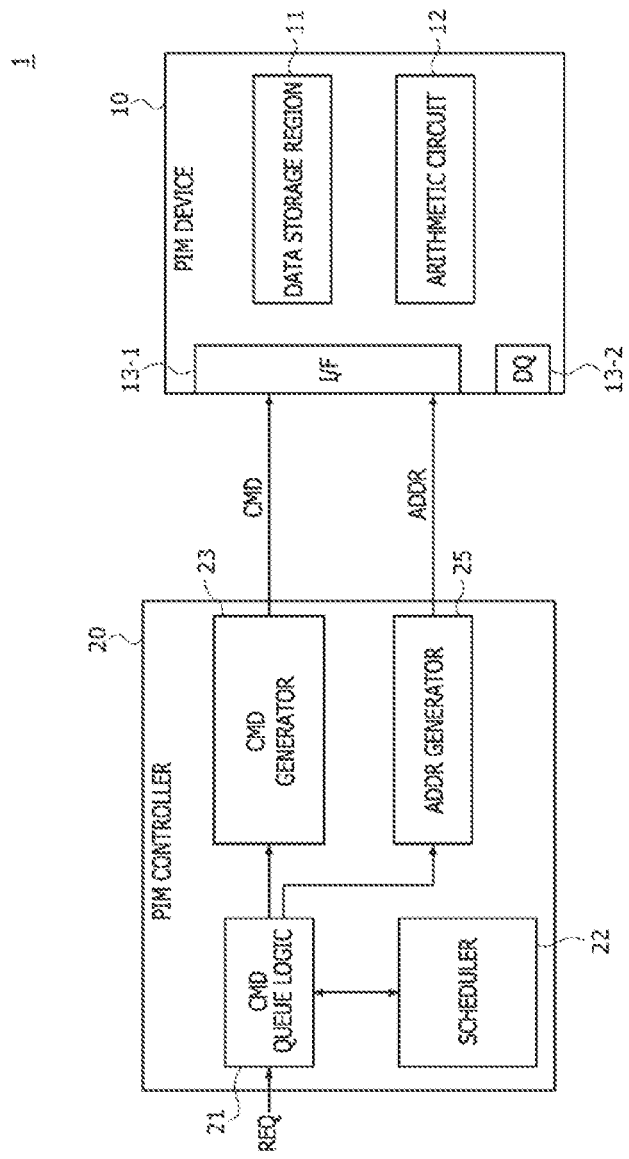
FIG. 1 is a block diagram illustrating a PIM system according to an embodiment of the present disclosure.

FIG. 1 is a block diagram illustrating a PIM system according to an embodiment of the present disclosure. As illustrated in FIG. 1, the PIM system 1 may include a PIM device 10 and a PIM controller 20. The PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2.

The interface 13-1 of the PIM device 10 may receive a command CMD and address ADDR from the PIM controller 20. The interface 13-1 may output the command CMD to the data storage region 11 or the arithmetic circuit 12 in the PIM device 10. The interface 13-1 may output the address ADDR to the data storage region 11 in the PIM device 10. The data I/O pad 13-2 of the PIM device 10 may function as a data communication terminal between a device external to the PIM device 10, for example the PIM controller 20, and the data storage region 11 included in the PIM device 10. The external device to the PIM device 10 may correspond to the PIM controller 20 of the PIM system 1 or a host located outside the PIM system 1. Accordingly, data outputted from the host or the PIM controller 20 may be inputted into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or an arithmetic mode. In the event that the PIM controller 20 controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the arithmetic mode, the arithmetic circuit 12 of the PIM device 10 may receive first data and second data from the data storage region 11 to perform an arithmetic operation. In the event that the PIM controller 20 controls the PIM device 10 such that the PIM device 10 operates in the arithmetic mode, the PIM device 10 may also perform the data read operation and the data write operation for the data storage region 11 to execute the arithmetic operation. The arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PIM controller 20 may be configured to include command queue logic 21, a scheduler 22, a command (CMD) generator 23, and an address (ADDR) generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The command queue stored in the command queue logic 21 may be transmitted to the command generator 23 according to a sequence determined by the scheduler 22. The command queue logic 21, and also the command queue logic 210 of FIGS. 2 and 20, may be implemented as hardware, software, or a combination of hardware and software. For example, the command queue logic 21 and/or 210 may be a command queue logic circuit operating in accordance with an algorithm and/or a processor executing command queue logic code.

The scheduler 22 may adjust a sequence of the command queue when the command queue stored in the command queue logic 21 is outputted from the command queue logic 21. In order to adjust the output sequence of the command queue stored in the command queue logic 21, the scheduler 22 may analyze the information on the storage status of the command queue provided by the command queue logic 21 and may readjust a process sequence of the command queue so that the command queue is processed according to a proper sequence.

The command generator 23 may receive the command queue related to the memory mode of the PIM device 10 and the MAC mode of the PIM device 10 from the command queue logic 21. The command generator 23 may decode the command queue to generate and output the command CMD. The command CMD may include a memory command for the memory mode or an arithmetic command for the arithmetic mode. The command CMD outputted from the command generator 23 may be transmitted to the PIM device 10.

The command generator 23 may be configured to generate and transmit the memory command to the PIM device 10 in the memory mode. The command generator 23 may be configured to generate and transmit a plurality of arithmetic commands to the PIM device 10 in the arithmetic mode. In one example, the command generator 23 may be configured to generate and output first to fifth arithmetic commands with predetermined time intervals in the arithmetic mode. The first arithmetic command may be a control signal for reading the first data out of the data storage region 11. The second arithmetic command may be a control signal for reading the second data out of the data storage region 11. The third arithmetic command may be a control signal for latching the first data in the arithmetic circuit 12. The fourth arithmetic command may be a control signal for latching the second data in the arithmetic circuit 12. And the fifth MAC command may be a control signal for latching arithmetic result data of the arithmetic circuit 12.

The address generator 25 may receive address information from the command queue logic 21 and generate the address ADDR for accessing a region in the data storage region 11. In an embodiment, the address ADDR may include a bank address, a row address, and a column address. The address ADDR outputted from the address generator 25 may be inputted to the data storage region 11 through the interface (I/F) 13-1.

Figure 2:
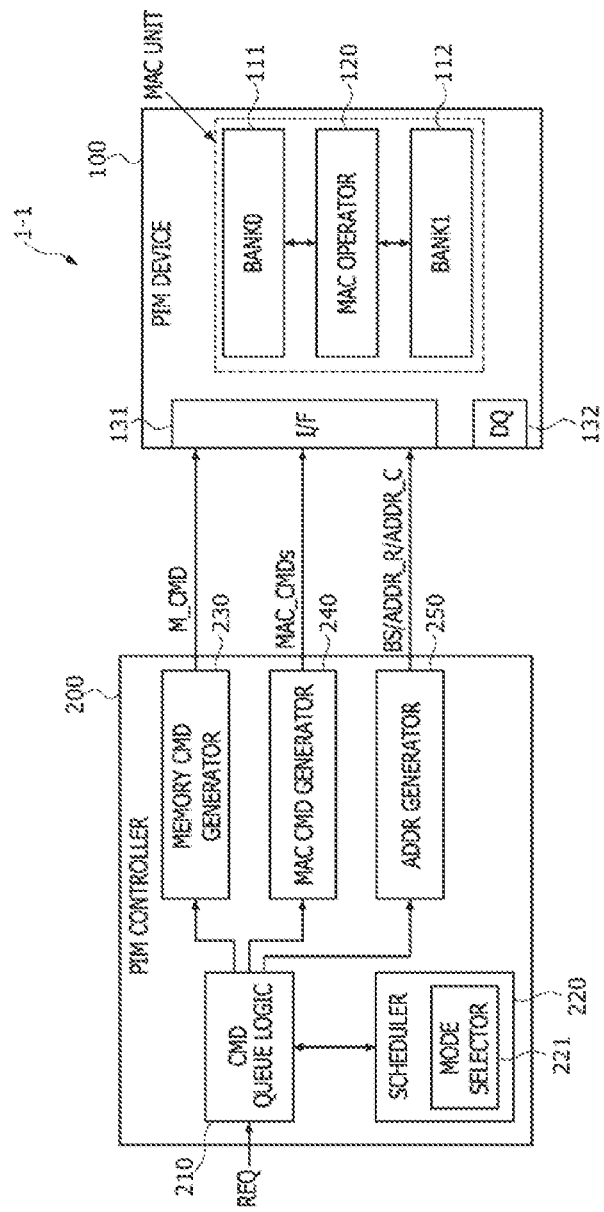
FIG. 2 is a block diagram illustrating a PIM system according to a first embodiment of the present disclosure.

FIG. 2 is a block diagram illustrating a PIM system 1-1 according to a first embodiment of the present disclosure. As illustrated in FIG. 2, the PIM system 1-1 may include a PIM device 100 and a PIM controller 200. The PIM device 100 may include a first memory bank (BANK0) 111, a second memory bank (BANK1) 112, a MAC operator 120, an interface (I/F) 131, and a data input/output (I/O) pad 132. For an embodiment, the MAC operator 120 represents a MAC operator circuit. The first memory bank (BANK0) 111, the second memory bank (BANK1) 112, and the MAC operator 120 included in the PIM device 100 may constitute one MAC unit. In another embodiment, the PIM device 100 may include a plurality of MAC units. The first memory bank (BANK0) 111 and the second memory bank (BANK1) 112 may represent a memory region for storing data, for example, a DRAM device. Each of the first memory bank (BANK0) 111 and the second memory bank (BANK1) 112 may be a component unit which is independently activated and may be configured to have the same data bus width as data I/O lines in the PIM device 100. In an embodiment, the first and second memory banks 111 and 112 may operate through interleaving such that an active operation of the first and second memory banks 111 and 112 is performed in parallel while another memory bank is selected. Each of the first and second memory banks 111 and 112 may include at least one cell array which includes memory unit cells located at cross points of a plurality of rows and a plurality of columns.

Although not shown in the drawings, a core circuit may be disposed adjacent to the first and second memory banks 111 and 112. The core circuit may include X-decoders XDECs and Y-decoders/IO circuits YDEC/IOs. An X-decoder XDEC may also be referred to as a word line decoder or a row decoder. The X-decoder XDEC may receive a row address ADD_R from the PIM controller 200 and may decode the row address ADD_R to select and enable one of the rows (i.e., word lines) coupled to the selected memory bank. Each of the Y-decoders/IO circuits YDEC/IOs may include a Y-decoder YDEC and an I/O circuit JO. The Y-decoder YDEC may also be referred to as a bit line decoder or a column decoder. The Y-decoder YDEC may receive a column address ADDR_C from the PIM controller 200 and may decode the column address ADDR_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the first and second memory banks 111 and 112. In addition, the I/O circuit may include a write driver for driving a write datum during a write operation for the first and second memory banks 111 and 112.

The interface 131 of the PIM device 100 may receive a memory command M_CMD, MAC commands MAC_CMDs, a bank selection signal BS, and the row/column addresses ADDR_R/ADDR_C from the PIM controller 200. The interface 131 may output the memory command M_CMD, together with the bank selection signal BS and the row/column addresses ADDR_R/ADDR_C, to the first memory bank 111 or the second memory bank 112. The interface 131 may output the MAC commands MAC_CMDs to the first memory bank 111, the second memory bank 112, and the MAC operator 120. In such a case, the interface 131 may output the bank selection signal BS and the row/column addresses ADDR_R/ADDR_C to both of the first memory bank 111 and the second memory bank 112. The data I/O pad 132 of the PIM device 100 may function as a data communication terminal between a device external to the PIM device 100 and the MAC unit (which includes the first and second memory banks 111 and 112 and the MAC operator 120) included in the PIM device 100. The external device to the PIM device 100 may correspond to the PIM controller 200 of the PIM system 1-1 or a host located outside the PIM system 1-1. Accordingly, data outputted from the host or the PIM controller 200 may be inputted into the PIM device 100 through the data I/O pad 132.

The PIM controller 200 may control operations of the PIM device 100. In an embodiment, the PIM controller 200 may control the PIM device 100 such that the PIM device 100 operates in a memory mode or a MAC mode. In the event that the PIM controller 200 controls the PIM device 100 such that the PIM device 100 operates in the memory mode, the PIM device 100 may perform a data read operation or a data write operation for the first memory bank 111 and the second memory bank 112. In the event that the PIM controller 200 controls the PIM device 100 such that the PIM device 100 operates in the MAC mode, the PIM device 100 may perform a MAC arithmetic operation for the MAC operator 120. In the event that the PIM controller 200 controls the PIM device 100 such that the PIM device 100 operates in the MAC mode, the PIM device 100 may also perform the data read operation and the data write operation for the first and second memory banks 111 and 112 to execute the MAC arithmetic operation.

The PIM controller 200 may be configured to include command queue logic 210, a scheduler 220, a memory command generator 230, a MAC command generator 240, and an address generator 250. The command queue logic 210 may receive a request REQ from an external device (e.g., a host of the PIM system 1-1) and store a command queue corresponding to the request REQ in the command queue logic 210. The command queue logic 210 may transmit information on a storage status of the command queue to the scheduler 220 whenever the command queue logic 210 stores the command queue. The command queue stored in the command queue logic 210 may be transmitted to the memory command generator 230 or the MAC command generator 240 according to a sequence determined by the scheduler 220. When the command queue outputted from the command queue logic 210 includes command information requesting an operation in the memory mode of the PIM device 100, the command queue logic 210 may transmit the command queue to the memory command generator 230. On the other hand, when the command queue outputted from the command queue logic 210 is command information requesting an operation in the MAC mode of the PIM device 100, the command queue logic 210 may transmit the command queue to the MAC command generator 240. Information on whether the command queue relates to the memory mode or the MAC mode may be provided by the scheduler 220.

The scheduler 220 may adjust a timing of the command queue when the command queue stored in the command queue logic 210 is outputted from the command queue logic 210. In order to adjust the output timing of the command queue stored in the command queue logic 210, the scheduler 220 may analyze the information on the storage status of the command queue provided by the command queue logic 210 and may readjust a process sequence of the command queue such that the command queue is processed according to a proper sequence. The scheduler 220 may output and transmit to the command queue logic 210 information on whether the command queue outputted from the command queue logic 210 relates to the memory mode of the PIM device 100 or relates to the MAC mode of the PIM device 100. In order to obtain the information on whether the command queue outputted from the command queue logic 210 relates to the memory mode or the MAC mode, the scheduler 220 may include a mode selector 221. The mode selector 221 may generate a mode selection signal including information on whether the command queue stored in the command queue logic 210 relates to the memory mode or the MAC mode, and the scheduler 220 may transmit the mode selection signal to the command queue logic 210.

The memory command generator 230 may receive the command queue related to the memory mode of the PIM device 100 from the command queue logic 210. The memory command generator 230 may decode the command queue to generate and output the memory command M_CMD. The memory command M_CMD outputted from the memory command generator 230 may be transmitted to the PIM device 100. In an embodiment, the memory command M_CMD may include a memory read command and a memory write command. When the memory read command is outputted from the memory command generator 230, the PIM device 100 may perform the data read operation for the first memory bank 111 or the second memory bank 112. Data which are read out of the PIM device 100 may be transmitted to an external device through the data I/O pad 132. The read data outputted from the PIM device 100 may be transmitted to a host through the PIM controller 200. When the memory write command is outputted from the memory command generator 230, the PIM device 100 may perform the data write operation for the first memory bank 111 or the second memory bank 112. In such a case, data to be written into the PIM device 100 may be transmitted from the host to the PIM device 100 through the PIM controller 200. The write data inputted to the PIM device 100 may be transmitted to the first memory bank 111 or the second memory bank 112 through the data I/O pad 132.

The MAC command generator 240 may receive the command queue related to the MAC mode of the PIM device 100 from the command queue logic 210. The MAC command generator 240 may decode the command queue to generate and output the MAC commands MAC_CMDs. The MAC commands MAC_CMDs outputted from the MAC command generator 240 may be transmitted to the PIM device 100. The data read operation for the first memory bank 111 and the second memory bank 112 of the PIM device 100 may be performed by the MAC commands MAC_CMDs outputted from the MAC command generator 240, and the MAC arithmetic operation of the MAC operator 120 may also be performed by the MAC commands MAC_CMDs outputted from the MAC command generator 240. The MAC commands MAC_CMDs and the MAC arithmetic operation of the PIM device 100 according to the MAC commands MAC_CMDs will be described in detail with reference to FIG. 3.

The address generator 250 may receive address information from the command queue logic 210. The address generator 250 may generate the bank selection signal BS for selecting one of the first and second memory banks 111 and 112 and may transmit the bank selection signal BS to the PIM device 100. In addition, the address generator 250 may generate the row address ADDR_R and the column address ADDR_C for accessing a region (e.g., memory cells) in the first or second memory bank 111 or 112 and may transmit the row address ADDR_R and the column address ADDR_C to the PIM device 100.

Figure 3:
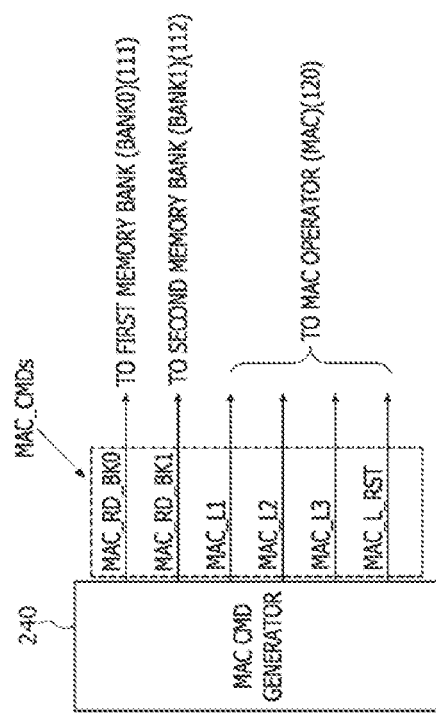
FIG. 3 illustrates MAC commands outputted from a MAC command generator of a PIM controller included in a PIM system according to a first embodiment of the present disclosure.

FIG. 3 illustrates the MAC commands MAC_CMDs outputted from the MAC command generator 240 included in the PIM system 1-1 according to the first embodiment of the present disclosure. As illustrated in FIG. 3, the MAC commands MAC_CMDs may include first to sixth MAC command signals. In an embodiment, the first MAC command signal may be a first MAC read signal MAC_RD_BK0, the second MAC command signal may be a second MAC read signal MAC_RD_BK1, the third MAC command signal may be a first MAC input latch signal MAC_L1, the fourth MAC command signal may be a second MAC input latch signal MAC_L2, the fifth MAC command signal may be a MAC output latch signal MAC_L3, and the sixth MAC command signal may be a MAC latch reset signal MAC_L_RST.

The first MAC read signal MAC_RD_BK0 may control an operation for reading first data (e.g., weight data) out of the first memory bank 111 to transmit the first data to the MAC operator 120. The second MAC read signal MAC_RD_BK1 may control an operation for reading second data (e.g., vector data) out of the second memory bank 112 to transmit the second data to the MAC operator 120. The first MAC input latch signal MAC_L1 may control an input latch operation of the weight data transmitted from the first memory bank 111 to the MAC operator 120. The second MAC input latch signal MAC_L2 may control an input latch operation of the vector data transmitted from the second memory bank 112 to the MAC operator 120. If the input latch operations of the weight data and the vector data are performed, the MAC operator 120 may perform the MAC arithmetic operation to generate MAC result data corresponding to the result of the MAC arithmetic operation. The MAC output latch signal MAC_L3 may control an output latch operation of the MAC result data generated by the MAC operator 120. And, the MAC latch reset signal MAC_L_RST may control an output operation of the MAC result data generated by the MAC operator 120 and a reset operation of an output latch included in the MAC operator 120.

The PIM system 1-1 according to the present embodiment may be configured to perform a deterministic MAC arithmetic operation. The term "deterministic MAC arithmetic operation" used in the present disclosure may be defined as the MAC arithmetic operation performed in the PIM system 1-1 during a predetermined fixed time. Thus, the MAC commands MAC_CMDs transmitted from the PIM controller 200 to the PIM device 100 may be sequentially generated with fixed time intervals. Accordingly, the PIM controller 200 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 200 with fixed time intervals corresponding to the fixed latencies.

For example, the MAC command generator 240 is configured to output the first MAC command at a first point in time. The MAC command generator 240 is configured to output the second MAC command at a second point in time when a first latency elapses from the first point in time. The first latency is set as the time it takes to read the first data out of the first storage region based on the first MAC command and to output the first data to the MAC operator. The MAC command generator 240 is configured to output the third MAC command at a third point in time when a second latency elapses from the second point in time. The second latency is set as the time it takes to read the second data out of the second storage region based on the second MAC command and to output the second data to the MAC operator. The MAC command generator 240 is configured to output the fourth MAC command at a fourth point in time when a third latency elapses from the third point in time. The third latency is set as the time it takes to latch the first data in the MAC operator based on the third MAC command. The MAC command generator 240 is configured to output the fifth MAC command at a fifth point in time when a fourth latency elapses from the fourth point in time. The fourth latency is set as the time it takes to latch the second data in the MAC operator based on the fourth MAC command and to perform the MAC arithmetic operation of the first and second data which are latched in the MAC operator. The MAC command generator 240 is configured to output the sixth MAC command at a sixth point in time when a fifth latency elapses from the fifth point in time. The fifth latency is set as the time it takes to perform an output latch operation of MAC result data generated by the MAC arithmetic operation.

Figure 4:
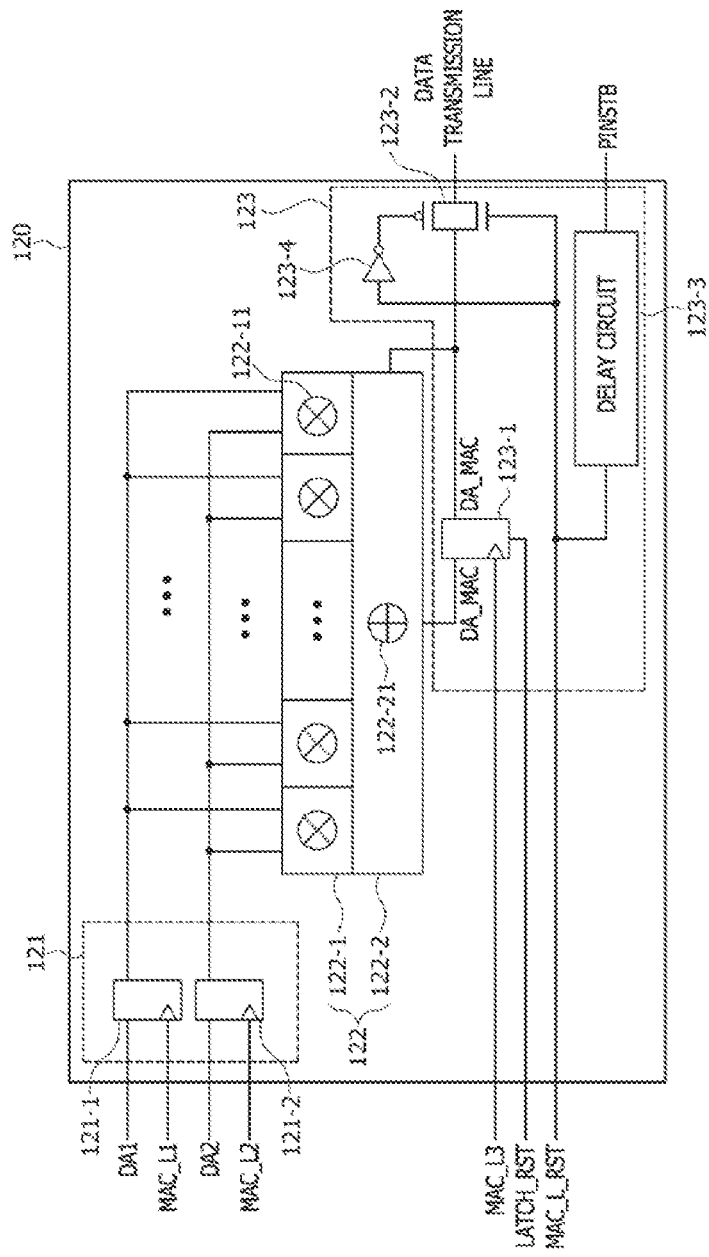
FIG. 4 is a block diagram illustrating an example of a configuration of a MAC operator of a PIM device included in a PIM system according to a first embodiment of the present disclosure.

FIG. 4 illustrates an example of the MAC operator 120 of the PIM device 100 included in the PIM system 1-1 according to the first embodiment of the present disclosure. Referring to FIG. 4, MAC operator 120 may be configured to include a data input circuit 121, a MAC circuit 122, and a data output circuit 123. The data input circuit 121 may include a first input latch 121-1 and a second input latch 121-2. The MAC circuit 122 may include a multiplication logic circuit 122-1 and an addition logic circuit 122-2. The data output circuit 123 may include an output latch 123-1, a transfer gate 123-2, a delay circuit 123-3, and an inverter 123-4. In an embodiment, the first input latch 121-1, the second input latch 121-2, and the output latch 123-1 may be realized using flip-flops.

The data input circuit 121 of the MAC operator 120 may be synchronized with the first MAC input latch signal MAC_L1 to latch first data DA1 transferred from the first memory bank 111 to the MAC circuit 122 through an internal data transmission line. In addition, the data input circuit 121 of the MAC operator 120 may be synchronized with the second MAC input latch signal MAC_L2 to latch second data DA2 transferred from the second memory bank 112 to the MAC circuit 122 through another internal data transmission line. Because the first MAC input latch signal MAC_L1 and the second MAC input latch signal MAC_L2 are sequentially transmitted from the MAC command generator 240 of the PIM controller 200 to the MAC operator 120 of the PIM device 100 with a predetermined time interval, the second data DA2 may be inputted to the MAC circuit 122 of the MAC operator 120 after the first data DA1 is inputted to the MAC circuit 122 of the MAC operator 120.

The MAC circuit 122 may perform the MAC arithmetic operation of the first data DA1 and the second data DA2 inputted through the data input circuit 121. The multiplication logic circuit 122-1 of the MAC circuit 122 may include a plurality of multipliers 122-11. Each of the multipliers 122-11 may perform a multiplying calculation of the first data DA1 outputted from the first input latch 121-1 and the second data DA2 outputted from the second input latch 121-2 and may output the result of the multiplying calculation. Bit values constituting the first data DA1 may be separately inputted to the multipliers 122-11. Similarly, bit values constituting the second data DA2 may also be separately inputted to the multipliers 122-11. For example, if the first data DA1 is represented by an 'N'-bit binary stream, the second data DA2 is represented by an 'N'-bit binary stream, and the number of the multipliers 122-11 is 'M', then 'N/M'-bit portions of the first data DA1 and 'N/M'-bit portions of the second data DA2 may be inputted to each of the multipliers 122-11.

The addition logic circuit 122-2 of the MAC circuit 122 may include a plurality of adders 122-21. Although not shown in the drawings, the plurality of adders 122-21 may be disposed to provide a tree structure including a plurality of stages. Each of the adders 122-21 disposed at a first stage may receive two sets of multiplication result data from two of the multipliers 122-11 included in the multiplication logic circuit 122-1 and may perform an adding calculation of the two sets of multiplication result data to output the addition result data. Each of the adders 122-21 disposed at a second stage may receive two sets of addition result data from two of the adders 122-21 disposed at the first stage and may perform an adding calculation of the two sets of addition result data to output the addition result data. The adder 122-21 disposed at a last stage may receive two sets of addition result data from two adders 122-21 disposed at the previous stage and may perform an adding calculation of the two sets of addition result data to output the addition result data. Although not shown in the drawings, the addition logic circuit 122-2 may further include an additional adder for performing an accumulative adding calculation of MAC result data DA_MAC outputted from the adder 122-21 disposed at the last stage and previous MAC result data DA_MAC stored in the output latch 123-1 of the data output circuit 123.

The data output circuit 123 may output the MAC result data DA_MAC outputted from the MAC circuit 122 to a data transmission line. Specifically, the output latch 123-1 of the data output circuit 123 may be synchronized with the MAC output latch signal MAC_L3 to latch the MAC result data DA_MAC outputted from the MAC circuit 122 and to output the latched data of the MAC result data DA_MAC. The MAC result data DA_MAC outputted from the output latch 123-1 may be fed back to the MAC circuit 122 for the accumulative adding calculation. In addition, the MAC result data DA_MAC may be inputted to the transfer gate 123-2. The output latch 123-1 may be initialized if a latch reset signal LATCH_RST is inputted to the output latch 123-1. In such a case, all of data latched by the output latch 123-1 may be removed. In an embodiment, the latch reset signal LATCH_RST may be activated by generation of the MAC latch reset signal MAC_L_RST and may be inputted to the output latch 123-1.

The MAC latch reset signal MAC_L_RST outputted from the MAC command generator 240 may be inputted to the transfer gate 123-2, the delay circuit 123-3, and the inverter 123-4. The inverter 123-4 may inversely buffer the MAC latch reset signal MAC_L_RST to output the inversely buffered signal of the MAC latch reset signal MAC_L_RST to the transfer gate 123-2. The transfer gate 123-2 may transfer the MAC result data DA_MAC from the output latch 123-1 to the data transmission line in response to the MAC latch reset signal MAC_L_RST. The delay circuit 123-3 may delay the MAC latch reset signal MAC_L_RST by a certain time to generate and output a latch control signal PINSTB.

Figure 5:
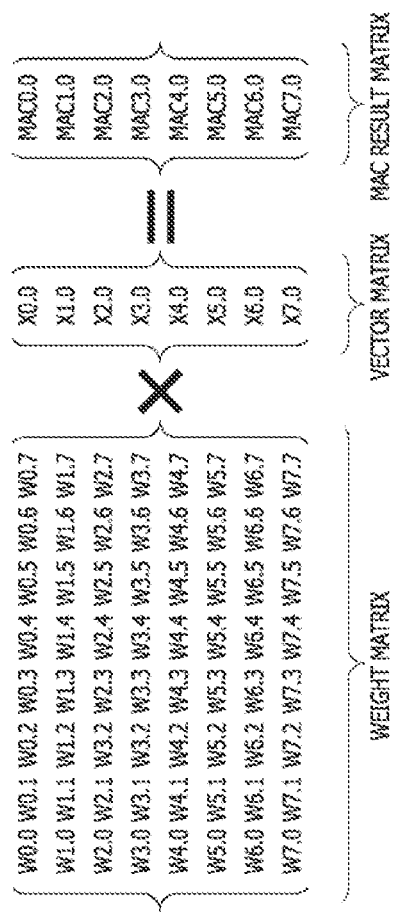
FIG. 5 illustrates an example of a MAC arithmetic operation performed in a PIM system according to a first embodiment of the present disclosure.

FIG. 5 illustrates an example of the MAC arithmetic operation performed in the PIM system 1-1 according to the first embodiment of the present disclosure. As illustrated in FIG. 5, the MAC arithmetic operation performed by the PIM system 1-1 may be executed though a matrix calculation. Specifically, the PIM device 100 may execute a matrix multiplying calculation of an 'M×N' weight matrix (e.g., '8×8' weight matrix) and a 'N×1' vector matrix (e.g., '8×1' vector matrix) according to control of the PIM controller 200 (where, 'M' and 'N' are natural numbers). Elements W0.0, . . . , and W7.7 constituting the weight matrix may correspond to the first data DA1 inputted to the MAC operator 120 from the first memory bank 111. Elements X0.0, . . . , and X7.0 constituting the vector matrix may correspond to the second data DA2 inputted to the MAC operator 120 from the second memory bank 112. Each of the elements W0.0, . . . , and W7.7 constituting the weight matrix may be represented by a binary stream having a plurality of bit values. In addition, each of the elements X0.0, . . . , and X7.0 constituting the vector matrix may also be represented by a binary stream having a plurality of bit values. The number of bits included in each of the elements W0.0, . . . , and W7.7 constituting the weight matrix may be equal to the number of bits included in each of the elements X0.0, . . . , and X7.0 constituting the vector matrix.

The matrix multiplying calculation of the weight matrix and the vector matrix may be appropriate for a multilayer perceptron-type neural network structure (hereinafter, referred to as an 'MLP-type neural network'). In general, the MLP-type neural network for executing deep learning may include an input layer, a plurality of hidden layers (e.g., at least three hidden layers), and an output layer. The matrix multiplying calculation (i.e., the MAC arithmetic operation) of the weight matrix and the vector matrix illustrated in FIG. 5 may be performed in one of the hidden layers. In a first hidden layer of the plurality of hidden layers, the MAC arithmetic operation may be performed using vector data inputted to the first hidden layer. However, in each of second to last hidden layers among the plurality of hidden layers, the MAC arithmetic operation may be performed using a calculation result of the previous hidden layer as the vector data.

Figure 6:
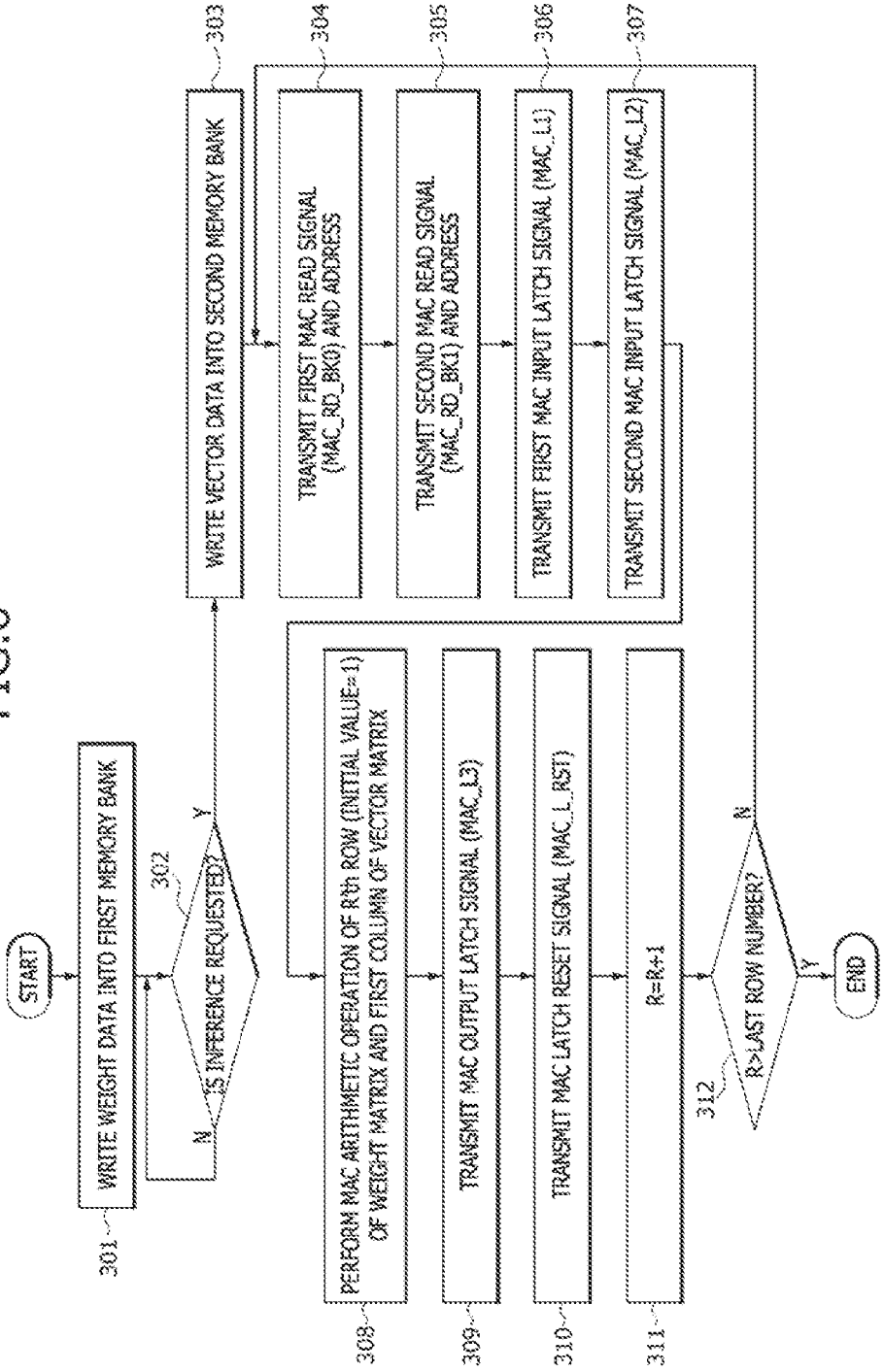
FIG. 6 is a flowchart illustrating processes of the MAC arithmetic operation illustrated in FIG. 5 in a PIM system according to a first embodiment of the present disclosure.

FIG. 6 is a flowchart illustrating processes of the MAC arithmetic operation described with reference to FIG. 5, which are performed in the PIM system 1-1 according to the first embodiment of the present disclosure. In addition, FIGS. 7 to 13 are block diagrams illustrating the processes of the MAC arithmetic operation illustrated in FIG. 5, which are performed in the PIM system 1-1 according to the first embodiment of the present disclosure. Referring to FIGS. 6 to 13, before the MAC arithmetic operation is performed, the first data (i.e., the weight data) may be written into the first memory bank 111 at a step 301. Thus, the weight data may be stored in the first memory bank 111 of the PIM device 100. In the present embodiment, it may be assumed that the weight data are the elements W0.0, . . . , and W7.7 constituting the weight matrix of FIG. 5. The integer before the decimal point is one less than a row number, and the integer after the decimal point is one less than a column number. Thus, for example, the weight W0.0 represents the element of the first row and the first column of the weight matrix.

At a step 302, whether an inference is requested may be determined. An inference request signal may be transmitted from an external device located outside of the PIM system 1-1 to the PIM controller 200 of the PIM system 1-1. An inference request, in some instances, may be based on user input. An inference request may initiate a calculation performed by the PIM system 1-1 to reach a determination based on input data. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 200 at the step 302, then the PIM controller 200 may write the vector data transmitted with the inference request signal into the second memory bank 112 at a step 303. Accordingly, the vector data may be stored in the second memory bank 112 of the PIM device 100.

Figure 7:
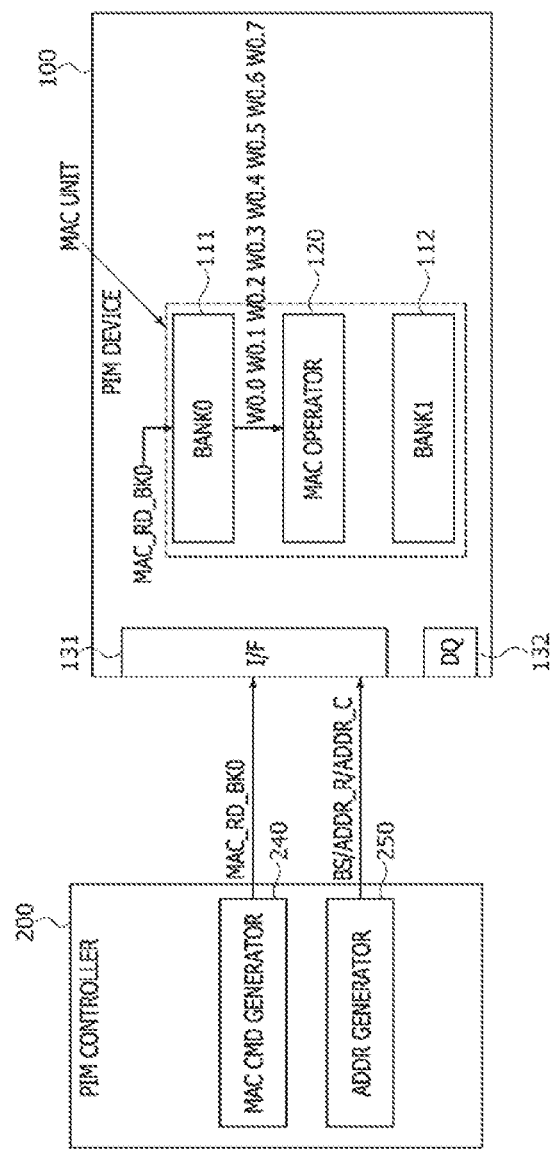
FIGS. 7 to 13 are block diagrams illustrating processes of the MAC arithmetic operation illustrated in FIG. 5 in a PIM system according to a first embodiment of the present disclosure.

At a step 304, the MAC command generator 240 of the PIM controller 200 may generate and transmit the first MAC read signal MAC_RD_BK0 to the PIM device 100, as illustrated in FIG. 7. In such a case, the address generator 250 of the PIM controller 200 may generate and transmit the bank selection signal BS and the row/column address ADDR_R/ADDR_C to the PIM device 100. The bank selection signal BS may be generated to select the first memory bank 111 of the first and second memory banks 111 and 112. Thus, the first MAC read signal MAC_RD_BK0 may control the data read operation for the first memory bank 111 of the PIM device 100. The first memory bank 111 may output and transmit the elements W0.0, . . . , and W0.7 in the first row of the weight matrix of the weight data stored in a region of the first memory bank 111, which is selected by the row/column address ADDR_R/ADDR_C, to the MAC operator 120 in response to the first MAC read signal MAC_RD_BK0. In an embodiment, the data transmission from the first memory bank 111 to the MAC operator 120 may be executed through a global input/output (hereinafter, referred to as 'GIO') line which is provided as a data transmission path in the PIM device 100. Alternatively, the data transmission from the first memory bank 111 to the MAC operator 120 may be executed through a first bank input/output (hereinafter, referred to as 'BIO') line which is provided specifically for data transmission between the first memory bank 111 and the MAC operator 120.

Figure 8:
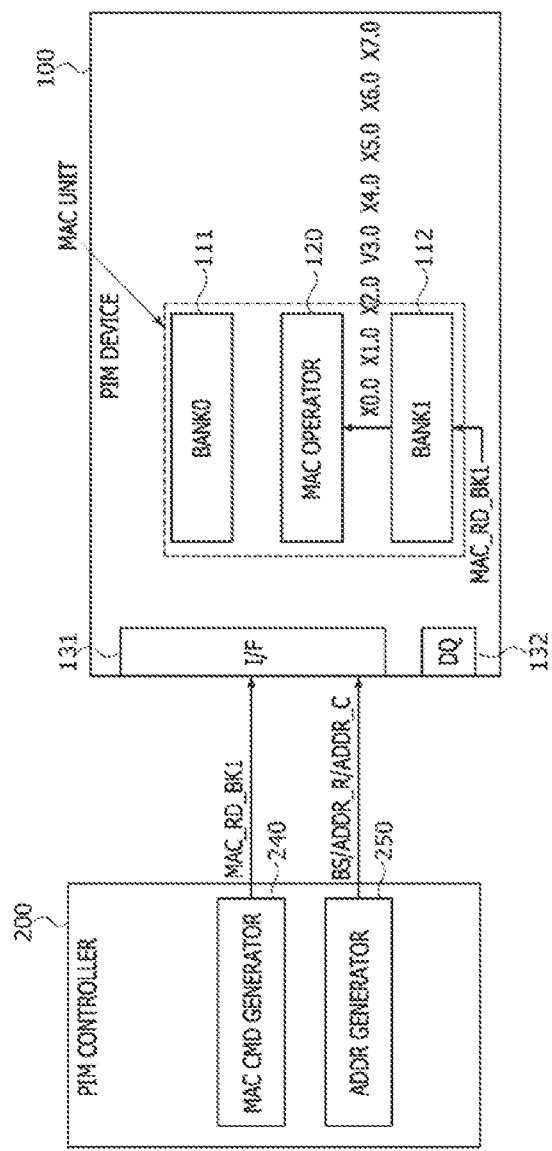

At a step 305, the MAC command generator 240 of the PIM controller 200 may generate and transmit the second MAC read signal MAC_RD_BK1 to the PIM device 100, as illustrated in FIG. 8. In such a case, the address generator 250 of the PIM controller 200 may generate and transmit the bank selection signal BS for selecting the second memory bank 112 and the row/column address ADDR_R/ADDR_C to the PIM device 100. The second MAC read signal MAC_RD_BK1 may control the data read operation for the second memory bank 112 of the PIM device 100. The second memory bank 112 may output and transmit the elements X0.0, . . . , and X7.0 in the first column of the vector matrix corresponding to the vector data stored in a region of the second memory bank 112, which is selected by the row/column address ADDR_R/ADDR_C, to the MAC operator 120 in response to the second MAC read signal MAC_RD_BK1. In an embodiment, the data transmission from the second memory bank 112 to the MAC operator 120 may be executed through the GIO line in the PIM device 100. Alternatively, the data transmission from the second memory bank 112 to the MAC operator 120 may be executed through a second BIO line which is provided specifically for data transmission between the second memory bank 112 and the MAC operator 120.

Figure 9:
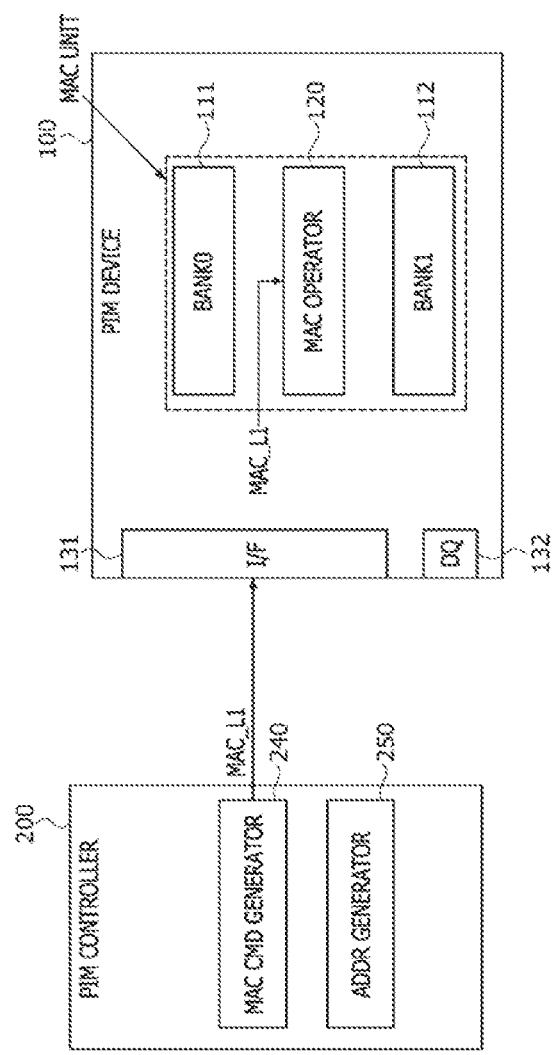
Figure 11:
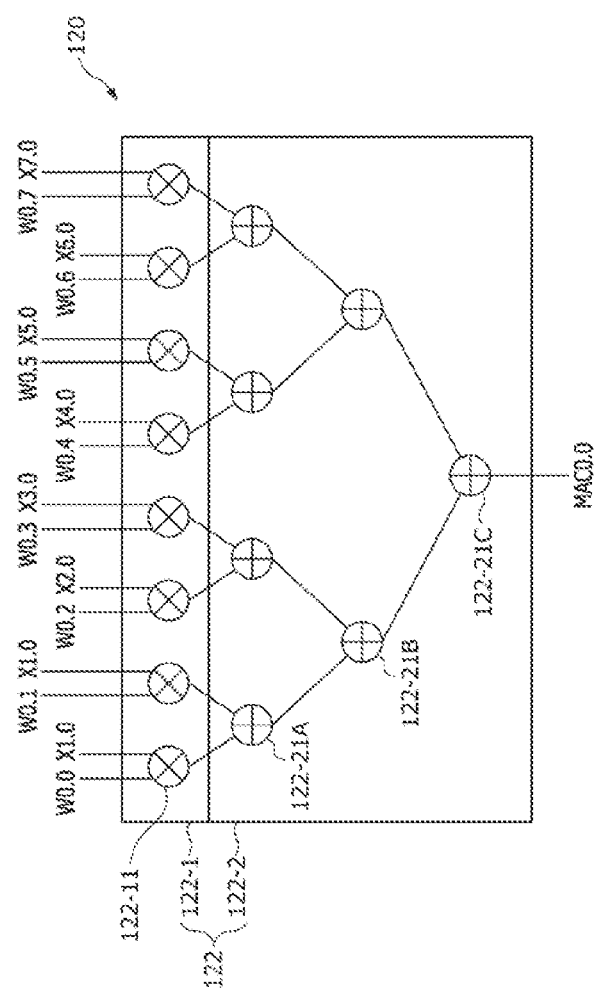

At a step 306, the MAC command generator 240 of the PIM controller 200 may generate and transmit the first MAC input latch signal MAC_L1 to the PIM device 100, as illustrated in FIG. 9. The first MAC input latch signal MAC_L1 may control the input latch operation of the first data for the MAC operator 120 of the PIM device 100. The elements W0.0, . . . , and W0.7 in the first row of the weight matrix may be inputted to the MAC circuit 122 of the MAC operator 120 by the input latch operation, as illustrated in FIG. 11. The MAC circuit 122 may include the plurality of multipliers 122-11 (e.g., eight multipliers 122-11), the number of which is equal to the number of columns of the weight matrix. In such a case, the elements W0.0, . . . , and W0.7 in the first row of the weight matrix may be inputted to the eight multipliers 122-11, respectively.

Figure 10:
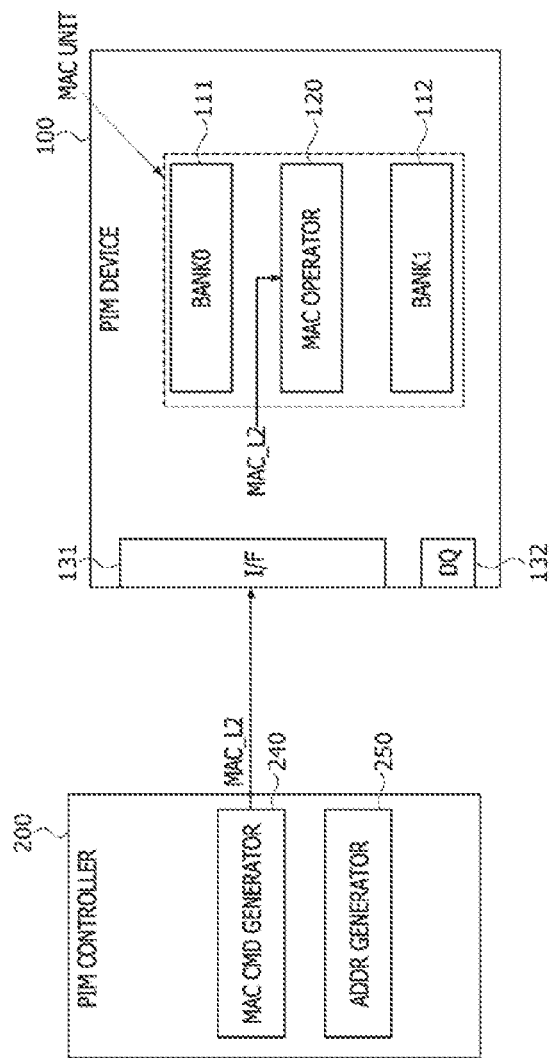

At a step 307, the MAC command generator 240 of the PIM controller 200 may generate and transmit the second MAC input latch signal MAC_L2 to the PIM device 100, as illustrated in FIG. 10. The second MAC input latch signal MAC_L2 may control the input latch operation of the second data for the MAC operator 120 of the PIM device 100. The elements X0.0, . . . , and X7.0 in the first column of the vector matrix may be inputted to the MAC circuit 122 of the MAC operator 120 by the input latch operation, as illustrated in FIG. 11. In such a case, the elements X0.0, . . . , and X7.0 in the first column of the vector matrix may be inputted to the eight multipliers 122-11, respectively.

At a step 308, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. For example, the scalar product is calculated of the Rth '1×N' row vector of the 'M×N' weight matrix and the 'N×1' vector matrix as an 'R×1' element of the 'M×1' MAC result matrix. For R=1, the scalar product of the first row of the weight matrix and the first column of the vector matrix shown in FIG. 5 is W0.0*X0.0+W0.1*X1.0+W0.2*X2.0+ W0.3*X3.0+W0.4*X4.0+W0.5*X5.0+W0.6*X6.0+ W0.7*X7.0. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2, as illustrated in FIG. 11, may include four adders 122-21A disposed at a first stage, two adders 122-21B disposed at a second stage, and an adder 122-21C disposed at a third stage.

Each of the adders 122-21A disposed at the first stage may receive output data of two of the multipliers 122-11 and may perform an adding calculation of the output data of the two multipliers 122-11 to output the result of the adding calculation. Each of the adders 122-21B disposed at the second stage may receive output data of two of the adders 122-21A disposed at the first stage and may perform an adding calculation of the output data of the two adders 122-21A to output the result of the adding calculation. The adder 122-21C disposed at the third stage may receive output data of two of the adders 122-21B disposed at the second stage and may perform an adding calculation of the output data of the two adders 122-21B to output the result of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to an element MAC0.0 located at a first row of an '8×1' MAC result matrix having eight elements of MAC0.0, . . . , and MAC7.0, as illustrated in FIG. 5. The output data MAC0.0 of the addition logic circuit 122-2 may be inputted to the output latch 123-1 disposed in the data output circuit 123 of the MAC operator 120, as described with reference to FIG. 4.

Figure 12:
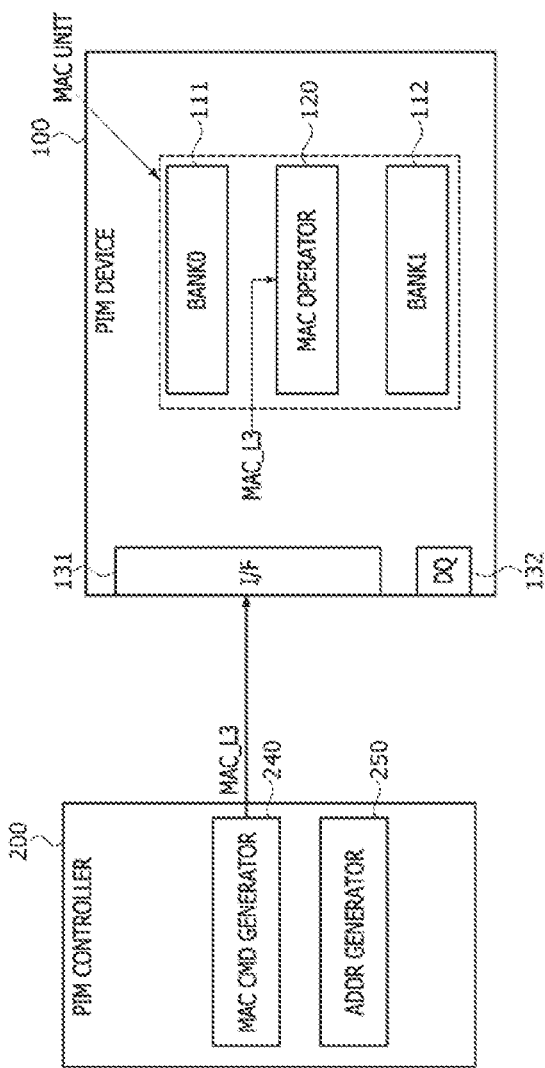

At a step 309, the MAC command generator 240 of the PIM controller 200 may generate and transmit the MAC output latch signal MAC_L3 to the PIM device 100, as illustrated in FIG. 12. The MAC output latch signal MAC_L3 may control the output latch operation of the MAC result data MAC0.0 performed by the MAC operator 120 of the PIM device 100. The MAC result data MAC0.0 inputted from the MAC circuit 122 of the MAC operator 120 may be outputted from the output latch 123-1 in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 13:
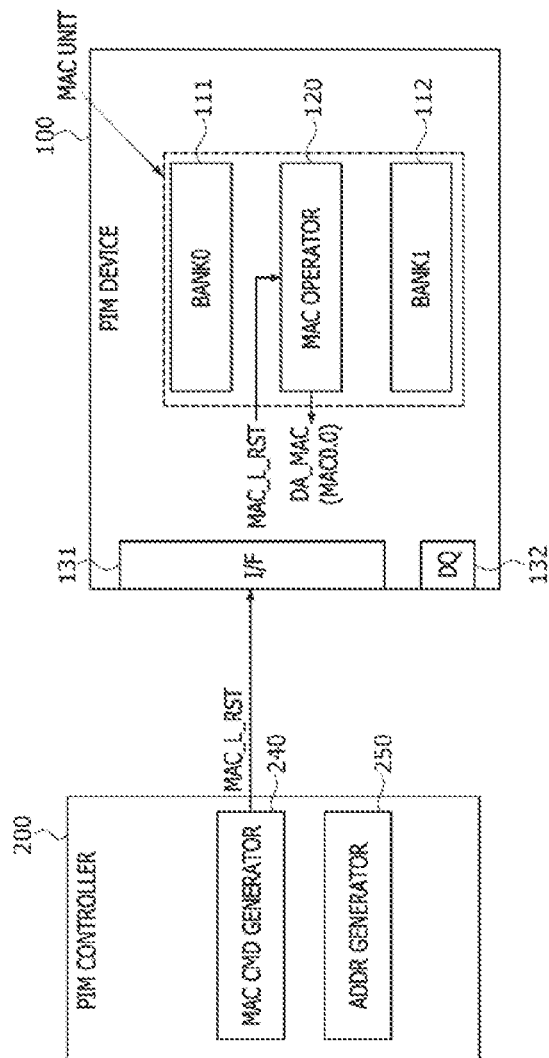

At a step 310, the MAC command generator 240 of the PIM controller 200 may generate and transmit the MAC latch reset signal MAC_L_RST to the PIM device 100, as illustrated in FIG. 13. The MAC latch reset signal MAC_L_RST may control an output operation of the MAC result data MAC0.0 generated by the MAC operator 120 and a reset operation of the output latch included in the MAC operator 120. As described with reference to FIG. 4, the transfer gate 123-2 receiving the MAC result data MAC0.0 from the output latch 123-1 of the MAC operator 120 may be synchronized with the MAC latch reset signal MAC_L_RST to output the MAC result data MAC0.0. In an embodiment, the MAC result data MAC0.0 outputted from the MAC operator 120 may be stored into the first memory bank 111 or the second memory bank 112 through the first BIO line or the second BIO line in the PIM device 100.

At a step 311, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 311. At a step 312, whether the row number changed at the step 311 is greater than the row number of the last row (i.e., the eighth row of the current example) of the weight matrix may be determined. Because the row number of the weight matrix is changed to '2' at the step 311, a process of the MAC arithmetic operation may be fed back to the step 304.

If the process of the MAC arithmetic operation is fed back to the step 304 from the step 312, then the same processes as described with reference to the steps 304 to 310 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 304 at the step 312, then the processes from the step 304 to the step 311 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 311, the MAC arithmetic operation may terminate because the row number of '9' is greater than the last row number of '8' at the step 312.

Figure 14:
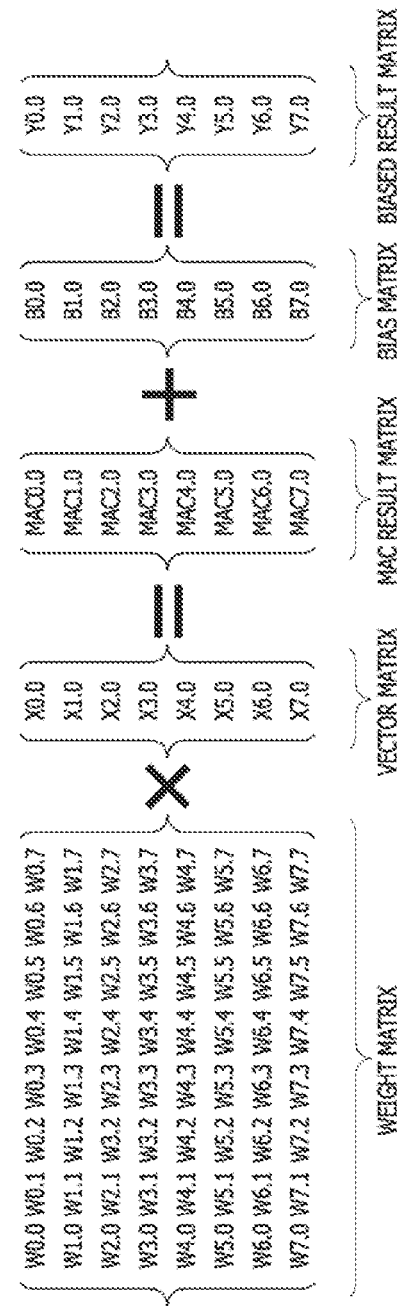
FIG. 14 illustrates another example of a MAC arithmetic operation performed in a PIM system according to a first embodiment of the present disclosure.

FIG. 14 illustrates another example of a MAC arithmetic operation performed in the PIM system 1-1 according to the first embodiment of the present disclosure. As illustrated in FIG. 14, the MAC arithmetic operation performed by the PIM system 1-1 may further include an adding calculation of the MAC result matrix and a bias matrix. Specifically, as described with reference to FIG. 5, the PIM device 100 may execute the matrix multiplying calculation of the '8×8' weight matrix and the '8×1' vector matrix according to control of the PIM controller 200. As a result of the matrix multiplying calculation of the '8×8' weight matrix and the '8×1' vector matrix, the '8×1' MAC result matrix having the eight elements MAC0.0, . . . , and MAC7.0 may be generated. The '8×1' MAC result matrix may be added to a '8×1' bias matrix. The '8×1' bias matrix may have elements B0.0, . . . , and B7.0 corresponding to bias data. The bias data may be set to reduce an error of the MAC result matrix. As a result of the adding calculation of the MAC result matrix and the bias matrix, a '8×1' biased result matrix having eight elements Y0.0, . . . , and Y7.0 may be generated.

Figure 15:
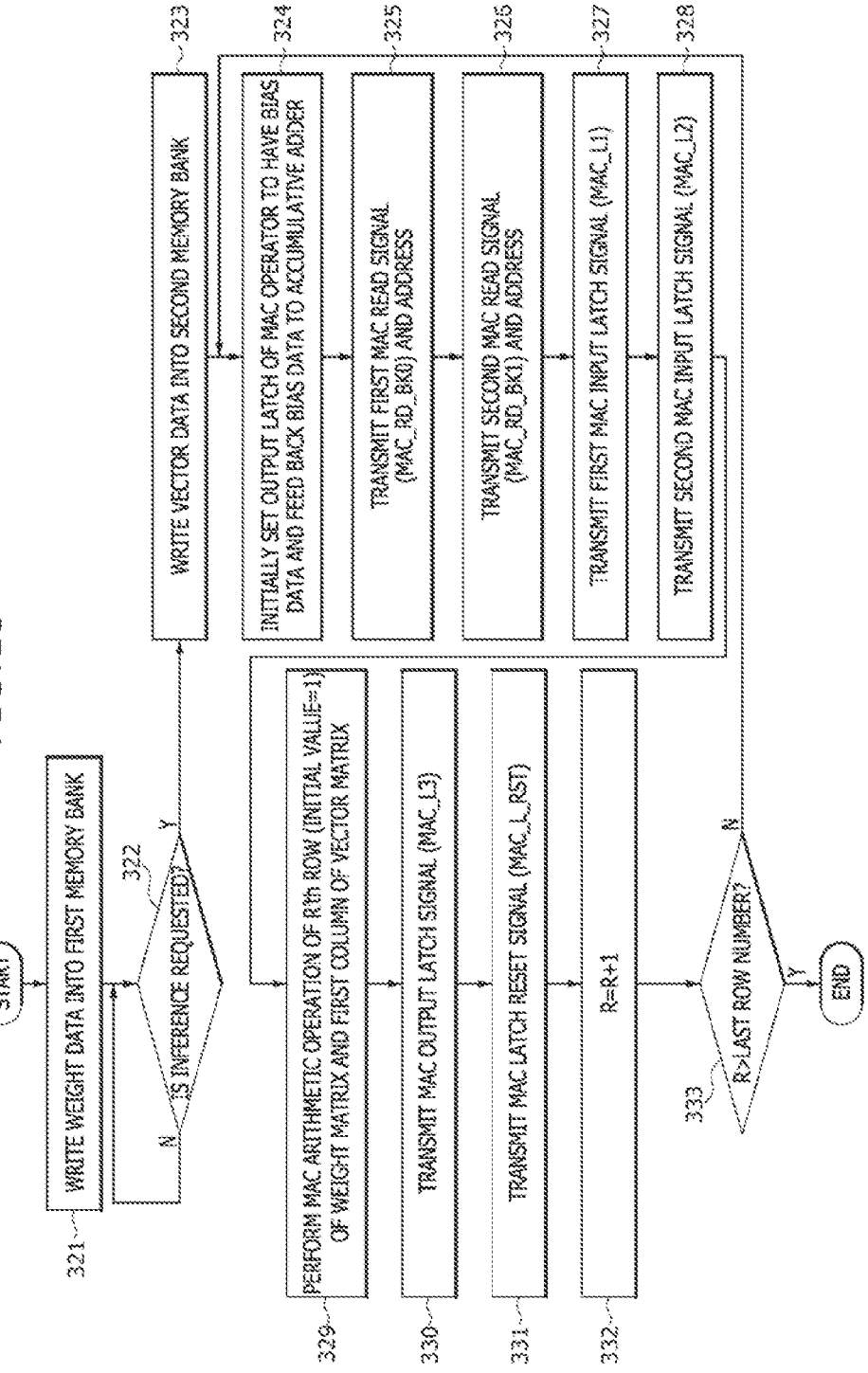
FIG. 15 is a flowchart illustrating processes of the MAC arithmetic operation illustrated in FIG. 14 in a PIM system according to a first embodiment of the present disclosure.
Figure 16:
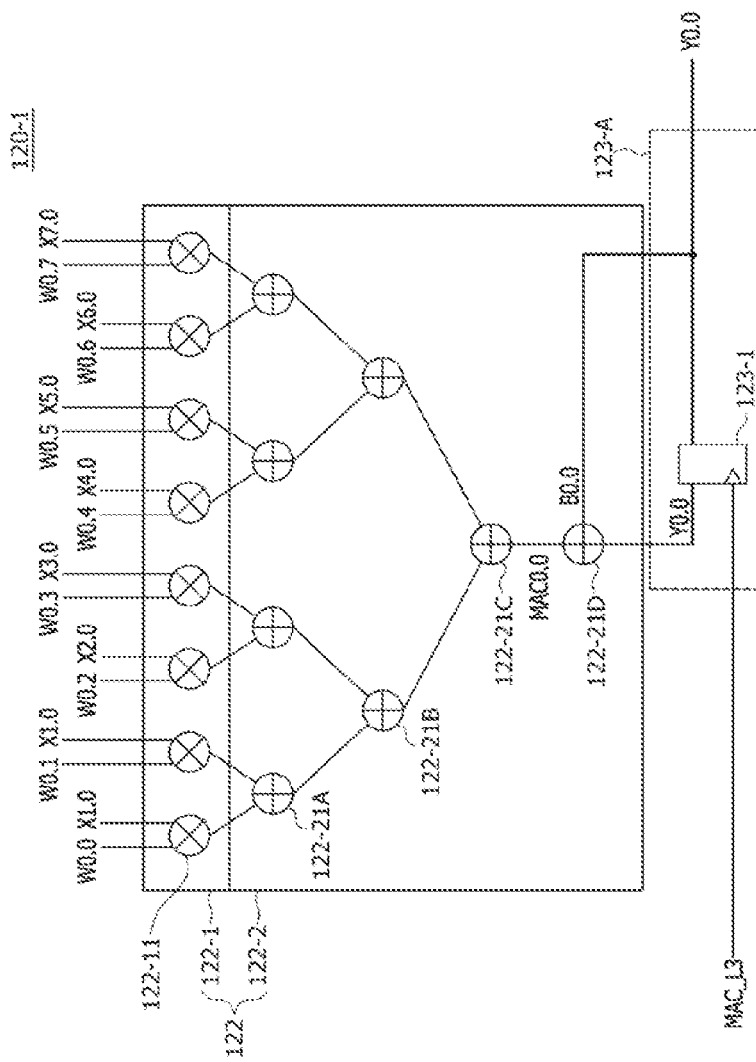
FIG. 16 illustrates an example of a configuration of a MAC operator for performing the MAC arithmetic operation of FIG. 14 in a PIM system according to a first embodiment of the present disclosure.

FIG. 15 is a flowchart illustrating processes of the MAC arithmetic operation described with reference to FIG. 14 in the PIM system 1-1 according to the first embodiment of the present disclosure. Moreover, FIG. 16 illustrates an example of a configuration of a MAC operator 120-1 for performing the MAC arithmetic operation of FIG. 14 in the PIM system 1-1 according to the first embodiment of the present disclosure. In FIG. 16, the same reference numerals or the same reference symbols as used in FIG. 4 denote the same elements, and the detailed descriptions of the same elements as indicated in the previous embodiment will be omitted hereinafter. Referring to FIG. 15, the first data (i.e., the weight data) may be written into the first memory bank 111 at a step 321 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 14.

At a step 322, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 200 at the step 322, the PIM controller 200 may write the vector data transmitted with the inference request signal into the second memory bank 112 at a step 323. Accordingly, the vector data may be stored in the second memory bank 112 of the PIM device 100.

At a step 324, the output latch of the MAC operator may be initially set to have the bias data and the initially set bias data may be fed back to an accumulative adder of the MAC operator. This process is executed to perform the matrix adding calculation of the MAC result matrix and the bias matrix, which is described with reference to FIG. 14. In other words, the output latch 123-1 in the data output circuit 123-A of the MAC operator (120-1) is set to have the bias data. Because the matrix multiplying calculation is executed for the first row of the weight matrix, the output latch 123-1 may be initially set to have the element B0.0 located at a cross point of the first row and the first column of the bias matrix as the bias data. The output latch 123-1 may output the bias data B0.0, and the bias data B0.0 outputted from the output latch 123-1 may be inputted to the accumulative adder 122-21D of the addition logic circuit 122-2, as illustrated in FIG. 16.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-1 of the PIM device 100. When a subsequent MAC arithmetic operation is performed, the accumulative adder 122-21D of the MAC operator 120-1 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

In a step 325, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 325 may be executed in the same way as described with reference to FIG. 7. In a step 326, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 326 may be executed in the same way as described with reference to FIG. 8.

At a step 327, the MAC command generator 240 of the PIM controller 200 may generate and transmit the first MAC input latch signal MAC_L1 to the PIM device 100. The step 327 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 328, the MAC command generator 240 of the PIM controller 200 may generate and transmit the second MAC input latch signal MAC_L2 to the PIM device 100. The step 328 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 329, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 16. The accumulative adder 122-21D may add output data of the adder 122-21C to feedback data fed back from the output latch 123-1 to output the result of the adding calculation. The output data of the adder 122-21C may be the matrix multiplying result MAC0.0, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123 disposed in a data output circuit 123-A of the MAC operator 120-1.

At a step 330, the MAC command generator 240 of the PIM controller 200 may generate and transmit the MAC output latch signal MAC_L3 to the PIM device 100. The step 330 may be executed in the same way as described with reference to FIG. 12. The MAC output latch signal MAC_L3 may control the output latch operation of the MAC result data MAC0.0, which is performed by the MAC operator 120-1 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123 may be inputted to the transfer gate 123-2.

At a step 331, the MAC command generator 240 of the PIM controller 200 may generate and transmit the MAC latch reset signal MAC_L_RST to the PIM device 100. The step 331 may be executed in the same way as described with reference to FIG. 13. The MAC latch reset signal MAC_L_RST may control an output operation of the biased result data Y0.0 generated by the MAC operator 120 and a reset operation of the output latch 123-1 included in the MAC operator 120. The transfer gate 123-2 receiving the biased result data Y0.0 from the output latch 123-1 of the data output circuit 123-A included in the MAC operator 120 may be synchronized with the MAC latch reset signal MAC_L_RST to output the biased result data Y0.0. In an embodiment, the biased result data Y0.0 outputted from the MAC operator 120 may be stored into the first memory bank 111 or the second memory bank 112 through the first BIO line or the second BIO line in the PIM device 100.

At a step 332, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 332. At a step 333, whether the row number changed at the step 332 is greater than the row number of the last row (i.e., the eighth row of the current example) of the weight matrix may be determined. Because the row number of the weight matrix is changed to '2' at the step 332, a process of the MAC arithmetic operation may be fed back to the step 324.

If the process of the MAC arithmetic operation is fed back to the step 324 from the step 333, then the same processes as described with reference to the steps 324 to 331 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix and the bias data B0.0 in the output latch 123-1 initially set at the step 324 may be changed into the bias data B1.0. If the process of the MAC arithmetic operation is fed back to the step 324 at the step 333, the processes from the step 324 to the step 332 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 332, the MAC arithmetic operation may terminate because the row number of '9' is greater than the last row number of '8' at the step 333.

Figure 17:
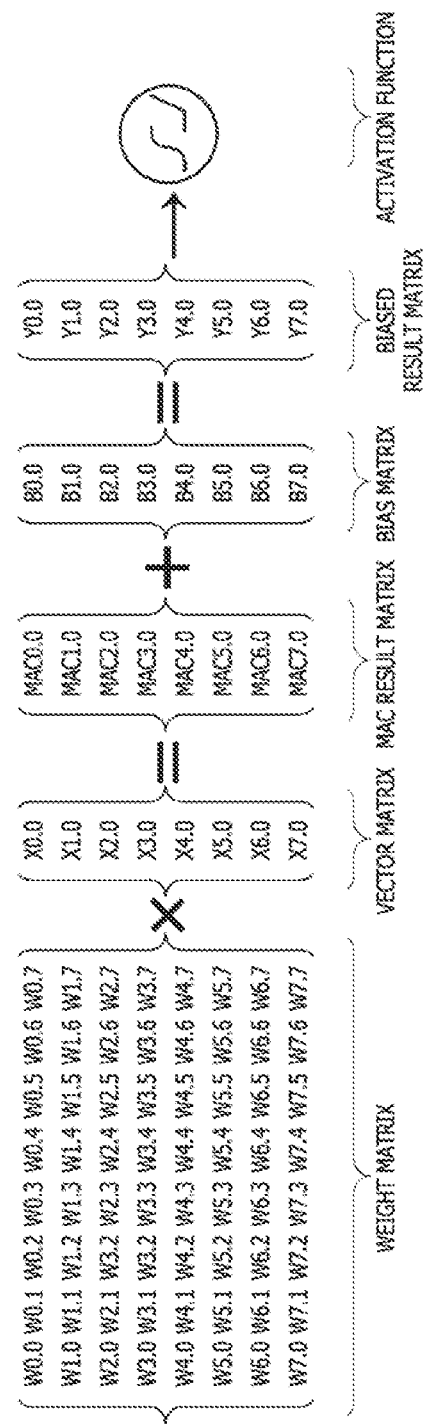
FIG. 17 illustrates yet another example of a MAC arithmetic operation performed in a PIM system according to a first embodiment of the present disclosure.

FIG. 17 illustrates yet another example of a MAC arithmetic operation performed in the PIM system 1-1 according to the first embodiment of the present disclosure. As illustrated in FIG. 17, the MAC arithmetic operation performed by the PIM system 1-1 may further include a process for applying the biased result matrix to an activation function. Specifically, as described with reference to FIG. 14, the PIM device 100 may execute the matrix multiplying calculation of the '8×8' weight matrix and the '8×1' vector matrix according to control of the PIM controller 200 to generate the MAC result matrix. In addition, the MAC result matrix may be added to the bias matrix to generate biased result matrix.

The biased result matrix may be applied to the activation function. The activation function means a function which is used to calculate a unique output value by comparing a MAC calculation value with a critical value in an MLP-type neural network. In an embodiment, the activation function may be a unipolar activation function which generates only positive output values or a bipolar activation function which generates negative output values as well as positive output values. In different embodiments, the activation function may include a sigmoid function, a hyperbolic tangent (Tanh) function, a rectified linear unit (ReLU) function, a leaky ReLU function, an identity function, and a maxout function.

Figure 18:
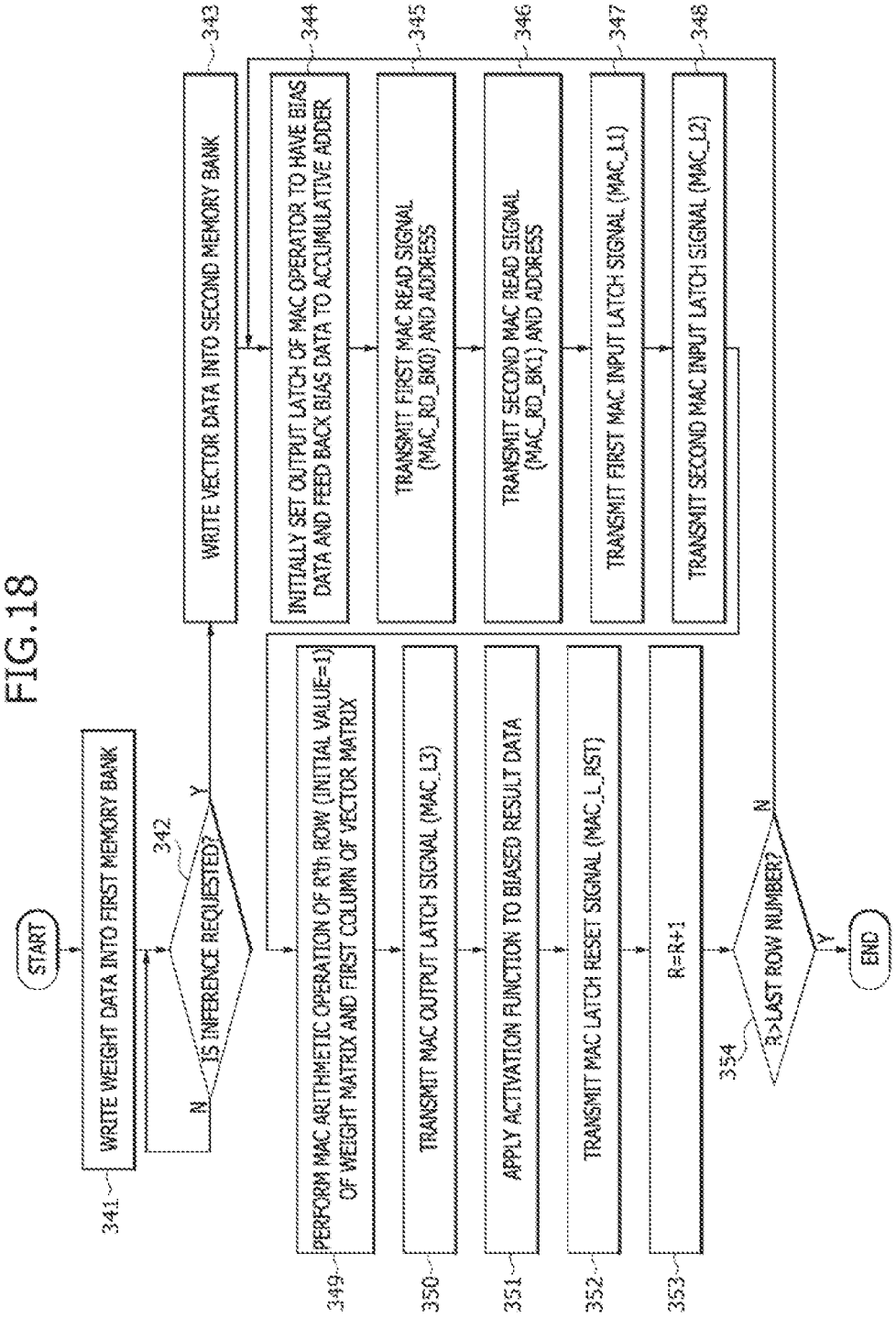
FIG. 18 is a flowchart illustrating processes of the MAC arithmetic operation illustrated in FIG. 17 in a PIM system according to a first embodiment of the present disclosure.
Figure 19:
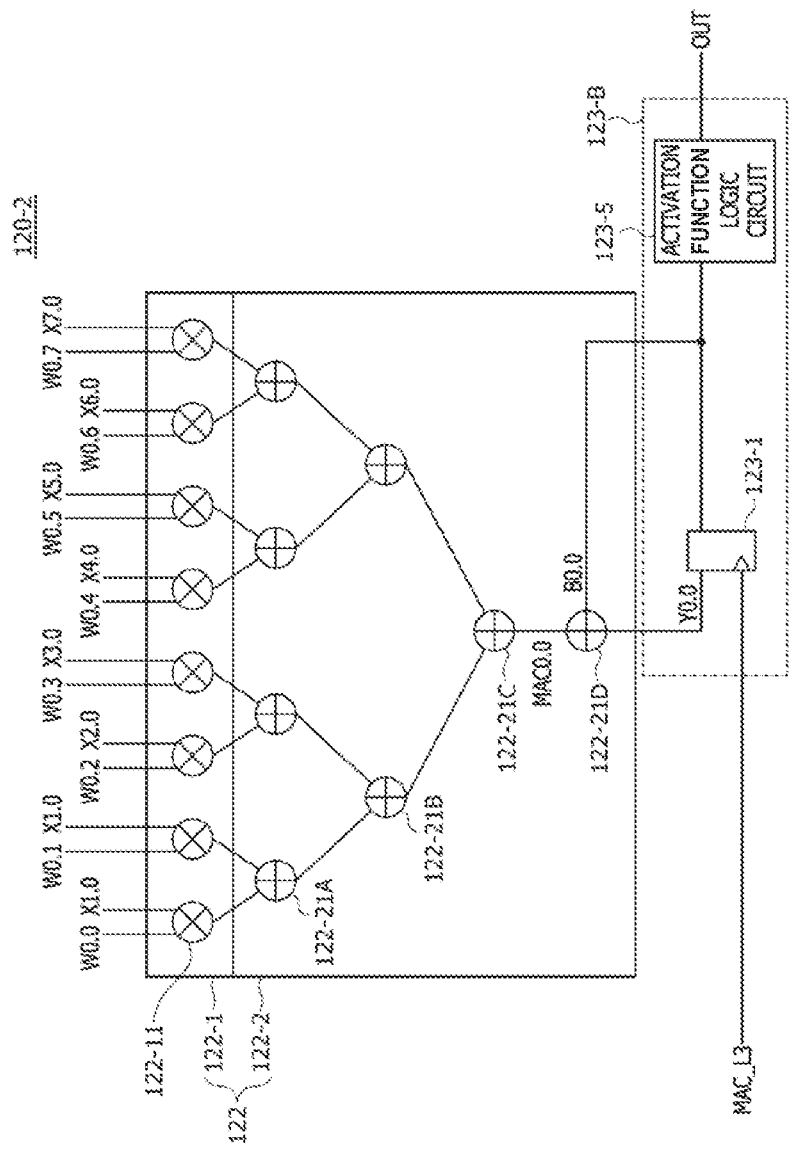
FIG. 19 illustrates an example of a configuration of a MAC operator for performing the MAC arithmetic operation of FIG. 17 in a PIM system according to a first embodiment of the present disclosure.

FIG. 18 is a flowchart illustrating processes of the MAC arithmetic operation described with reference to FIG. 17 in the PIM system 1-1 according to the first embodiment of the present disclosure. Moreover, FIG. 19 illustrates an example of a configuration of a MAC operator 120-2 for performing the MAC arithmetic operation of FIG. 17 in the PIM system 1-1 according to the first embodiment of the present disclosure. In FIG. 19, the same reference numerals or the same reference symbols as used in FIG. 4 denote the same elements, and the detailed descriptions of the same elements as mentioned in the previous embodiment will be omitted hereinafter. Referring to FIG. 18, the first data (i.e., the weight data) may be written into the first memory bank 111 at a step 341 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 17.

At a step 342, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., the data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 200 at the step 342, then the PIM controller 200 may write the vector data transmitted with the inference request signal into the second memory bank 112 at a step 343. Accordingly, the vector data may be stored in the second memory bank 112 of the PIM device 100.

At a step 344, an output latch of a MAC operator may be initially set to have bias data and the initially set bias data may be fed back to an accumulative adder of the MAC operator. This process is executed to perform the matrix adding calculation of the MAC result matrix and the bias matrix, which is described with reference to FIG. 17. That is, as illustrated in FIG. 19, the output latch 123-1 of the MAC operator (120-2 of FIG. 19) may be initially set to have the bias data of the bias matrix. Because the matrix multiplying calculation is executed for the first row of the weight matrix, the element B0.0 located at first row and the first column of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the MAC operator 120-2.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-2 of the PIM device 100. When a subsequent MAC arithmetic operation is performed, the accumulative adder 122-21D of the MAC operator 120-2 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. As illustrated in FIG. 19, the biased result data Y0.0 may be transmitted from the output latch 123-1 to an activation function logic circuit 123-5 disposed in a data output circuit 123-B of the MAC operator 120-2 in synchronization with the MAC output latch signal MAC_L3 transmitted in a subsequent process.

In a step 345, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 345 may be executed in the same way as described with reference to FIG. 7. In a step 346, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 346 may be executed in the same way as described with reference to FIG. 8.

At a step 347, the MAC command generator 240 of the PIM controller 200 may generate and transmit the first MAC input latch signal MAC_L1 to the PIM device 100. The step 347 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 348, the MAC command generator 240 of the PIM controller 200 may generate and transmit the second MAC input latch signal MAC_L2 to the PIM device 100. The step 348 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 349, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 19. The accumulative adder 122-21D may add output data of the adder 122-21C to feedback data fed back from the output latch 123-1 to output the result of the adding calculation. The output data of the adder 122-21C may be the element MAC0.0 of the '8×1' MAC result matrix, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123-1 disposed in the data output circuit 123-A of the MAC operator 120.

At a step 350, the MAC command generator 240 of the PIM controller 200 may generate and transmit the MAC output latch signal MAC_L3 to the PIM device 100. The step 350 may be executed in the same way as described with reference to FIG. 12. The MAC output latch signal MAC_L3 may control the output latch operation of the output latch 123-1 included in the MAC operator 120 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123-1 may be inputted to the activation function logic circuit 123-5. At a step 351, the activation function logic circuit 123-5 may apply an activation function to the biased result data Y0.0 to generate a final output value, and the final output value may be inputted to the transfer gate (123-2 of FIG. 4). This, for example, is the final output value for the current of R which is incremented in step 354.

At a step 352, the MAC command generator 240 of the PIM controller 200 may generate and transmit the MAC latch reset signal MAC_L_RST to the PIM device 100. The step 352 may be executed in the same way as described with reference to FIG. 13. The MAC latch reset signal MAC_L_RST may control an output operation of the final output value generated by the MAC operator 120 and a reset operation of the output latch 123-1 included in the MAC operator 120. The transfer gate 123-2 receiving the final output value from the activation function logic circuit 123-5 of the data output circuit 123-B included in the MAC operator 120 may be synchronized with the MAC latch reset signal MAC_L_RST to output the final output value. In an embodiment, the final output value outputted from the MAC operator 120 may be stored into the first memory bank 111 or the second memory bank 112 through the first BIO line or the second BIO line in the PIM device 100.

At a step 353, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 353. At a step 354, whether the row number changed at the step 353 is greater than the row number of the last row (i.e., the eighth row) of the weight matrix may be determined. Because the row number of the weight matrix is changed to '2' at the step 353, a process of the MAC arithmetic operation may be fed back to the step 344.

If the process of the MAC arithmetic operation is fed back to the step 344 from the step 354, the same processes as described with reference to the steps 344 to 354 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix, and the bias data B0.0 in the output latch 123-1 initially set at the step 344 may be changed to the bias data B1.0. If the process of the MAC arithmetic operation is fed back to the step 344 from the step 354, the processes from the step 344 to the step 354 may be iteratively performed until the MAC arithmetic operation is performed for all of the rows of the weight matrix with the vector matrix. For an embodiment, a plurality of final output values, namely, one final output value for each incremented value of R, represents an 'N×1' final result matrix. If the MAC arithmetic operation for the eighth row of the weight matrix terminates and the row number of the weight matrix changes from '8' to '9' at the step 354, the MAC arithmetic operation may terminate because the row number of '9' is greater than the last row number of '8' at the step 354.

Figure 20:
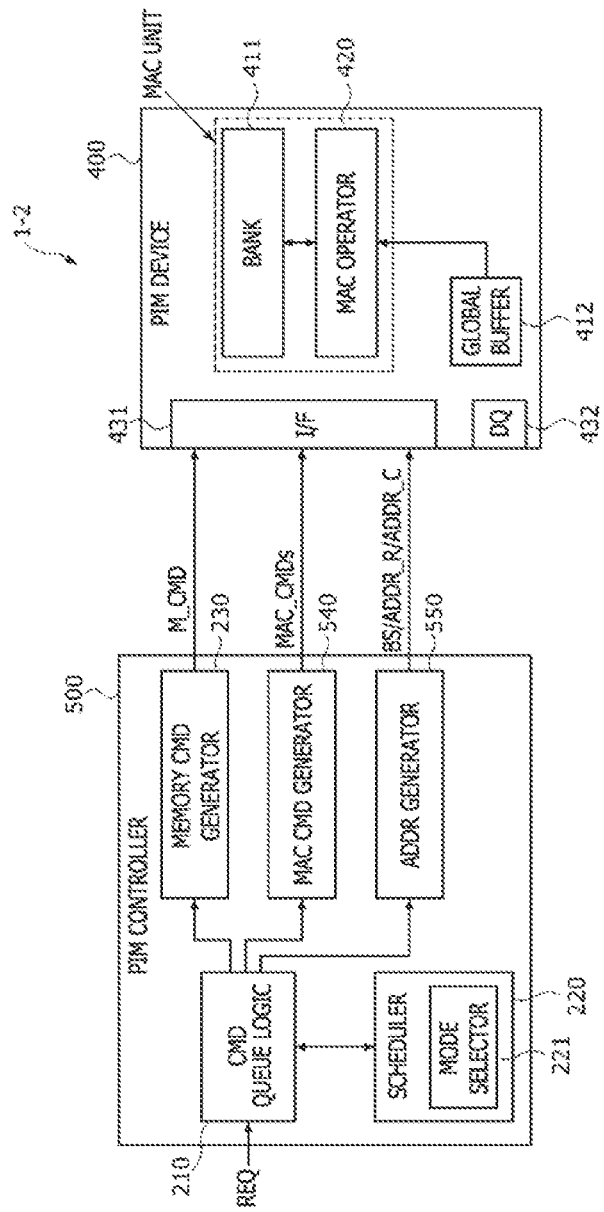
FIG. 20 is a block diagram illustrating a PIM system according to a second embodiment of the present disclosure.

FIG. 20 is a block diagram illustrating a PIM system 1-2 according to a second embodiment of the present disclosure. In FIG. 20, the same reference numerals or the same reference symbols as used in FIG. 2 denote the same elements. As illustrated in FIG. 20, the PIM system 1-2 may be configured to include a PIM device 400 and a PIM controller 500. The PIM device 400 may be configured to include a memory bank (BANK) 411 corresponding to a storage region, a global buffer 412, a MAC operator 420, an interface (I/F) 431, and a data input/output (I/O) pad 432. For an embodiment, the MAC operator 420 represents a MAC operator circuit. The memory bank (BANK) 411 and the MAC operator 420 included in the PIM device 400 may constitute one MAC unit. In another embodiment, the PIM device 400 may include a plurality of MAC units. The memory bank (BANK) 411 may represent a memory region for storing data, for example, a DRAM device. The global buffer 412 may also represent a memory region for storing data, for example, a DRAM device or an SRAM device. The memory bank (BANK) 411 may be a component unit which is independently activated and may be configured to have the same data bus width as data I/O lines in the PIM device 400. In an embodiment, the memory bank 411 may operate through interleaving such that an active operation of the memory bank 411 is performed in parallel while another memory bank is selected. The memory bank 411 may include at least one cell array which includes memory unit cells located at cross points of a plurality of rows and a plurality of columns.

Although not shown in the drawings, a core circuit may be disposed adjacent to the memory bank 411. The core circuit may include X-decoders XDECs and Y-decoders/IO circuits YDEC/IOs. An X-decoder XDEC may also be referred to as a word line decoder or a row decoder. The X-decoder XDEC may receive a row address ADDR_R from the PIM controller 500 and may decode the row address ADDR_R to select and enable one of the rows (i.e., word lines) coupled to the selected memory bank. Each of the Y-decoders/IO circuits YDEC/IOs may include a Y-decoder YDEC and an I/O circuit JO. The Y-decoder YDEC may also be referred to as a bit line decoder or a column decoder. The Y-decoder YDEC may receive a column address ADD_C from the PIM controller 500 and may decode the column address ADD_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the memory bank 411. In addition, the I/O circuit may include a write driver for driving a write datum during a write operation for the memory bank 411.

The MAC operator 420 of the PIM device 400 may have mostly the same configuration as the MAC operator 120 described with reference to FIG. 4. That is, the MAC operator 420 may be configured to include the data input circuit 121, the MAC circuit 122, and the data output circuit 123, as described with reference to FIG. 4. The data input circuit 121 may be configured to include the first input latch 121-1 and the second input latch 121-2. The MAC circuit 122 may be configured to include the multiplication logic circuit 122-1 and the addition logic circuit 122-2. The data output circuit 123 may be configured to include the output latch 123-1, the transfer gate 123-2, the delay circuit 123-3, and the inverter 123-4. In an embodiment, the first input latch 121-1, the second input latch 121-2, and the output latch 123-1 may be realized using flip-flops.

The MAC operator 420 may be different from the MAC operator 120 in that a MAC input latch signal MAC_L1 is simultaneously inputted to both of clock terminals of the first and second input latches 121-1 and 121-2. As indicated in the following descriptions, the weight data and the vector data may be simultaneously transmitted to the MAC operator 420 of the PIM device 400 included in the PIM system 1-2 according to the present embodiment. That is, the first data DA1 (i.e., the weight data) and the second data DA2 (i.e., the vector data) may be simultaneously inputted to both of the first input latch 121-1 and the second input latch 121-2 constituting the data input circuit 121, respectively. Accordingly, it may be unnecessary to apply an extra control signal to the clock terminals of the first and second input latches 121-1 and 121-2, and thus the MAC input latch signal MAC_L1 may be simultaneously inputted to both of the clock terminals of the first and second input latches 121-1 and 121-2 included in the MAC operator 420.

In another embodiment, the MAC operator 420 may be realized to have the same configuration as the MAC operator 120-1 described with reference to FIG. 16 to perform the operation illustrated in FIG. 14. Even in such a case, the MAC operator 420 may have the same configuration as described with reference to FIG. 16 except that the MAC input latch signal MAC_L1 is simultaneously inputted to both of the clock terminals of the first and second input latches 121-1 and 121-2 constituting the data input circuit 121. In yet another embodiment, the MAC operator 420 may be realized to have the same configuration as the MAC operator 120-2 described with reference to FIG. 19 to perform the operation illustrated in FIG. 17. Even in such a case, the MAC operator 420 may have the same configuration as described with reference to FIG. 19 except that the MAC input latch signal MAC_L1 is simultaneously inputted to both of the clock terminals of the first and second input latches 121-1 and 121-2 constituting the data input circuit 121.

The interface 431 of the PIM device 400 may receive the memory command M_CMD, the MAC commands MAC_CMDs, the bank selection signal BS, and the row/column addresses ADDR_R/ADDR_C from the PIM controller 500. The interface 431 may output the memory command M_CMD, together with the bank selection signal BS and the row/column addresses ADDR_R/ADDR_C, to the memory bank 411. The interface 431 may output the MAC commands MAC_CMDs to the memory bank 411 and the MAC operator 420. In such a case, the interface 431 may output the bank selection signal BS and the row/column addresses ADDR_R/ADDR_C to the memory bank 411. The data I/O pad 432 of the PIM device 400 may function as a data communication terminal between a device external to the PIM device 400, the global buffer 412, and the MAC unit (which includes the memory bank 411 and the MAC operator 420) included in the PIM device 400. The external device to the PIM device 400 may correspond to the PIM controller 500 of the PIM system 1-2 or a host located outside the PIM system 1-2. Accordingly, data outputted from the host or the PIM controller 500 may be inputted into the PIM device 400 through the data I/O pad 432. In addition, data generated by the PIM device 400 may be transmitted to the external device to the PIM device 400 through the data I/O pad 432.

The PIM controller 500 may control operations of the PIM device 400. In an embodiment, the PIM controller 500 may control the PIM device 400 such that the PIM device 400 operates in the memory mode or the MAC mode. In the event that the PIM controller 500 controls the PIM device 500 such that the PIM device 400 operates in the memory mode, the PIM device 400 may perform a data read operation or a data write operation for the memory bank 411. In the event that the PIM controller 500 controls the PIM device 400 such that the PIM device 400 operates in the MAC mode, the PIM device 400 may perform the MAC arithmetic operation for the MAC operator 420. In the event that the PIM controller 500 controls the PIM device 400 such that the PIM device 400 operates in the MAC mode, the PIM device 400 may also perform the data read operation and the data write operation for the memory bank 411 and the global buffer 412 to execute the MAC arithmetic operation.

The PIM controller 500 may be configured to include the command queue logic 210, the scheduler 220, the memory command generator 230, a MAC command generator 540, and an address generator 550. The scheduler 220 may include the mode selector 221. The command queue logic 210 may receive the request REQ from an external device (e.g., a host of the PIM system 1-2) and store a command queue corresponding the request REQ in the command queue logic 210. The command queue stored in the command queue logic 210 may be transmitted to the memory command generator 230 or the MAC command generator 540 according to a sequence determined by the scheduler 220. The scheduler 220 may adjust a timing of the command queue when the command queue stored in the command queue logic 210 is outputted from the command queue logic 210. The scheduler 210 may include the mode selector 221 that generates a mode selection signal including information on whether command queue stored in the command queue logic 210 relates to the memory mode or the MAC mode. The memory command generator 230 may receive the command queue related to the memory mode of the PIM device 400 from the command queue logic 210 to generate and output the memory command M_CMD. The command queue logic 210, the scheduler 220, the mode selector 221, and the memory command generator 230 may have the same function as described with reference to FIG. 2.

The MAC command generator 540 may receive the command queue related to the MAC mode of the PIM device 400 from the command queue logic 210. The MAC command generator 540 may decode the command queue to generate and output the MAC commands MAC_CMDs. The MAC commands MAC_CMDs outputted from the MAC command generator 540 may be transmitted to the PIM device 400. The data read operation for the memory bank 411 of the PIM device 400 may be performed by the MAC commands MAC_CMDs outputted from the MAC command generator 540, and the MAC arithmetic operation of the MAC operator 420 may also be performed by the MAC commands MAC_CMDs outputted from the MAC command generator 540. The MAC commands MAC_CMDs and the MAC arithmetic operation of the PIM device 400 according to the MAC commands MAC_CMDs will be described in detail with reference to FIG. 21.

The address generator 550 may receive address information from the command queue logic 210. The address generator 550 may generate the bank selection signal BS for selecting a memory bank where, for example, the memory bank 411 represents multiple memory banks. The address generator 550 may transmit the bank selection signal BS to the PIM device 400. In addition, the address generator 550 may generate the row address ADDR_R and the column address ADDR_C for accessing a region (e.g., memory cells) in the memory bank 411 and may transmit the row address ADDR_R and the column address ADDR_C to the PIM device 400.

Figure 21:
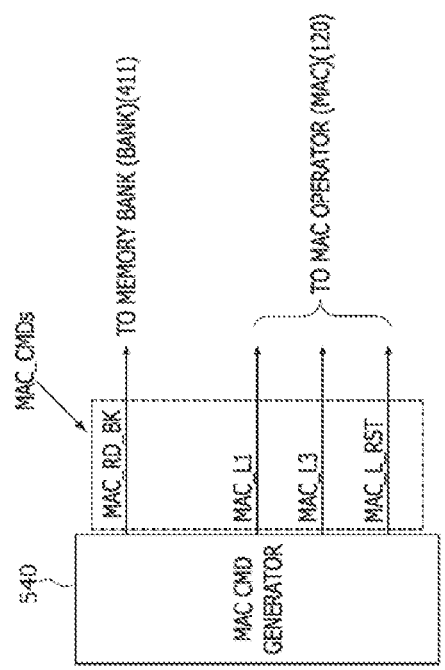
FIG. 21 illustrates MAC commands outputted from a MAC command generator of a PIM controller included in a PIM system according to a second embodiment of the present disclosure.

FIG. 21 illustrates the MAC commands MAC_CMDs outputted from the MAC command generator 540 included in the PIM system 1-2 according to the second embodiment of the present disclosure. As illustrated in FIG. 21, the MAC commands MAC_CMDs may include first to fourth MAC command signals. In an embodiment, the first MAC command signal may be a MAC read signal MAC_RD_BK, the second MAC command signal may be a MAC input latch signal MAC_L1, the third MAC command signal may be a MAC output latch signal MAC_L3, and the fourth MAC command signal may be a MAC latch reset signal MAC_L_RST.

The MAC read signal MAC_RD_BK may control an operation for reading the first data (e.g., the weight data) out of the memory bank 411 to transmit the first data to the MAC operator 420. The MAC input latch signal MAC_L1 may control an input latch operation of the weight data transmitted from the first memory bank 411 to the MAC operator 420. The MAC output latch signal MAC_L3 may control an output latch operation of the MAC result data generated by the MAC operator 420. And, the MAC latch reset signal MAC_L_RST may control an output operation of the MAC result data generated by the MAC operator 420 and a reset operation of an output latch included in the MAC operator 420.

The PIM system 1-2 according to the present embodiment may also be configured to perform the deterministic MAC arithmetic operation. Thus, the MAC commands MAC_CMDs transmitted from the PIM controller 500 to the PIM device 400 may be sequentially generated with fixed time intervals. Accordingly, the PIM controller 500 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 500 with fixed time intervals corresponding to the fixed latencies.

Figure 22:
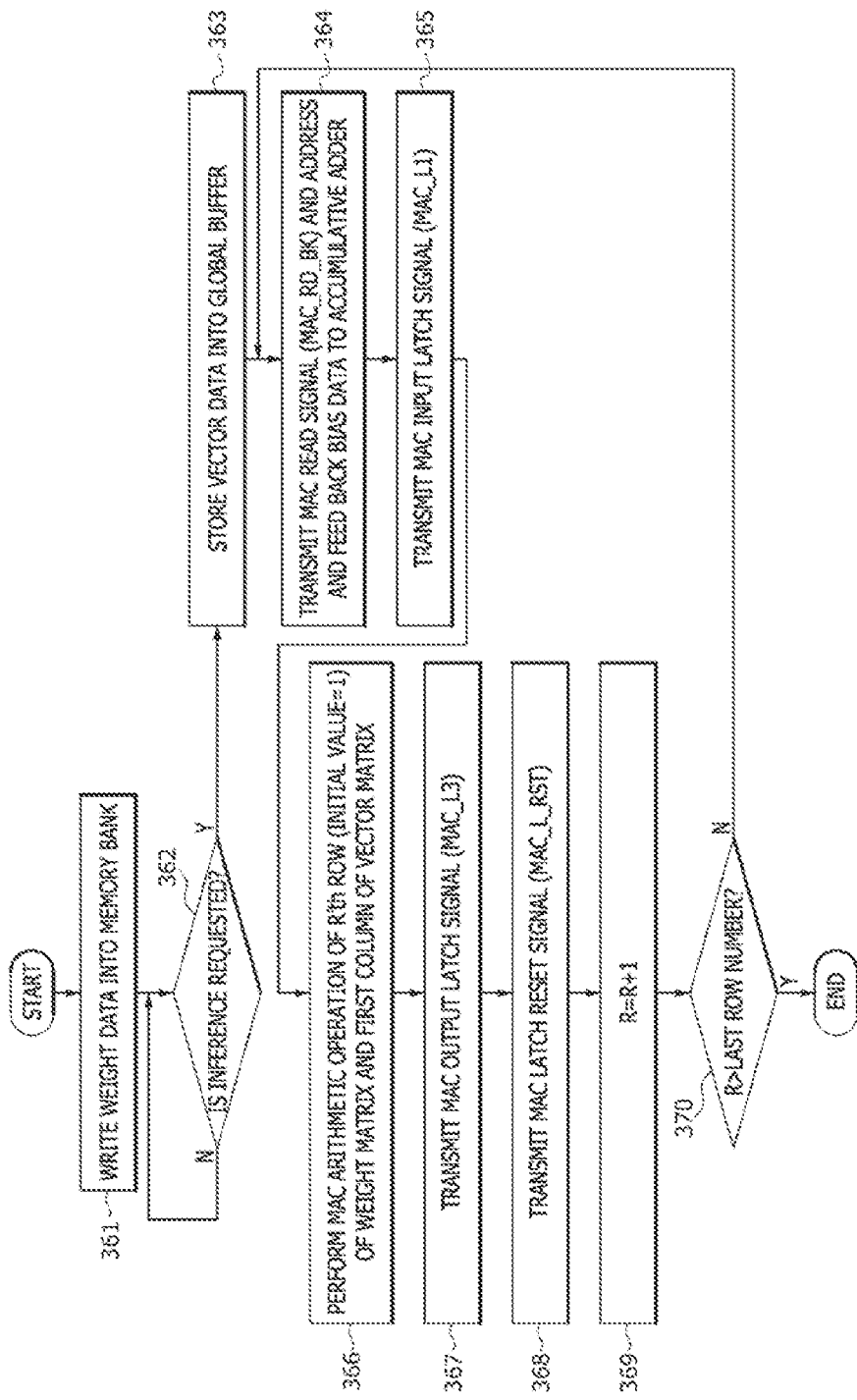
FIG. 22 is a flowchart illustrating processes of the MAC arithmetic operation illustrated in FIG. 5 in a PIM system according to a second embodiment of the present disclosure.

FIG. 22 is a flowchart illustrating processes of the MAC arithmetic operation described with reference to FIG. 5, which are performed in the PIM system 1-2 according to the second embodiment of the present disclosure. In addition, FIGS. 23 to 26 are block diagrams illustrating the processes of the MAC arithmetic operation illustrated in FIG. 5, which are performed in the PIM system 1-2 according to the second embodiment of the present disclosure. Referring to FIGS. 22 to 26, the first data (i.e., the weight data) may be written into the memory bank 411 at a step 361 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 5.

At a step 362, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 500 at the step 362, then the PIM controller 500 may write the vector data transmitted with the inference request signal into the global buffer 412 at a step 363. Accordingly, the vector data may be stored in the global buffer 412 of the PIM device 400.

Figure 23:
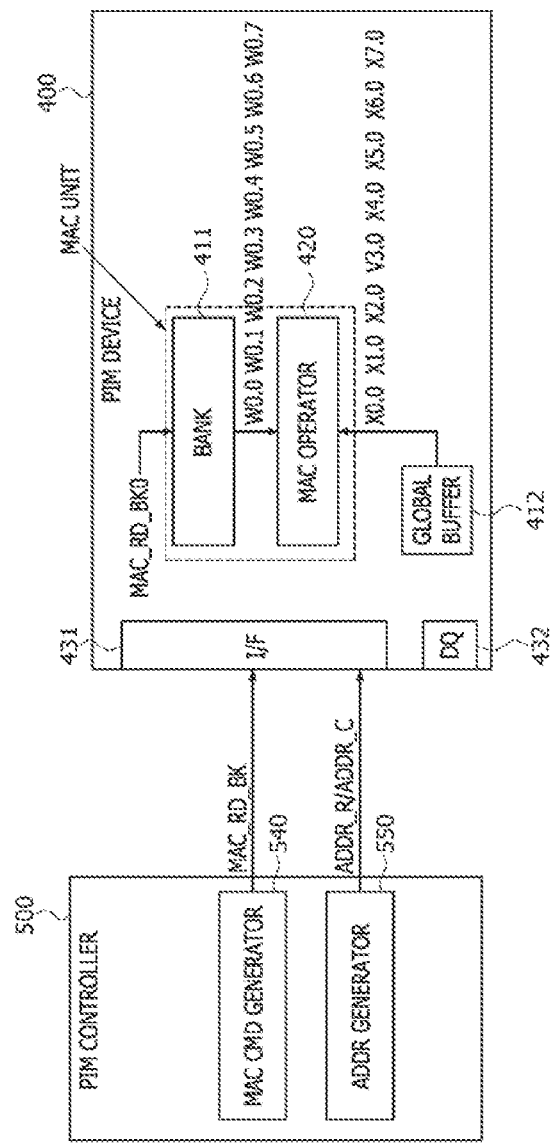
FIGS. 23 to 26 are block diagrams illustrating processes of the MAC arithmetic operation illustrated in FIG. 5 in a PIM system according to a second embodiment of the present disclosure.

At a step 364, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. Although not shown in the drawings, if a plurality of memory banks are disposed in the PIM device 400, the address generator 550 may transmit a bank selection signal for selecting the memory bank 411 among the plurality of memory banks as well as the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

Figure 24:
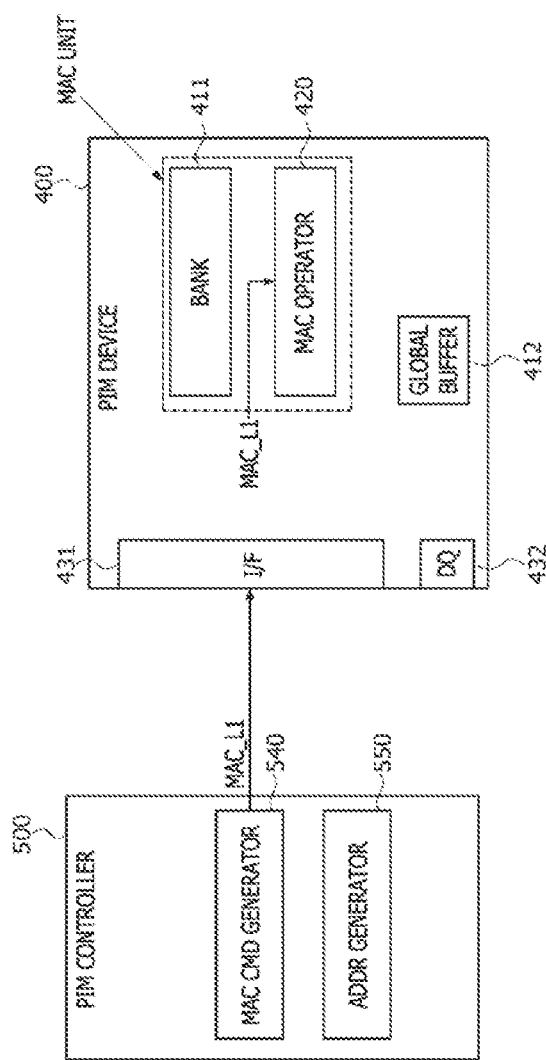

At a step 365, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 366, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, as described with reference to FIG. 4, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data from the multipliers 122-11 and may perform the adding calculation of the output data of the multipliers 122-11 to output the result data of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to the element MAC0.0 located at the first row of the '8×1' MAC result matrix having the eight elements of MAC0.0, . . . , and MAC7.0 illustrated in FIG. 5. The output data MAC0.0 of the addition logic circuit 122-2 may be inputted to the output latch 123-1 disposed in the data output circuit 123 of the MAC operator 420, as described with reference to FIG. 4.

Figure 25:
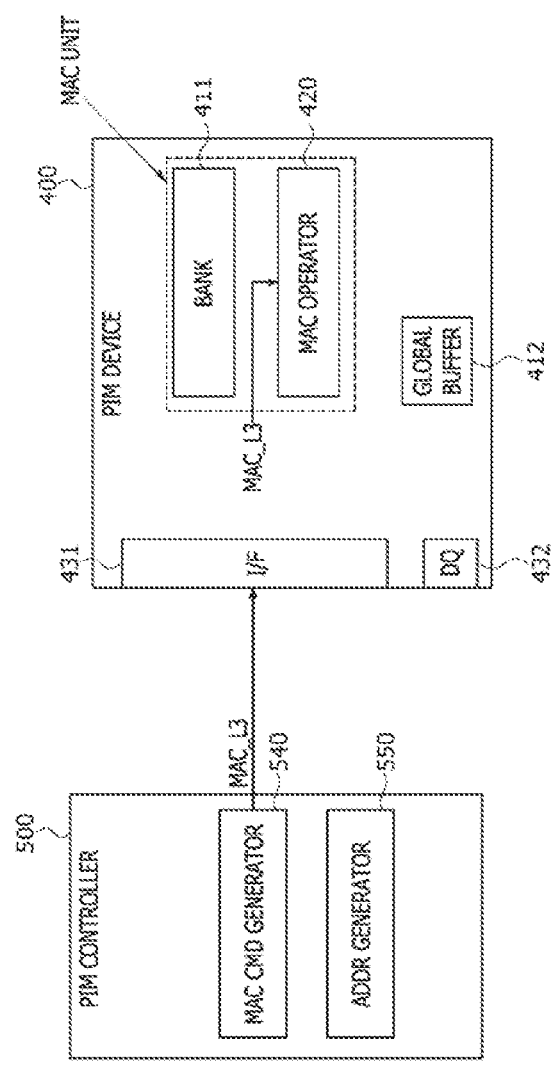

At a step 367, the MAC command generator 540 of the PIM controller 500 may generate and transmit the MAC output latch signal MAC_L3 to the PIM device 400, as illustrated in FIG. 25. The MAC output latch signal MAC_L3 may control the output latch operation of the MAC result data MAC0.0 performed by the MAC operator 420 of the PIM device 400. The MAC result data MAC0.0 transmitted from the MAC circuit 122 of the MAC operator 420 to the output latch 123-1 may be outputted from the output latch 123-1 by the output latch operation performed in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 26:
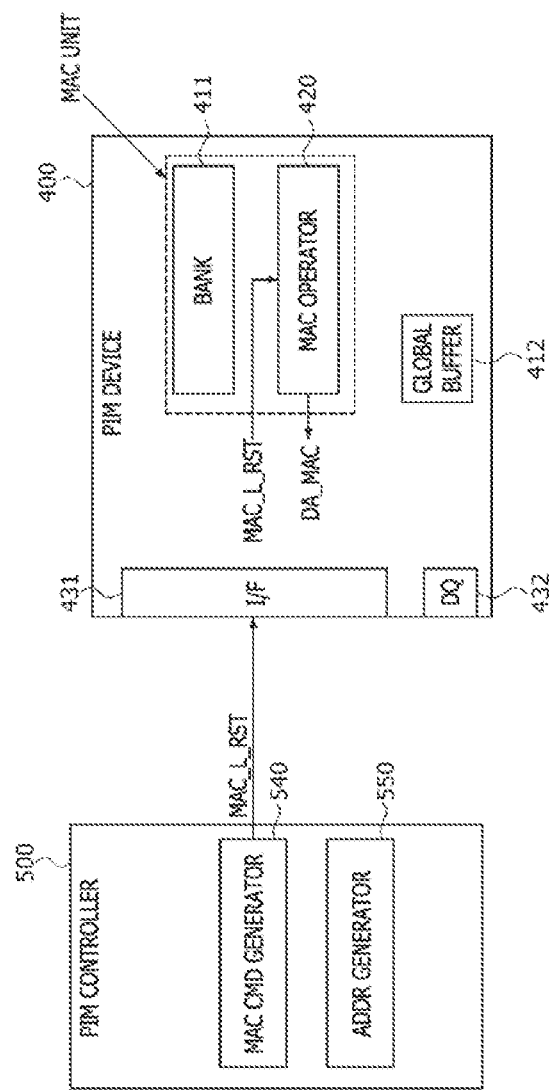

At a step 368, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the MAC result data MAC0.0 generated by the MAC operator 420 and a reset operation of the output latch 123-1 included in the MAC operator 420. As described with reference to FIG. 4, the transfer gate 123-2 receiving the MAC result data MAC0.0 from the output latch 123-1 of the MAC operator 420 may be synchronized with the MAC latch reset signal MAC_L_RST to output the MAC result data MAC0.0. In an embodiment, the MAC result data MAC0.0 outputted from the MAC operator 420 may be stored into the memory bank 411 through the BIO line in the PIM device 400.

At a step 369, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 369. At a step 370, whether the row number changed at the step 369 is greater than the row number of the last row (i.e., the eighth row) of the weight matrix may be determined. Because the row number of the weight matrix is changed to '2' at the step 370, a process of the MAC arithmetic operation may be fed back to the step 364.

If the process of the MAC arithmetic operation is fed back to the step 364 from the step 370, the same processes as described with reference to the steps 364 to 370 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 364 from the step 370, the processes from the step 364 to the step 370 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 369, the MAC arithmetic operation may terminate because the row number of '9' is greater than the last row number of '8' at the step 370.

Figure 27:
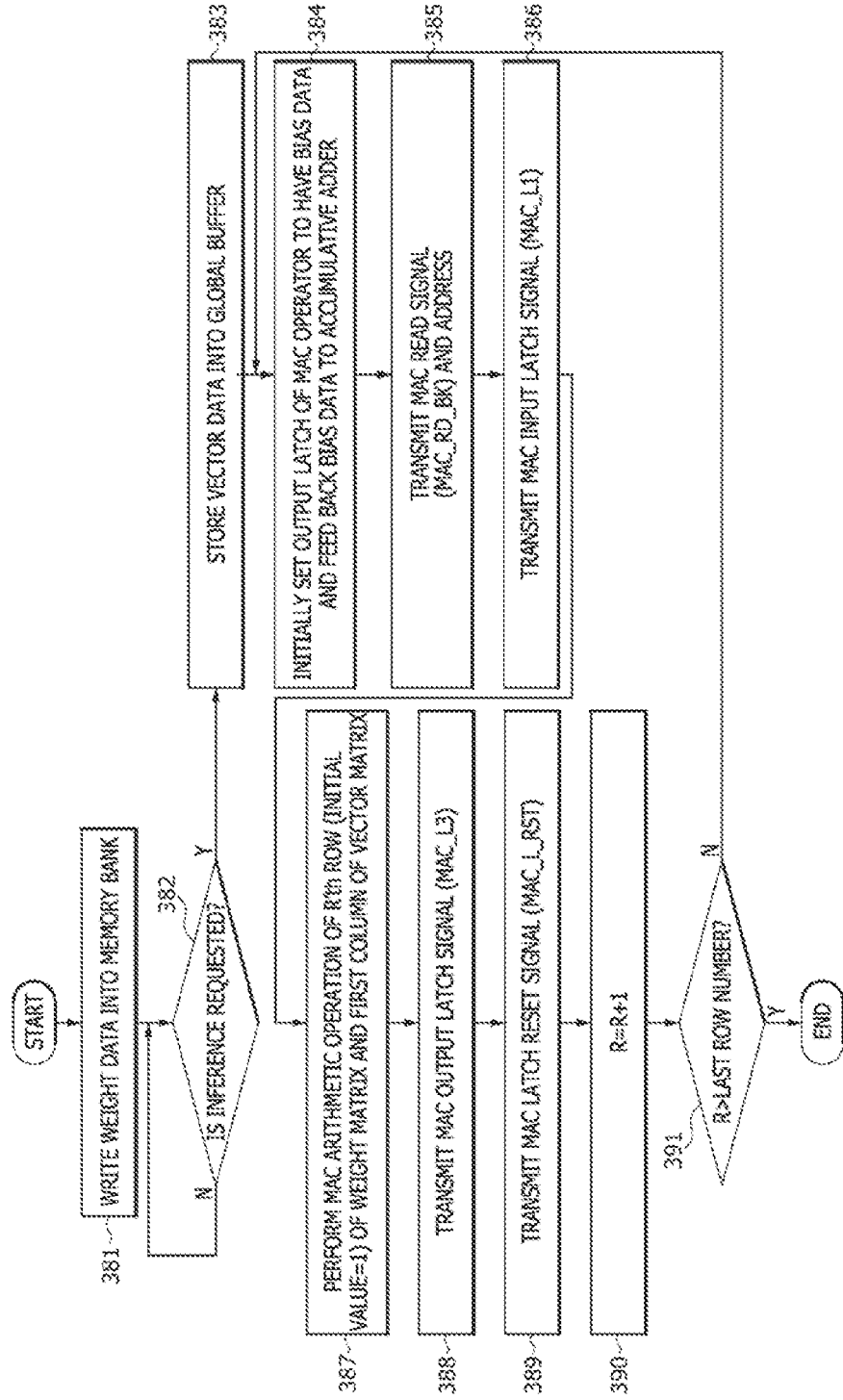
FIG. 27 is a flowchart illustrating processes of the MAC arithmetic operation illustrated in FIG. 14 in a PIM system according to a second embodiment of the present disclosure.

FIG. 27 is a flowchart illustrating processes of the MAC arithmetic operation described with reference to FIG. 14, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-1 illustrated in FIG. 16. Referring to FIGS. 20 and 27, the first data (i.e., the weight data) may be written into the memory bank 411 at a step 381 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 14.

At a step 382, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 500 at the step 382, then the PIM controller 500 may write the vector data transmitted with the inference request signal into the global buffer 412 at a step 383. Accordingly, the vector data may be stored in the global buffer 412 of the PIM device 400.

At a step 384, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 14. That is, as illustrated in FIG. 16, the output latch 123-1 of the data output circuit 123-A included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 385, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 386, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 387, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., MAC result data) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 388, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the transfer gate 123-2 of the data output circuit 123-A.

At a step 389, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the biased result data Y0.0 generated by the MAC operator 420 and a reset operation of the output latch 123-1 included in the MAC operator 420. The transfer gate 123-2 receiving the biased result data Y0.0 from the output latch 123-1 of the MAC operator 420 may be synchronized with the MAC latch reset signal MAC_L_RST to output the biased result data Y0.0. In an embodiment, the biased result data Y0.0 outputted from the MAC operator 120 may be stored into the memory bank 411 through the BIO line in the PIM device 400.

At a step 390, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 390. At a step 391, whether the row number changed at the step 390 is greater than the row number of the last row (i.e., the eighth row) of the weight matrix may be determined. Because the row number of the weight matrix is changed to '2' at the step 390, a process of the MAC arithmetic operation may be fed back to the step 384.

If the process of the MAC arithmetic operation is fed back to the step 384 at the step 391, the same processes as described with reference to the steps 384 to 391 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 384 at the step 391, then the processes from the step 384 to the step 390 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 390, then the MAC arithmetic operation may terminate because the row number of '9' is greater than the last row number of '8' at the step 391.

Figure 28:
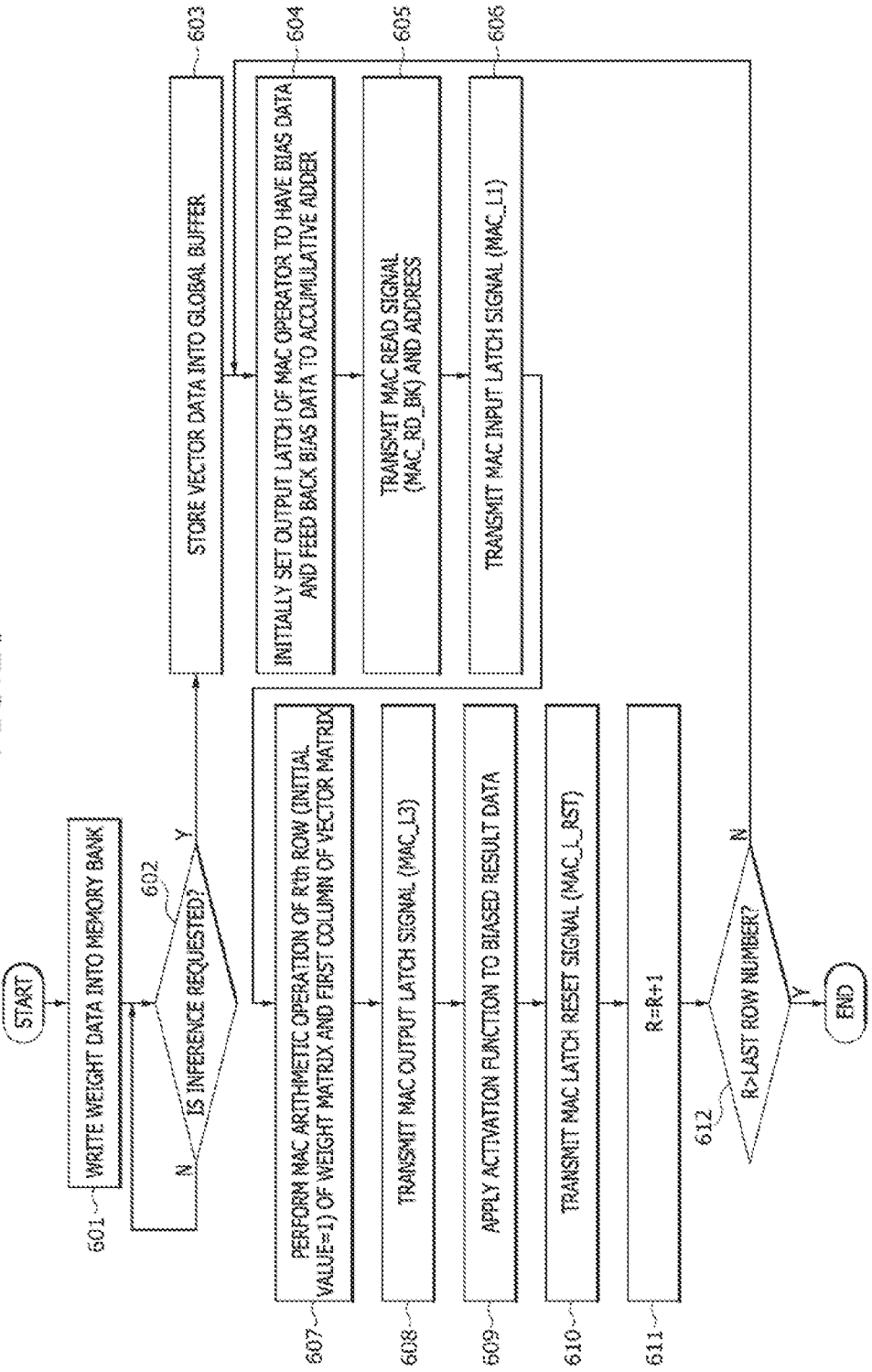
FIG. 28 is a flowchart illustrating processes of the MAC arithmetic operation illustrated in FIG. 17 in a PIM system according to a second embodiment of the present disclosure.

FIG. 28 is a flowchart illustrating processes of the MAC arithmetic operation described with reference to FIG. 17, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-2 illustrated in FIG. 19. Referring to FIGS. 19 and 28, the first data (i.e., the weight data) may be written into the memory bank 411 at a step 601 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 17.

At a step 602, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 500 at the step 602, then the PIM controller 500 may write the vector data transmitted with the inference request signal into the global buffer 412 at a step 603. Accordingly, the vector data may be stored in the global buffer 412 of the PIM device 400.

At a step 604, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 17. That is, as described with reference to FIG. 19, the output latch 123-1 of the data output circuit 123-B included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage of the addition logic circuit 122-2 to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 605, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 606, the MAC command generator 540 of the PIM controller 500 may generate and transmit the MAC input latch signal MAC_L1 to the PIM device 400, as described with reference to FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 607, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., the MAC result data MAC0.0) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 608, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the activation function logic circuit 123-5, which is illustrated in FIG. 19. At a step 610, the activation function logic circuit 123-5 may apply an activation function to the biased result data Y0.0 to generate a final output value, and the final output value may be inputted to the transfer gate (123-2 of FIG. 4).

At a step 610, the MAC command generator 540 of the PIM controller 500 may generate and transmit the MAC latch reset signal MAC_L_RST to the PIM device 400, as described with reference to FIG. 26. The MAC latch reset signal MAC_L_RST may control an output operation of the final output value generated by the MAC operator 420 and a reset operation of the output latch 123-1 included in the MAC operator 420. The transfer gate 123-2 receiving the final output value from the activation function logic circuit 123-5 of the data output circuit 123-B included in the MAC operator 420 may be synchronized with the MAC latch reset signal MAC_L_RST to output the final output value. In an embodiment, the final output value outputted from the MAC operator 420 may be stored into the memory bank 411 through the BIO line in the PIM device 400.

At a step 611, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 611. At a step 612, whether the row number changed at the step 611 is greater than the row number of the last row (i.e., the eighth row) of the weight matrix may be determined. Because the row number of the weight matrix is changed to '2' at the step 611, a process of the MAC arithmetic operation may be fed back to the step 604.

If the process of the MAC arithmetic operation is fed back to the step 604 from the step 612, the same processes as described with reference to the steps 604 to 612 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix to generate the MAC result data (corresponding to the element MAC1.0 located in the second row of the MAC result matrix) and the bias data (corresponding to the element B1.0 located in the second row of the bias matrix). If the process of the MAC arithmetic operation is fed back to the step 604 from the step 612, the processes from the step 604 to the step 612 may be iteratively performed until the MAC arithmetic operation is performed for all of the rows (i.e., first to eighth rows) of the weight matrix with the vector matrix. If the MAC arithmetic operation for the eighth row of the weight matrix terminates and the row number of the weight matrix changes from '8' to '9' at the step 611, the MAC arithmetic operation may terminate because the row number of '9' is greater than the last row number of '8' at the step 612.

Figure 29:
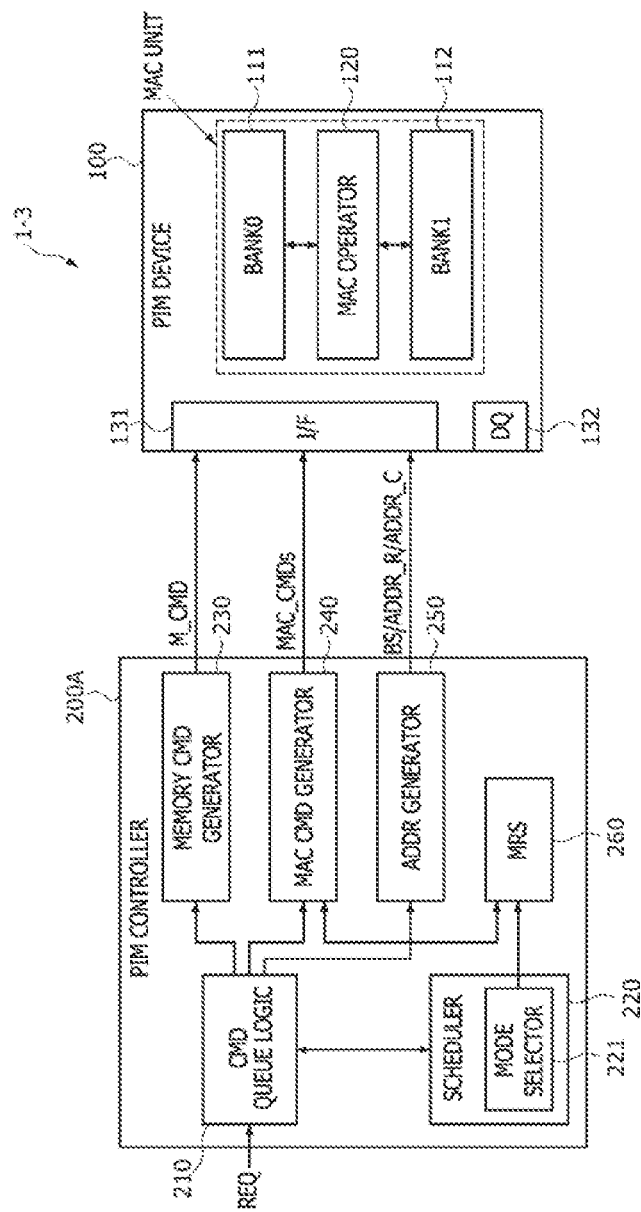
FIG. 29 is a block diagram illustrating a PIM system according to yet another embodiment of the present disclosure.

FIG. 29 is a block diagram illustrating a PIM system 1-3 according to a third embodiment of the present disclosure. As illustrated in FIG. 29, the PIM system 1-3 may have substantially the same configuration as the PIM system 1-1 illustrated in FIG. 2 except that a PIM controller 200A of the PIM system 1-3 further includes a mode register set (MRS) 260 as compared with the PIM controller 200 of the PIM system 1-1. Thus, the same explanation as described with reference to FIG. 2 will be omitted hereinafter. The mode register set 260 in the PIM controller 200A may receive an MRS signal instructing arrangement of various signals necessary for the MAC arithmetic operation of the PIM system 1-3. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 240. For an embodiment, the MRS 260 represents a MRS circuit.

In an embodiment, the MRS signal may include timing information on when the MAC commands MAC_CMDs are generated. In such a case, the deterministic operation of the PIM system 1-3 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the second memory bank 112 of the PIM device 100 by the inference request signal transmitted from an external device to the PIM controller 200A. Alternatively, the generation of the MRS signal in the MRS 260 may be executed after the vector data are stored in the second memory bank 112 of the PIM device 100 by the inference request signal transmitted from an external device to the PIM controller 200A.

Figure 30:
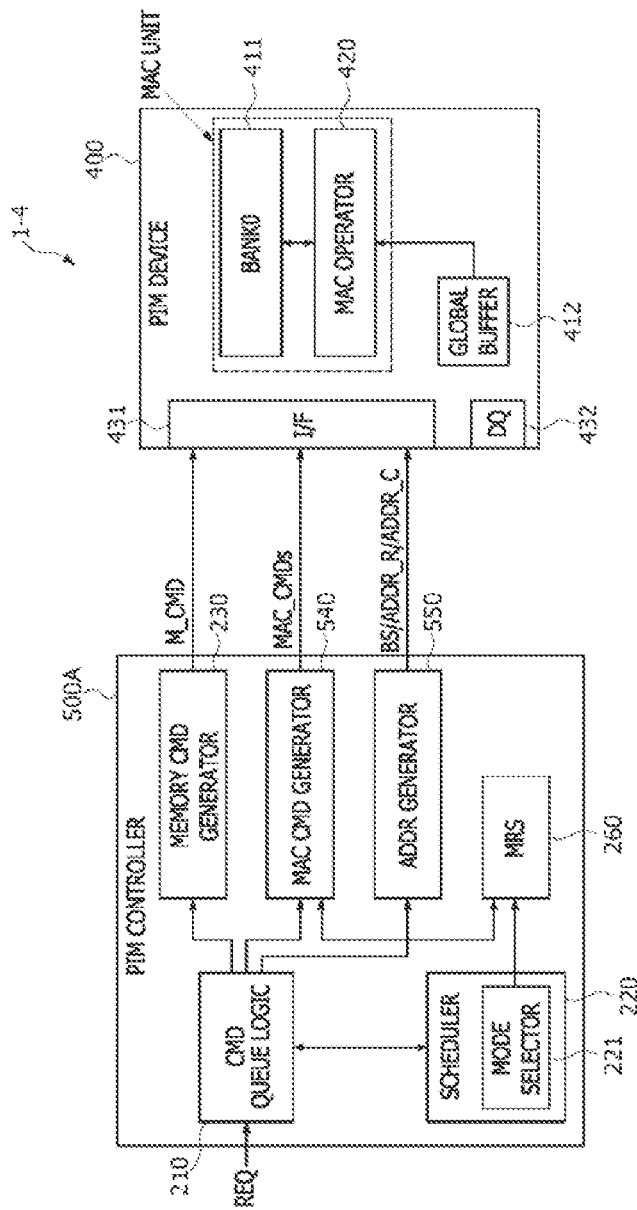
FIG. 30 is a block diagram illustrating a PIM system according to still another embodiment of the present disclosure.

FIG. 30 is a block diagram illustrating a PIM system 1-4 according to a fourth embodiment of the present disclosure. As illustrated in FIG. 30, the PIM system 1-4 may have substantially the same configuration as the PIM system 1-2 illustrated in FIG. 20 except that a PIM controller 500A of the PIM system 1-4 further includes the mode register set (MRS) 260 as compared with the PIM controller 500 of the PIM system 1-2. Thus, the same explanation as described with reference to FIG. 20 will be omitted hereinafter. The mode register set 260 in the PIM controller 500A may receive an MRS signal instructing arrangement of various signals necessary for the MAC arithmetic operation of the PIM system 1-4. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 540.

In an embodiment, the MRS signal may include timing information on when the MAC commands MAC_CMDs are generated. In such a case, the deterministic operation of the PIM system 1-4 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the global buffer 412 of the PIM device 400 by the inference request signal transmitted from an external device to the PIM controller 500A. Alternatively, the generation of the MRS signal in the MRS 260 may be executed after the vector data are stored in the global buffer 412 of the PIM device 400 by the inference request signal transmitted from an external device to the PIM controller 500A.

Figure 31:
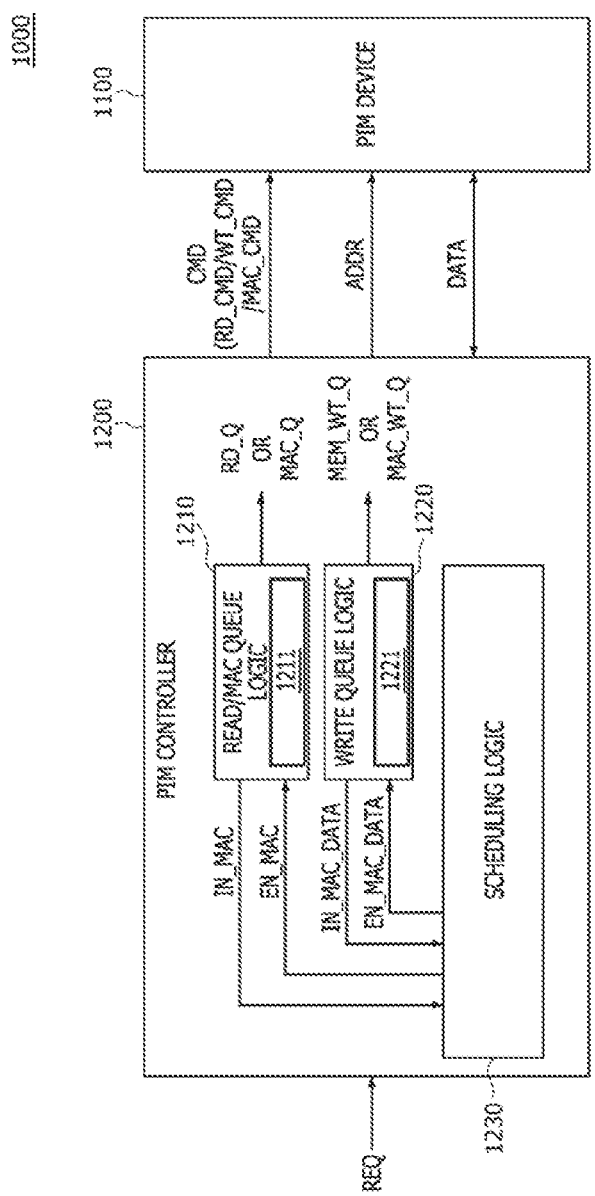
FIG. 31 is a block diagram illustrating a PIM system according to yet still another embodiment of the present disclosure.

FIG. 31 is a block diagram illustrating a PIM system 1000 according to yet still another embodiment of the present disclosure. Referring to FIG. 31, the PIM system 1000 may include a PIM device 1100 and a PIM controller 1200. The PIM device 1100 may operate in a memory mode or an arithmetic mode. In the memory mode, the PIM device 1100 may function as a memory device. When the PIM device 1100 functions as a memory device, the PIM device 1100 may store write data outputted from the PIM controller 1200 or may transmit stored read data to the PIM controller 1200. In the arithmetic mode, the PIM device 1100 may perform arithmetic operations. When the PIM device 1100 operates in the arithmetic mode, the PIM device 1100 may store data necessary for the arithmetic operations or may perform the arithmetic operations of the data stored in the PIM device 1100. Although the PIM device 1100 performs various arithmetic operations in the arithmetic mode, the arithmetic operation indicated in the following embodiments may refer to the MAC arithmetic operation. However, the MAC arithmetic operation may be merely an example of the arithmetic operations. Accordingly, it may be apparent that the present disclosure is equally applicable to any arithmetic operation. Hereinafter, the term "MAC" may be replaced with the term "arithmetic". For example, a MAC queue logic circuit is also referred to herein as an arithmetic queue logic circuit, a MAC queue is also referred to herein as an arithmetic queue, a MAC mode is also referred to as an arithmetic mode, and a MAC mode enablement signal is also referred to herein as an arithmetic mode enablement signal.

The PIM controller 1200 may be configured to control the PIM device 1100. In order that the PIM controller 1200 controls the PIM device 1100, the PIM controller 1200 may transmit a command CMD and an address ADDR to the PIM device 1100. In addition, the PIM controller 1200 may transmit data DATA to the PIM device 1100 or may receive data DATA from the PIM device 1100. The command CMD transmitted from the PIM controller 1200 to the PIM device 1100 may include a read command RD_CMD, a write command WT_CMD, and a MAC command MAC_CMD. In the event that the read command RD_CMD is transmitted from the PIM controller 1200 to the PIM device 1100, the PIM device 1100 may transmit data DATA stored in the PIM device 1100 or MAC result data to the PIM controller 1200. In the event that the write command WT_CMD is transmitted from the PIM controller 1200 to the PIM device 1100, the PIM device 1100 may store data DATA outputted from the PIM controller 1200. In the event that the MAC command MAC_CMD is transmitted from the PIM controller 1200 to the PIM device 1100, the PIM device 1100 may perform a MAC arithmetic operation of the data stored in the PIM device 1100. The address ADDR transmitted from the PIM controller 1200 to the PIM device 1100 may designate a region into which the data are written or in which the data for reading out are stored, among a plurality of regions of the PIM device 1100.

The PIM controller 1200 may include a read/MAC queue logic circuit 1210, a write queue logic circuit 1220, and a scheduling logic circuit 1230. The read/MAC queue logic circuit 1210 is also referred to herein as a read/arithmetic queue logic circuit. The read/MAC queue logic circuit 1210 may store a read queue RD_Q or a MAC queue MAC_Q outputted from an external device, for example, a host. The read queue RD_Q may mean a request for reading data out of the PIM device 1100. The MAC queue MAC_Q may mean a request for the MAC arithmetic operation of the PIM device 1100. The MAC queue MAC_Q is also referred to herein as an arithmetic queue. The read queue RD_Q and the MAC queue MAC_Q stored in the read/MAC queue logic circuit 1210 may be outputted in an order which is designated by the scheduling logic circuit 1230. If the read queue RD_Q is outputted from the read/MAC queue logic circuit 1210, the PIM controller 1200 may transmit the read command RD_CMD to the PIM device 1100. If the MAC queue MAC_Q is outputted from the read/MAC queue logic circuit 1210, the PIM controller 1200 may transmit the MAC command MAC_CMD to the PIM device 1100.

The scheduling logic circuit 1230 may control the read/MAC queue logic circuit 1210 such that the read/MAC queue logic circuit 1210 outputs the MAC queue MAC_Q firstly when the MAC queue MAC_Q exists in the read/MAC queue logic circuit 1210. For the above scheduling, the read/MAC queue logic circuit 1210 may be configured to transmit a MAC mode signal IN_MAC having a first level such as a logic "high(1)" level to the scheduling logic circuit 1230 when the MAC queue MAC_Q exists in the read/MAC queue logic circuit 1210, and the read/MAC queue logic circuit 1210 may also be configured to output the MAC queue MAC_Q in response to a MAC mode enablement signal EN_MAC having the first level outputted from the scheduling logic circuit 1230. The MAC mode enablement signal EN_MAC is also referred to herein as an arithmetic mode enablement signal.

The write queue logic circuit 1220 may store a write queue WT_Q provided by an external device, for example, a host. The write queue WT_Q may mean a request for writing data into the PIM device 1100. The write queue WT_Q may include a memory write queue MEM_WT_Q and a MAC write queue MAC_WT_Q. The memory write queue MEM_WT_Q may be a request for storing the data in the PIM device 1100 in the memory mode. The MAC write queue MAC_WT_Q may be a request for storing the data necessary for the arithmetic operations performed in the MAC mode in the PIM device 1100. The memory write queue MEM_WT_Q and the MAC write queue MAC_WT_Q stored in the write queue logic circuit 1220 may be outputted in an order which is designated by the scheduling logic circuit 1230. If the memory write queue MEM_WT_Q or the MAC write queue MAC_WT_Q is outputted from the write queue logic circuit 1220, the PIM controller 1200 may transmit the write command WT_CMD to the PIM device 1100. The scheduling logic circuit 1230 may control the read/MAC queue logic circuit 1210 and the write queue logic circuit 1220 such that the write queue logic circuit 1220 outputs the MAC write queue MAC_WT_Q before the read/MAC queue logic circuit 1210 outputs the MAC queue MAC_Q when the MAC queue MAC_Q exists in the read/MAC queue logic circuit 1210 and the MAC write queue MAC_WT_Q exists in the write queue logic circuit 1220. For the above scheduling, the write queue logic circuit 1220 may be configured to transmit a MAC write signal IN_MAC_DATA having the first level to the scheduling logic circuit 1230 when the MAC write queue MAC_WT_Q exists in the write queue logic circuit 1220, and the write queue logic circuit 1220 may also be configured to output the MAC write queue MAC_WT_Q in response to a MAC write enablement signal EN_MAC_DATA having the first level outputted from the scheduling logic circuit 1230.

The scheduling logic circuit 1230 may perform a scheduling operation for controlling an output sequence of the read queue RD_Q (or the MAC queue MAC_Q) stored in the read/MAC queue logic circuit 1210 and the memory write queue MEM_WT_Q (or the MAC write queue MAC_WT_Q) stored in the write queue logic circuit 1220. The scheduling logic circuit 1230 may control the read/MAC queue logic circuit 1210 such that the read/MAC queue logic circuit 1210 outputs the MAC queue MAC_Q prior to the read queue RD_Q when the MAC queue MAC_Q exists in the read/MAC queue logic circuit 1210. In addition, the scheduling logic circuit 1230 may control the read/MAC queue logic circuit 1210 and the write queue logic circuit 1220 such that the write queue logic circuit 1220 outputs the MAC write queue MAC_WT_Q before the read/MAC queue logic circuit 1210 outputs the MAC queue MAC_Q when the MAC write queue MAC_WT_Q exists in the write queue logic circuit 1220. For the above scheduling operation, the scheduling logic circuit 1230 may be configured to transmit the MAC mode enablement signal EN_MAC having the first level to the read/MAC queue logic circuit 1210 in response to the MAC mode signal IN_MAC having the first level outputted from the read/MAC queue logic circuit 1210. In addition, the scheduling logic circuit 1230 may also be configured to transmit the MAC write enablement signal EN_MAC_DATA having the first level to the write queue logic circuit 1220 in response to the MAC write signal IN_MAC_DATA having the first level outputted from the write queue logic circuit 1220. In such a case, the scheduling logic circuit 1230 may be configured to generate the MAC write enablement signal EN_MAC_DATA having the first level prior to the MAC mode enablement signal EN_MAC having the first level such that the MAC write queue MAC_WT_Q is outputted from the write queue logic circuit 1220 before the MAC queue MAC_Q is outputted from the read/MAC queue logic circuit 1210.

Figure 32:
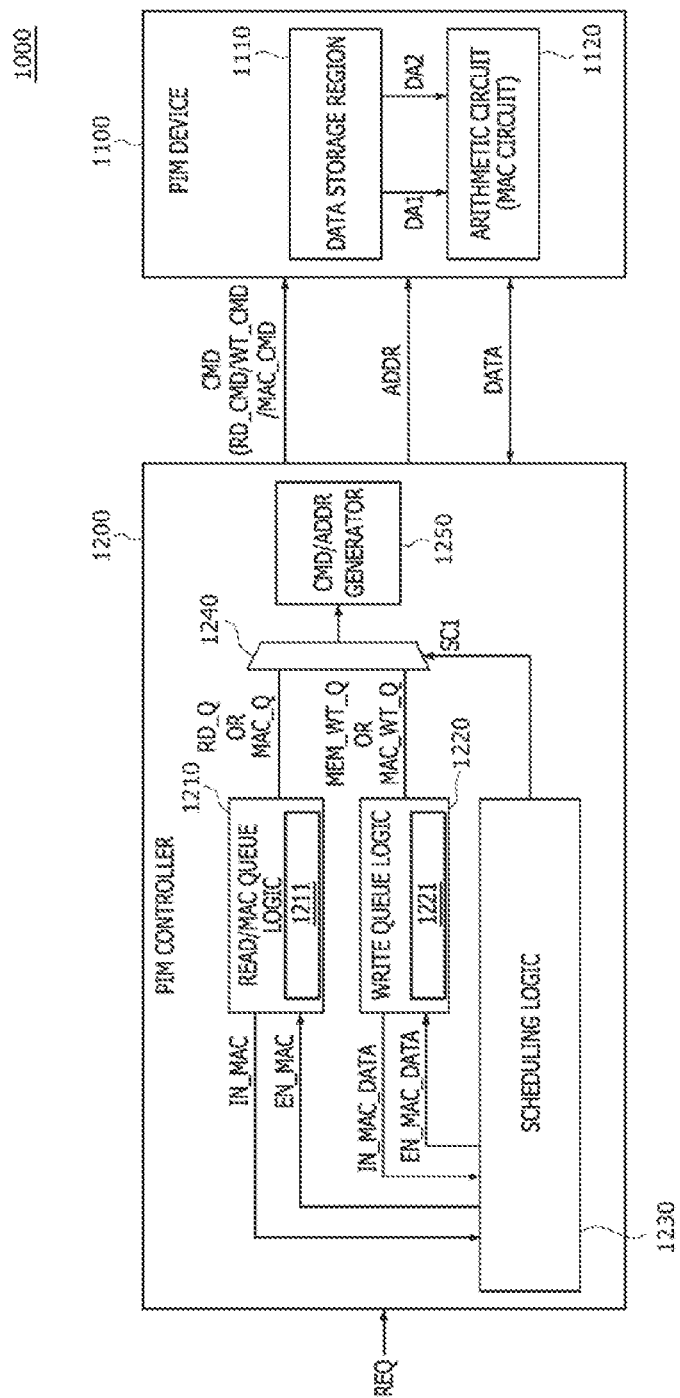
FIG. 32 is a block diagram illustrating the PIM system illustrated in FIG. 31 in more detail.

FIG. 32 is a block diagram illustrating the PIM system 1000 of FIG. 31 in more detail. Referring to FIG. 32, the PIM device 1100 may include a data storage region 1110 and an arithmetic circuit 1120 (hereinafter, referred to as 'MAC circuit'). In the memory mode, the PIM device 1100 may perform a memory write operation for storing write data outputted from the PIM controller 1200 in the data storage region 1110 or may perform a memory read operation for transmitting read data outputted from the data storage region 1110 to the PIM controller 1200. In the MAC mode, the PIM device 1100 may perform the MAC arithmetic operation of the data provided by the data storage region 1110. In the MAC mode, the PIM device 1100 may perform a MAC write operation for storing first and second data DA1 and DA2 used for arithmetic operations in the data storage region 1110 before the MAC arithmetic operation is performed.

In an embodiment, the data storage region 1110 may be a volatile memory device such as a DRAM device or a nonvolatile memory device such as a NAND-type flash memory device. Alternatively, the data storage region 1110 may include both of a volatile memory device and a nonvolatile memory device. The data storage region 1110 may include a first storage region and a second storage region that store first and second data DA1 and DA2, respectively, which are necessary for the MAC arithmetic operation. In an embodiment, each of the first storage region and the second storage region may be a memory bank. Alternatively, the first storage region and the second storage region may be a memory bank and a buffer memory, respectively. The data storage region 1110 may supply the first data DA1 and the second data DA2 to the MAC circuit 1120 to perform the MAC arithmetic operation of the MAC circuit 1120. The MAC circuit 1120 may be configured to perform the MAC arithmetic operation for the first data DA1 and the second data DA2 outputted from the data storage region 1110. The MAC arithmetic operation of the MAC circuit 1120 may be performed according to the MAC command MAC_CMD outputted from the PIM controller 1200. If the MAC command MAC_CMD is transmitted from the PIM controller 1200 to the MAC circuit 1120, the first data DA1 and the second data DA2 may be transmitted from the data storage region 1110 to the MAC circuit 1120. The MAC circuit 1120 may perform the MAC arithmetic operation for the first data DA1 and the second data DA2 which are outputted from the data storage region 1110.

The PIM controller 1200 may receive a request REQ which is outputted from an external device, for example, a host. The request REQ outputted from the host may be a request (hereinafter, referred to as a 'memory operation request') for execution of operations of the PIM device 1100 in the memory mode or a request (hereinafter, referred to as a 'MAC operation request') for execution of operations of the PIM device 1100 in the MAC mode. The memory operation request may include a memory write request for execution of a data write operation that writes data into the PIM device 1100 and a memory read request for execution of a data read operation that outputs data stored in the PIM device 1100. The MAC operation request may include a MAC write request for execution of a data write operation that writes data into the PIM device 1100, a MAC arithmetic request for execution of the MAC arithmetic operation of the PIM device 1100, and a MAC read request for execution of a data read operation that outputs the MAC result data stored in the PIM device 1100. Hereinafter, the memory read request of the memory operation request and the MAC read request of the MAC operation request may be referred to as a read request without distinction.

When the request REQ outputted from the host is the memory write request or the MAC write request, the PIM controller 1200 may transmit the write data to the PIM device 1100. In case of the memory write request, the write data may correspond to merely data which are stored in the data storage region 1110. However, in case of the MAC write request, the write data may correspond to data which are stored in the data storage region 1110 to be used for the MAC arithmetic operation performed by the arithmetic circuit 1120 (i.e., the MAC circuit). When the request REQ outputted from the host is the read request, the PIM controller 1200 may receive the read data from the PIM device 1100. In case of the read request of the memory operation request, the read data may correspond to data stored in the data storage region 1110 of the PIM device 1100. However, in case of the read request of the MAC operation request, the read data may correspond to the MAC result data obtained by the MAC arithmetic operation which is performed by the MAC circuit 1120 of the PIM device 1100.

The PIM controller 1200 may include the read/MAC queue logic circuit 1210, the write queue logic circuit 1220, the scheduling logic circuit 1230, a selection/output circuit 1240, and a command/address generator 1250. As described with reference to FIG. 31, the read/MAC queue logic circuit 1210 may store the read queue RD_Q or the MAC queue MAC_Q. Accordingly, the read/MAC queue logic circuit 1210 may include a read/MAC queue storage region 1211 for storing the read queue RD_Q or the MAC queue MAC_Q. As described with reference to FIG. 31, the write queue logic circuit 1220 may store the memory write queue MEM_WT_Q or the MAC write queue MAC_WT_Q. Accordingly, the write queue logic circuit 1220 may include a write queue storage region 1221 for storing the memory write queue MEM_WT_Q or the MAC write queue MAC_WT_Q. The scheduling logic circuit 1230 may perform the scheduling operation for controlling an output sequence of the queues stored in the read/MAC queue logic circuit 1210 and the write queue logic circuit 1220.

The read/MAC queue logic circuit 1210 may transmit the MAC mode signal IN_MAC having the first level to the scheduling logic circuit 1230 when the MAC queue MAC_Q exists in the read/MAC queue storage region 1211. In contrast, the read/MAC queue logic circuit 1210 may transmit the MAC mode signal IN_MAC having a second level such as a logic "low(0)" level to the scheduling logic circuit 1230 when the MAC queue MAC_Q does not exist in the read/MAC queue storage region 1211. The write queue logic circuit 1220 may transmit the MAC write signal IN_MAC_DATA having the first level to the scheduling logic circuit 1230 when the MAC write queue MAC_WT_Q exists in the write queue storage region 1221. In contrast, the write queue logic circuit 1220 may transmit the MAC write signal IN_MAC_DATA having the second level to the scheduling logic circuit 1230 when the MAC write queue MAC_WT_Q does not exist in the write queue storage region 1221.

The scheduling logic circuit 1230 may transmit the MAC write enablement signal EN_MAC_DATA having the first level (i.e., a logic "high" level) to the write queue logic circuit 1220 when both of the MAC mode signal IN_MAC and the MAC write signal IN_MAC_DATA have the first level (i.e., a logic "high" level). In contrast, the scheduling logic circuit 1230 may transmit the MAC write enablement signal EN_MAC_DATA having the second level (i.e., a logic "low" level) to the write queue logic circuit 1220 when at least one of the MAC mode signal IN_MAC and the MAC write signal IN_MAC_DATA has the second level (i.e., a logic "low" level). The scheduling logic circuit 1230 may transmit the MAC mode enablement signal EN_MAC having the first level to the read/MAC queue logic circuit 1210 when the MAC mode signal IN_MAC has the first level (i.e., a logic "high" level). Meanwhile, when both of the MAC mode signal IN_MAC and the MAC write signal IN_MAC_DATA have the first level (i.e., a logic "high" level), the scheduling logic circuit 1230 may transmit the MAC mode enablement signal EN_MAC having the first level (i.e., a logic "high" level) to the read/MAC queue logic circuit 1210 after transmitting the MAC write enablement signal EN_MAC_DATA having the first level (i.e., a logic "high" level) to the write queue logic circuit 1220.

The selection/output circuit 1240 may have a first input terminal, a second input terminal, a control signal input terminal, and an output terminal. The read queue RD_Q or the MAC queue MAC_Q outputted from the read/MAC queue logic circuit 1210 may be inputted to the first input terminal of the selection/output circuit 1240. The memory write queue MEM_WT_Q or the MAC write queue MAC_WT_Q outputted from the write queue logic circuit 1220 may be inputted to the second input terminal of the selection/output circuit 1240. A first selection control signal SC1 outputted from the scheduling logic circuit 1230 may be inputted to the control signal input terminal of the selection/output circuit 1240. The output terminal of the selection/output circuit 1240 may be coupled to the command/address generator 1250. The selection/output circuit 1240 may selectively output one of the read queue RD_Q (or the MAC queue MAC_Q) inputted to the first input terminal and the memory write queue MEM_WT_Q (or the MAC write queue MAC_WT_Q) inputted to the second input terminal in response to the first selection control signal SC1 inputted to the control signal input terminal. The queue outputted from the selection/output circuit 1240 may be inputted to the command/address generator 1250. In an embodiment, the selection/output circuit 1240 may be realized using a multiplexer having two input terminals and one output terminal.

The command/address generator 1250 may decode an output signal (i.e., a queue) of the selection/output circuit 1240 to generate and output the command CMD and the address ADDR. In an embodiment, when the read queue RD_Q is outputted from the selection/output circuit 1240, the command/address generator 1250 may generate and output the read command RD_CMD as the command CMD. When the memory write queue MEM_WT_Q or the MAC write queue MAC_WT_Q is outputted from the selection/output circuit 1240, the command/address generator 1250 may generate and output the write command WT_CMD as the command CMD. When the MAC queue MAC_Q is outputted from the selection/output circuit 1240, the command/address generator 1250 may generate and output the MAC command MAC_COM as the command CMD.

Figure 33:
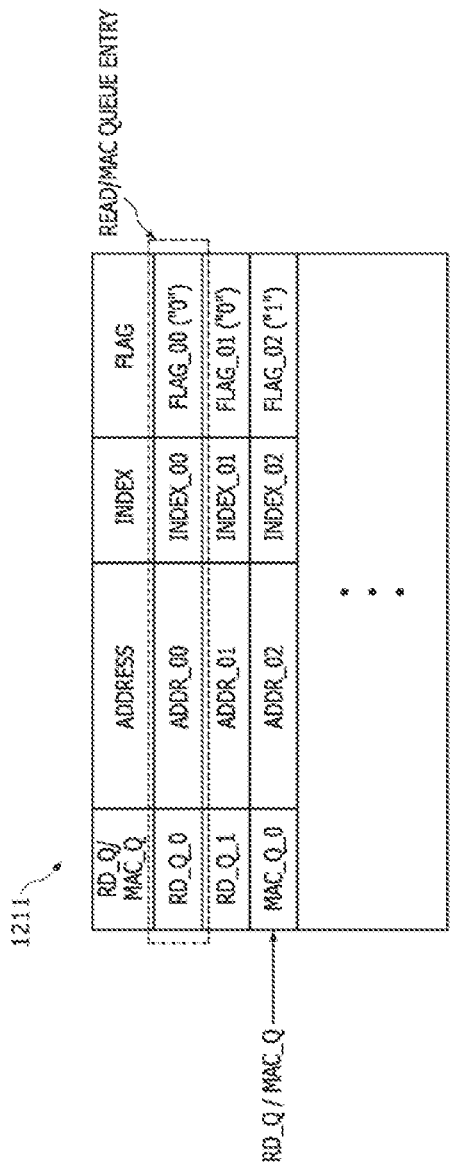
FIG. 33 illustrates a read/MAC queue storage region in a read/MAC queue logic circuit included in the PIM system illustrated in FIG. 32.

FIG. 33 illustrates a configuration of the read/MAC queue storage region 1211 included in the read/MAC queue logic circuit 1210 illustrated in FIG. 32. Referring to FIG. 33, the read/MAC queue storage region 1211 may have a plurality of read/MAC queue entries. Each of the plurality of read/MAC queue entries may store one read queue RD_Q or one MAC queue MAC_Q. Thus, the total number of the read queues RD_Q and/or the MAC queues MAC_Q which can be stored in the read/MAC queue storage region 1211 may be equal to the number of the read/MAC queue entries included in the read/MAC queue storage region 1211. Each of the plurality of read/MAC queue entries may include an address, an index, and a flag. The address in each read/MAC queue entry may be a physical address or a logical address of a region having data to be read out, among a plurality of regions in the data storage region (1110 of FIG. 32) included in the PIM device (1100 of FIG. 32). Alternatively, the address in each read/MAC queue entry may be a physical address or a logical address of a region having data to be used for the MAC arithmetic operation, among a plurality of regions in the data storage region (1110 of FIG. 32) included in the PIM device (1100 of FIG. 32). As illustrated in FIG. 33, a first address ADDR_00 in a first read/MAC queue entry and a second address ADDR_01 in a second read/MAC queue entry may provide information on locations in the PIM device (1100 of FIG. 32) that store data to be read out by the read operations which are executed by a first read queue RD_Q_0 in the first read/MAC queue entry and a second read queue RD_Q_1 in the second read/MAC queue entry. A third address ADDR_02 in a third read/MAC queue entry may provide information on a location in the PIM device (1100 of FIG. 32) that stores data to be used for the MAC arithmetic operation executed by a first MAC queue MAC_Q_0 in the third read/MAC queue entry.

The index in each read/MAC queue entry may include information on whether the read queue RD_Q or the MAC queue MAC_Q stored in the read/MAC queue entry is valid and information on a sequence in which the read queue RD_Q or the MAC queue MAC_Q stored in the read/MAC queue entry is outputted from the read/MAC queue logic circuit 1210. As illustrated in FIG. 33, a first index INDEX_00 in the first read/MAC queue entry may include information on whether the first read queue RD_Q_0 stored in the first read/MAC queue entry is valid and information on an output sequence of the first read queue RD_Q_0. In addition, a second index INDEX_01 in the second read/MAC queue entry may include information on whether the second read queue RD_Q_1 stored in the second read/MAC queue entry is valid and information on an output sequence of the second read queue RD_Q_1. Similarly, a third index INDEX_02 in the third read/MAC queue entry may include information on whether the first MAC queue MAC_Q_O stored in the third read/MAC queue entry is valid and information on an output sequence of the first MAC queue MAC_Q_O. In an embodiment, the index in each read/MAC queue entry may be set at a point in time when the read queue RD_Q or the MAC queue MAC_Q is stored.

The flag in each read/MAC queue entry may include information which is capable of determining whether the queue stored in the read/MAC queue entry is the read queue RD_Q or the MAC queue MAC_Q. In an embodiment, the flag may have a first binary number or a second binary number, meaning the flag may be set to a first or second binary value. In an embodiment, the first binary number may be "0", and the second binary number may be "1". In an embodiment, the flag may be set as the first binary number of "0" when the queue stored in the read/MAC queue entry is the read queue RD_Q, and the flag may be set as the second binary number of "1" when the queue stored in the read/MAC queue entry is the MAC queue MAC_Q. As illustrated in FIG. 33, a first flag FLAG_00 in the first read/MAC queue entry storing the first read queue RD_Q_0 may be set as the first binary number of "0", and a second flag FLAG_01 in the second read/MAC queue entry storing the second read queue RD_Q_1 may also be set as the first binary number of "0". In contrast, a third flag FLAG_02 in the third read/MAC queue entry storing the first MAC queue MAC_Q_0 may be set as the second binary number of "1". In an embodiment, the flag in each read/MAC queue entry may be set at a point in time when the read queue RD_Q or the MAC queue MAC_Q is stored.

Figure 34:
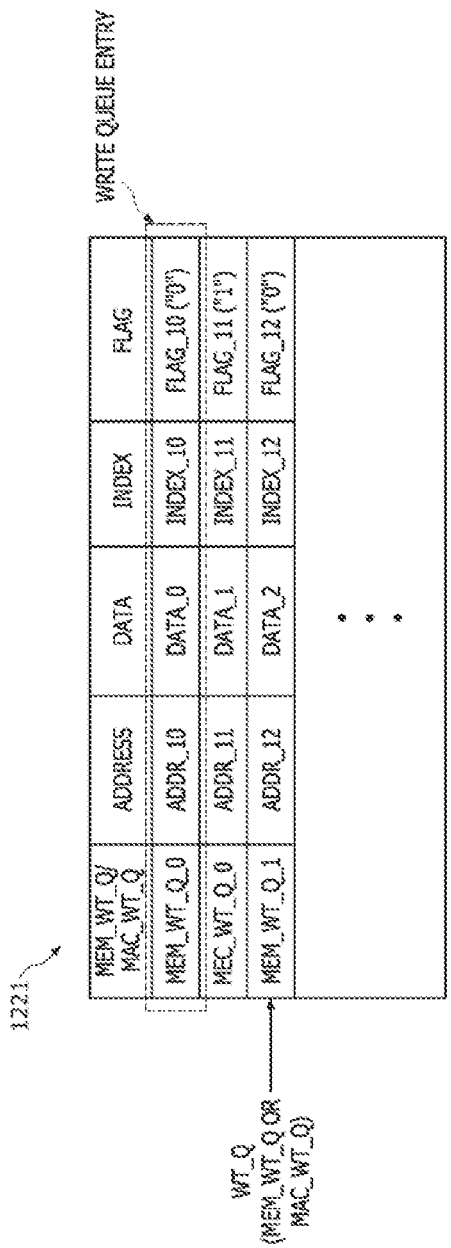
FIG. 34 illustrates a write queue storage region in a write queue logic circuit included in the PIM system illustrated in FIG. 32.

FIG. 34 illustrates a configuration of the write queue storage region 1221 included in the write queue logic circuit 1220 illustrated in FIG. 32. Referring to FIG. 34, the write queue storage region 1221 may have a plurality of write queue entries. Each of the plurality of write queue entries may store one memory write queue MEM_WT_Q or one MAC write queue MAC_WT_Q. Thus, the total number of the memory write queues MEM_WT_Q and/or the MAC write queues MAC_WT_Q which can be stored in the write queue storage region 1221 may be equal to the number of the write queue entries included in the write queue storage region 1221. Each of the plurality of write queue entries may include an address, data, an index, and a flag. The address in each write queue entry may be a physical address or a logical address of a region, in which data are written, among a plurality of regions in the data storage region (1110 of FIG. 32) included in the PIM device (1100 of FIG. 32). As illustrated in FIG. 34, a first address ADDR_10 in a first write queue entry may provide information on a location in the PIM device (1100 of FIG. 32) where data are written by the write operation executed by a first memory write queue MEM_WT_Q_0 in the first write queue entry, and a third address ADDR_12 in a third write queue entry may provide information on a location in the PIM device (1100 of FIG. 32) where data are written by the write operation executed by a second memory write queue MEM_WT_Q_1 in the third write queue entry. In addition, a second address ADDR_11 in a second write queue entry may provide information on a location in the PIM device (1100 of FIG. 32) where data used for the MAC arithmetic operation are written by the write operation executed by a first MAC write queue MAC_WT_Q_0 in the second write queue entry.

The data in the write queue entries may include the write data to be transmitted to the PIM device 1100. As illustrated in FIG. 34, first data DATA_0 in the first write queue entry may provide data to be written into the PIM device (1100 of FIG. 32) by the write operation executed by the first memory write queue MEM_WT_Q_0, and third data DATA_2 in the third write queue entry may provide data to be written into the PIM device (1100 of FIG. 32) by the write operation executed by the second memory write queue MEM_WT_Q_1. In addition, second data DATA_1 in the second write queue entry may provide data, which are used for the MAC arithmetic operation, to be written into the PIM device (1100 of FIG. 32) by the write operation executed by the first MAC write queue MAC_WT_Q_0.

The index in each write queue entry may include information on whether the memory write queue MEM_WT_Q or the MAC write queue MAC_WT_Q stored in the write queue entry is valid and information on a sequence in which the memory write queue MEM_WT_Q or the MAC write queue MAC_WT_Q stored in the write queue entry is outputted from the write queue logic circuit 1220. As illustrated in FIG. 34, a first index INDEX_10 in the first write queue entry may include information on whether the first memory write queue MEM_WT_Q_0 stored in the first write queue entry is valid and information on an output sequence of the first memory write queue MEM_WT_Q_0. In addition, a second index INDEX_11 in the second write queue entry may include information on whether the first MAC write queue MAC_WT_Q_0 stored in the second write queue entry is valid and information on an output sequence of the first MAC write queue MAC_WT_Q_0. Similarly, a third index INDEX_12 in the third write queue entry may include information on whether the second memory write queue MEM_WT_Q_1 stored in the third write queue entry is valid and information on an output sequence of the second memory write queue MEM_WT_Q_1. In an embodiment, the index in each write queue entry may be set at a point in time when the memory write queue MEM_WT_Q or the MAC write queue MAC_WT_Q is stored.

The flag in each write queue entry may include information on whether the queue stored in the write queue entry is the memory write queue MEM_WT_Q or the MAC write queue MAC_WT_Q. In an embodiment, the flag may have a first binary number or a second binary number. In an embodiment, the first binary number may be "0", and the second binary number may be "1". In an embodiment, the flag of the write queue entry storing the memory write queue MEM_WT_Q may be set as the first binary number of "0", and the flag of the write queue entry storing the MAC write queue MAC_WT_Q may be set as the second binary number of "1". As illustrated in FIG. 34, a first flag FLAG_10 in the first write queue entry storing the first memory write queue MEM_WT_Q_0 may be set as the first binary number of "0", and a third flag FLAG_12 in the third write queue entry storing the second memory write queue MEM_WT_Q_1 may also be set as the first binary number of "0". In contrast, a second flag FLAG_11 in the second write queue entry storing the first MAC write queue MAC_WT_Q_0 may be set as the second binary number of "1". In an embodiment, the flag in each write queue entry may be set at a point in time when the memory write queue MEM_WT_Q or the MAC write queue MAC_WT_Q is stored.

Figure 35:
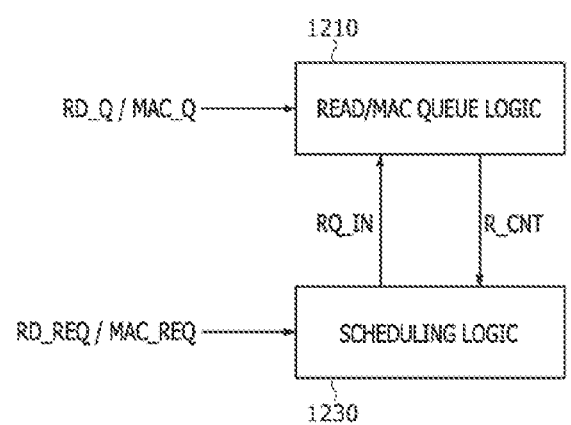
FIG. 35 illustrates an operation for storing a read queue or a MAC queue in a read/MAC queue logic circuit included in the PIM system illustrated in FIG. 32.

FIG. 35 illustrates an operation for storing the read queue RD_Q or the MAC queue MAC_Q in the read/MAC queue logic circuit 1210 included in the PIM system 1200 illustrated in FIG. 32. Referring to FIG. 35, when a read request RD_REQ or a MAC request MAC_REQ is transmitted from the host to the scheduling logic circuit 1230, the scheduling logic circuit 1230 may transmit a first queue input control signal RQ_IN to the read/MAC queue logic circuit 1210. The read/MAC queue logic circuit 1210 may store the read queue RD_Q or the MAC queue MAC_Q outputted from the host in response to the first queue input control signal RQ_IN. In addition, the read/MAC queue logic circuit 1210 may count and increase the number of the read queues RD_Q and the MAC queues MAC_Q stored in the read/MAC queue logic circuit 1210 by one, thereby generating and transmitting a first queue counted value R_CNT corresponding to the increased number of the read queues RD_Q and the MAC queues MAC_Q to the scheduling logic circuit 1230. As described with reference to FIG. 33, the read/MAC queue logic circuit 1210 may store the read queue RD_Q or the MAC queue MAC_Q in the read/MAC queue entry of the read/MAC queue storage region 1211 and may set the values of the index and the flag in the read/MAC queue entry in which the read queue RD_Q or the MAC queue MAC_Q is stored.

Figure 36:
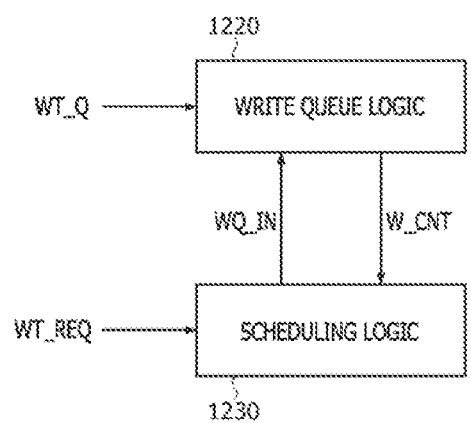
FIG. 36 illustrates an operation for storing a write queue in a write queue logic circuit included in the PIM system illustrated in FIG. 32.

FIG. 36 illustrates an operation for storing the write queue WT_Q in the write queue logic circuit 1220 included in the PIM system 1000 illustrated in FIG. 32. The write queue WT_Q may be the memory write queue MEM_WT_Q or the MAC write queue MAC_WT_Q. Referring to FIG. 36, when a write request WT_REQ is transmitted from the host to the scheduling logic circuit 1230, the scheduling logic circuit 1230 may transmit a second queue input control signal WQ_IN to the write queue logic circuit 1220. The write queue logic circuit 1220 may store the write queue WT_Q outputted from the host in response to the second queue input control signal WQ_IN. In addition, the write queue logic circuit 1220 may count and increase the number of the write queues WT_Q stored in the write queue logic circuit 1220 by one, thereby generating and transmitting a second queue counted value W_CNT corresponding to the increased number of the write queues WT_Q to the scheduling logic circuit 1230. As described with reference to FIG. 34, the write queue logic circuit 1220 may store the write queue WT_Q in the write queue entry of the write queue storage region 1221 and may set the values of the index and the flag in the write queue entry in which the write queue WT_Q is stored.

Figure 37:
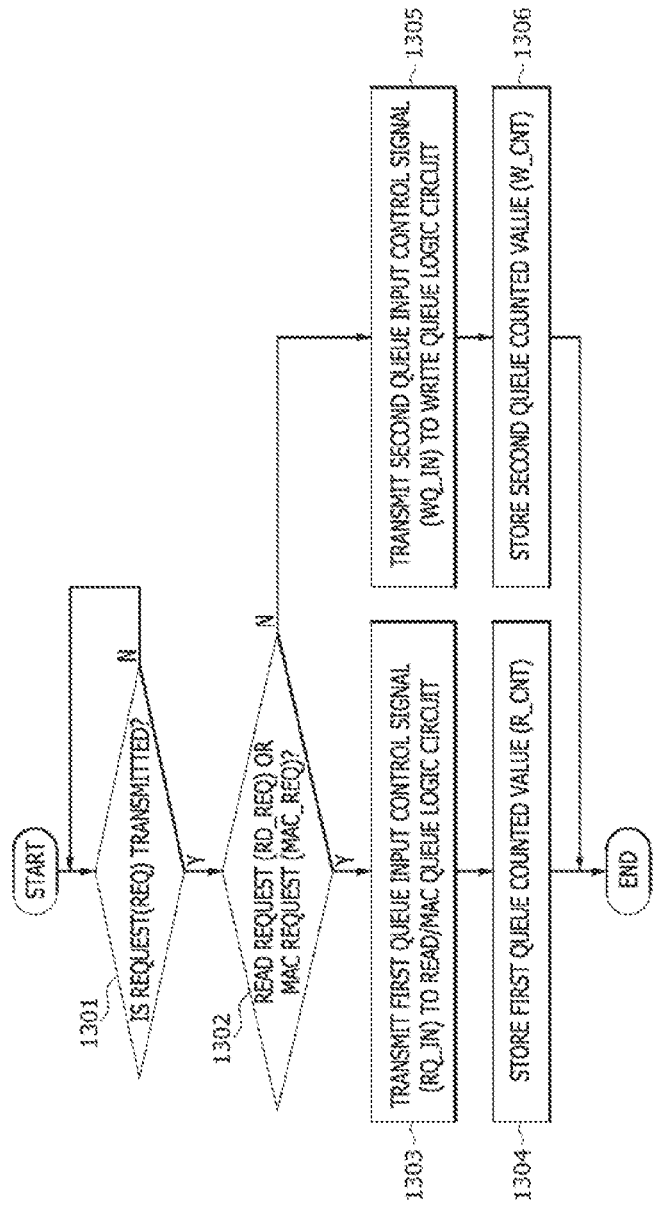
FIG. 37 is a flowchart illustrating an example of a queue storage operation performed by a scheduling logic circuit of a PIM controller included in the PIM system illustrated in FIG. 32.

FIG. 37 is a flowchart illustrating an example of a queue storage operation performed by the scheduling logic circuit 1230 of the PIM controller 1200 included in the PIM system 1000 illustrated in FIG. 32. Referring to FIG. 37, the scheduling logic circuit 1230 of the PIM controller 1200 may determine whether a request REQ is transmitted from the host to the scheduling logic circuit 1230 (see step 1301). If the request REQ is transmitted from the host to the scheduling logic circuit 1230, a step 1302 may be executed. If the request REQ is not transmitted from the host to the scheduling logic circuit 1230, the scheduling logic circuit 1230 may maintain a standby status. When the request REQ is transmitted from the host to the scheduling logic circuit 1230, the scheduling logic circuit 1230 may determine whether the request REQ is the read request RD_REQ, the MAC request MAC_REQ, or the write request WT_REQ at the step 1302. When the request REQ is determined to be the read request RD_REQ or the MAC request MAC_REQ, the scheduling logic circuit 1230 may transmit the first queue input control signal RQ_IN to the read/MAC queue logic circuit 1210 (see step 1303). As described with reference to FIG. 35, the read/MAC queue logic circuit 1210 may count the total number of the read queues RD_Q and the MAC queues MAC_Q stored in the read/MAC queue logic circuit 1210 after storing the read queues RD_Q or the MAC queues MAC_Q in the read/MAC queue storage region 1211 and may add one to the total number of the read queues RD_Q and the MAC queues MAC_Q to generate and transmit the first queue counted value R_CNT to the scheduling logic circuit 1230. At a step 1304, the scheduling logic circuit 1230 may store the first queue counted value R_CNT. When the request REQ is the write request WT_REQ at the step 1302, the scheduling logic circuit 1230 may transmit the second queue input control signal WQ_IN to the write queue logic circuit 1220 (see step 1305). As described with reference to FIG. 36, the write queue logic circuit 1220 may count the total number of the write queues WT_Q stored in the write queue logic circuit 1220 after storing the write queues WT_Q in the write queue storage region 1221 and may add one to the total number of the write queues WT_Q to generate and transmit the second queue counted value W_CNT to the scheduling logic circuit 1230. At a step 1306, the scheduling logic circuit 1230 may store the second queue counted value W_CNT.

Figure 38:
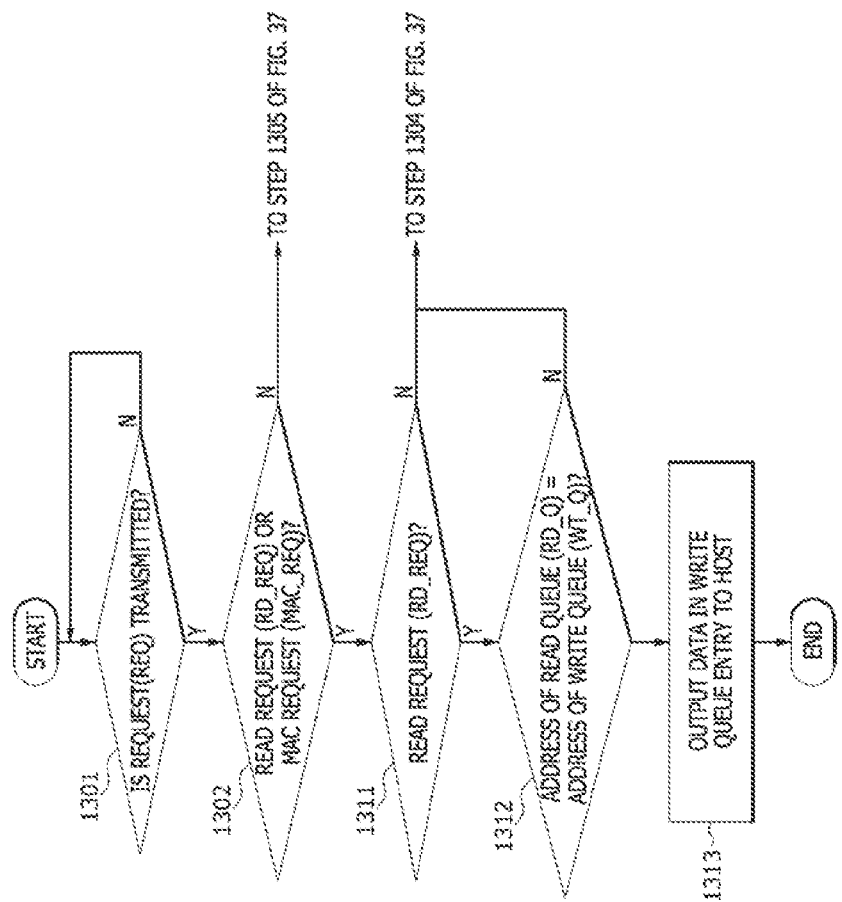
FIG. 38 is a flowchart illustrating another example of a queue storage operation performed by a scheduling logic circuit of a PIM controller included in the PIM system illustrated in FIG. 32.

FIG. 38 is a flowchart illustrating another example of the queue storage operation performed by the scheduling logic circuit 1230 of the PIM controller 1200 included in the PIM system 1000 illustrated in FIG. 32. Referring to FIG. 38, the scheduling logic circuit 1230 of the PIM controller 1200 may determine whether a request REQ is transmitted from the host to the scheduling logic circuit 1230 at the step 1301. If the request REQ is transmitted from the host to the scheduling logic circuit 1230, the step 1302 may be executed. If the request REQ is not transmitted from the host to the scheduling logic circuit 1230, the scheduling logic circuit 1230 may maintain a standby status. When the request REQ is transmitted from the host to the scheduling logic circuit 1230, the scheduling logic circuit 1230 may determine whether the request REQ is one of the read request RD_REQ and the MAC request MAC_REQ, or is the write request WT_REQ at the step 1302. When the request REQ is not one of the read request RD_REQ and the MAC request MAC_REQ (i.e., the request REQ is instead the write request WT_REQ), the step 1305 of FIG. 37 may be executed. When the request REQ is determined to be the read request RD_REQ or the MAC request MAC_REQ at the step 1302, whether the request REQ is the read request RD_REQ may be determined at a step 1311. When the request REQ is not determined to be the read request RD_REQ at the 1311 (i.e., the request REQ is the MAC request MAC_REQ), the step 1304 of FIG. 37 may be executed. When the request REQ is determined to be the read request RD_REQ at the step 1311, the scheduling logic circuit 1230 may determine whether the address of the read queue RD_Q is the same as the address of the write queue WT_Q stored in the write queue logic circuit 1220 (see step 1312). When the address of the read queue RD_Q is different from the address of the write queue WT_Q at the step 1312, the step 1304 of FIG. 37 may be executed. If the address of the read queue RD_Q is the same as the address of the write queue WT_Q at the step 1312, it means a case in which data to be read out by the host are stored in the write queue logic circuit 1220. Accordingly, the data in the write queue entry (in the write queue logic circuit 1220) having the same address as the read queue RD_Q may be outputted to the host (see step 1313). In such a case, a process for storing the read queue RD_Q in the read/MAC queue logic circuit 1210 will be omitted because the operation for the read queue RD_Q has been already performed.

Figure 39:
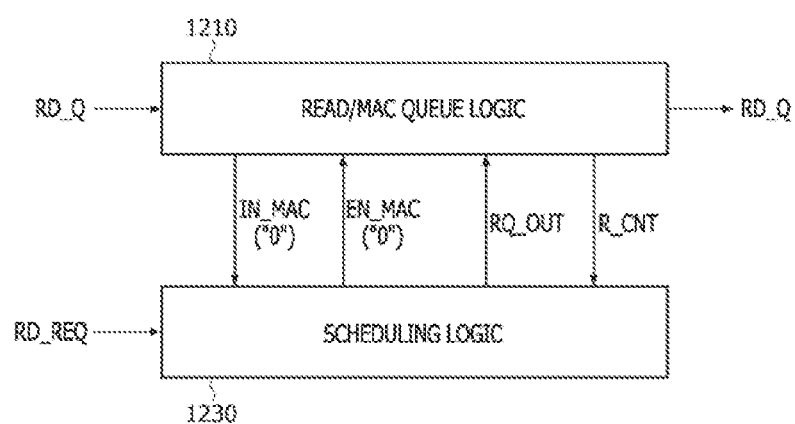
FIGS. 39 and 40 illustrate operations for outputting a read queue and a MAC queue from a read/MAC queue logic circuit included in the PIM system illustrated in FIG. 32.
Figure 40:
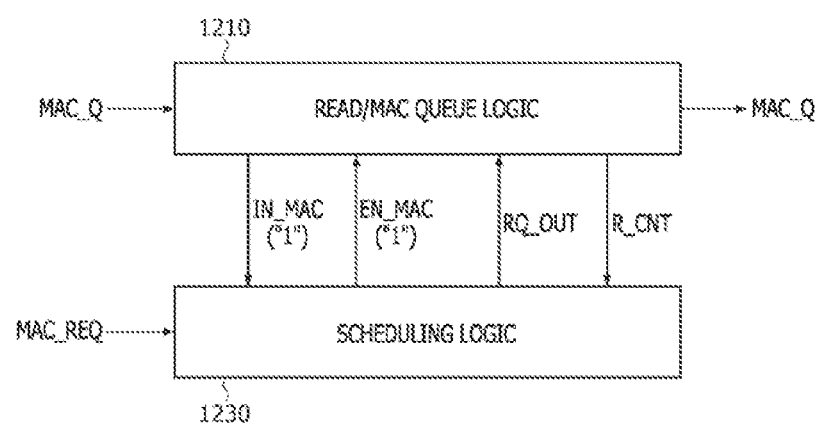

FIGS. 39 and 40 illustrate operations for outputting the read queue RD_Q and the MAC queue MAC_Q from the read/MAC queue logic circuit 1210 included in the PIM system 1000 illustrated in FIG. 32. Referring to FIG. 39, if the read request RD_REQ is transmitted from the host to the scheduling logic circuit 1230, the read queue RD_Q may be stored in the read/MAC queue logic circuit 1210. When the MAC queue MAC_Q is absent from the read/MAC queue logic circuit 1210, the read/MAC queue logic circuit 1210 may transmit the MAC mode signal IN_MAC having the second level (i.e., a logic "low(0)" level) to the scheduling logic circuit 1230. The scheduling logic circuit 1230 may transmit the MAC mode enablement signal EN_MAC having the second level (i.e., a logic "low(0)" level) to the read/MAC queue logic circuit 1210 in response to the MAC mode signal IN_MAC having the second level (i.e., a logic "low(0)" level). In addition, the scheduling logic circuit 1230 may transmit a first queue output control signal RQ_OUT to the read/MAC queue logic circuit 1210. The read/MAC queue logic circuit 1210 may output the read queue RD_Q in response to the first queue output control signal RQ_OUT. If the read queue RD_Q is outputted from the read/MAC queue logic circuit 1210, the read/MAC queue logic circuit 1210 may decrease the first queue counted value R_CNT by one and may transmit the decreased value of the first queue counted value R_CNT to the scheduling logic circuit 1230.

Referring to FIG. 40, if the MAC request MAC_REQ is transmitted from the host to the scheduling logic circuit 1230, the MAC queue MAC_Q may be stored in the read/MAC queue logic circuit 1210. The read/MAC queue logic circuit 1210 may transmit the MAC mode signal IN_MAC having the first level (i.e., a logic "high(1)" level) to the scheduling logic circuit 1230 because the MAC queue MAC_Q exists in the read/MAC queue logic circuit 1210. The scheduling logic circuit 1230 may transmit the MAC mode enablement signal EN_MAC having the first level (i.e., a logic "high(1)" level) to the read/MAC queue logic circuit 1210 in response to the MAC mode signal IN_MAC having the first level (i.e., a logic "high(1)" level). In addition, the scheduling logic circuit 1230 may transmit the first queue output control signal RQ_OUT to the read/MAC queue logic circuit 1210. The read/MAC queue logic circuit 1210 may output the MAC queue MAC_Q in response to the first queue output control signal RQ_OUT. That is, if the MAC mode enablement signal EN_MAC having the first level (i.e., a logic "high(1)" level) is transmitted from the scheduling logic circuit 1230 to the read/MAC queue logic circuit 1210, the read/MAC queue logic circuit 1210 may output the MAC queue MAC_Q prior to the read queue RD_Q. If the MAC queue MAC_Q is outputted from the read/MAC queue logic circuit 1210, the read/MAC queue logic circuit 1210 may decrease the first queue counted value R_CNT by one and may transmit the decreased value of the first queue counted value R_CNT to the scheduling logic circuit 1230.

Figure 41:
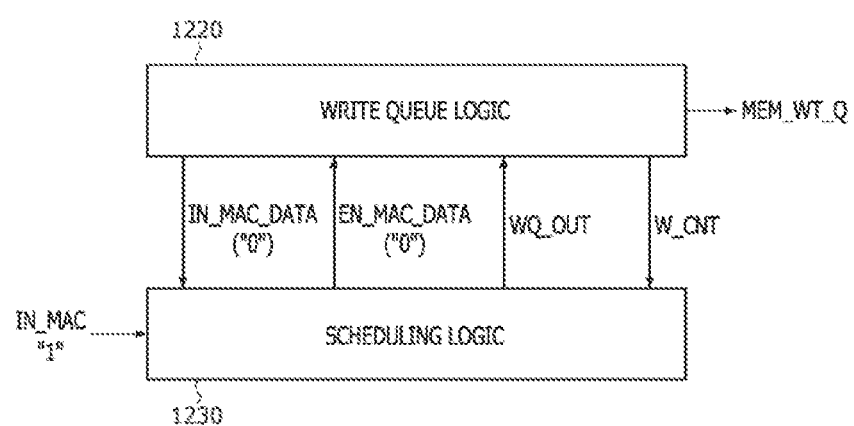
FIGS. 41 to 43 illustrate operations for outputting a memory write queue and a MAC write queue from a write queue logic circuit included in the PIM system illustrated in FIG. 32.
Figure 42:
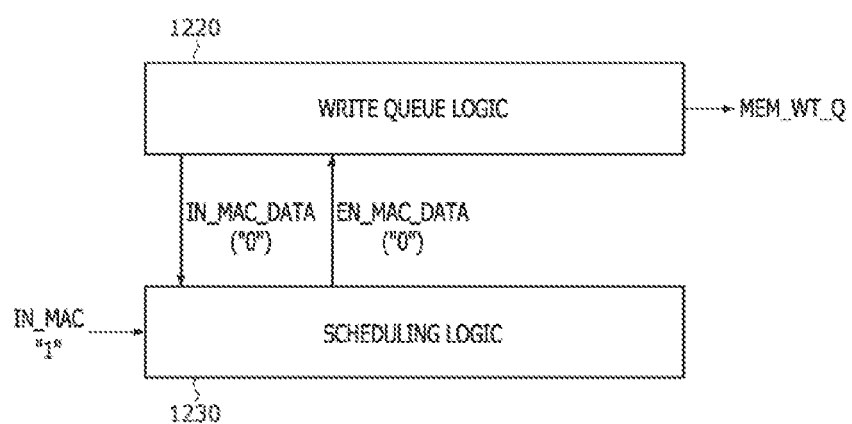
Figure 43:
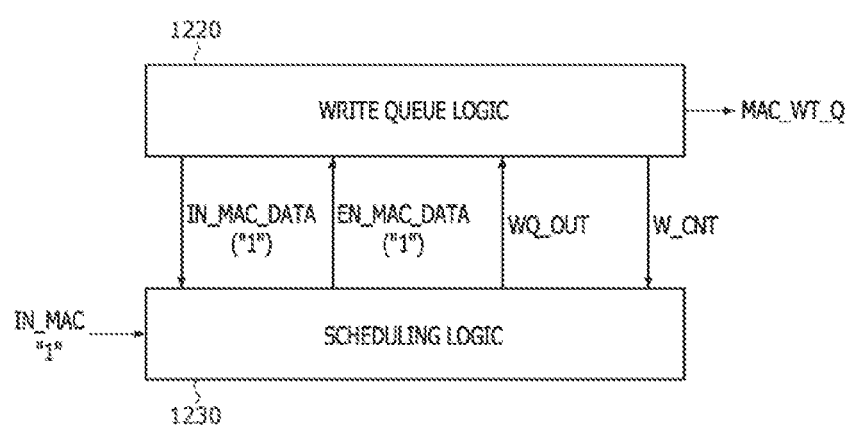

FIGS. 41 to 43 illustrate operations for outputting the memory write queue MEM_WT_Q and the MAC write queue MAC_WT_Q from the write queue logic circuit 1220 included in the PIM system 1000 illustrated in FIG. 32. Referring to FIG. 41, the write queue logic circuit 1220 may generate and transmit the MAC write signal IN_MAC_DATA having the first level (i.e., a logic "high(1)" level) or the second level (i.e., a logic "low(0)" level) to the scheduling logic circuit 1230. In the event that the MAC write queue MAC_WT_Q exists in the write queue logic circuit 1220, the write queue logic circuit 1220 may generate the MAC write signal IN_MAC_DATA having the first level (i.e., a logic "high(1)" level). In contrast, when the MAC write queue MAC_WT_Q is absent from the write queue logic circuit 1220, the write queue logic circuit 1220 may generate the MAC write signal IN_MAC_DATA having the second level (i.e., a logic "low(0)" level). The scheduling logic circuit 1230 may generate and transmit the MAC write enablement signal EN_MAC_DATA having the second level (i.e., a logic "low(0)" level) to the write queue logic circuit 1220 when the MAC mode signal IN_MAC having the first level (i.e., a logic "high(1)" level) is transmitted from the read/MAC queue logic circuit 1210 to the scheduling logic circuit 1230 and the MAC write signal IN_MAC_DATA having the second level (i.e., a logic "low(0)" level) is transmitted from the write queue logic circuit 1220 to the scheduling logic circuit 1230. In addition, the scheduling logic circuit 1230 may transmit a second queue output control signal WQ_OUT to the write queue logic circuit 1220. The write queue logic circuit 1220 may output the memory write queue MEM_WT_Q having an output priority in response to the second queue output control signal WQ_OUT. If the memory write queue MEM_WT_Q is outputted from the write queue logic circuit 1220, the write queue logic circuit 1220 may decrease the second queue counted value W_CNT by one and may transmit the decreased value of the second queue counted value W_CNT to the scheduling logic circuit 1230.

Although not shown in FIG. 41, if the read queue RD_Q exists in the read/MAC queue logic circuit 1210 when the MAC mode signal IN_MAC having the second level (i.e., a logic "low(0)" level) is transmitted from the read/MAC queue logic circuit 1210 to scheduling logic circuit 1230 and the MAC write signal IN_MAC_DATA having the second level (i.e., a logic "low(0)" level) is transmitted from the write queue logic circuit 1220 to the scheduling logic circuit 1230, the scheduling logic circuit 1230 may interrupt the generation of the second queue output control signal WQ_OUT to output the read queue RD_Q firstly. However, if a rate of the memory write queue MEM_WT_Q stored in the write queue logic circuit 1220 is over a certain rate even though the read queue RD_Q exists in the read/MAC queue logic circuit 1210, the scheduling logic circuit 1230 may control the write queue logic circuit 1220 such that the memory write queue MEM_WT_Q is outputted prior to the read queue RD_Q in order to provide sufficient storage space to store the memory write queue MEM_WT_Q or the MAC write queue MAC_WT_Q in the write queue logic circuit 1220. That is, in such a case, the scheduling logic circuit 1230 may generate and transmit the second queue output control signal WQ_OUT to the write queue logic circuit 1220, as illustrated in FIG. 41.

Next, referring to FIG. 42, when the MAC mode signal IN_MAC having the first level (i.e., a logic "high(1)" level) is transmitted from the read/MAC queue logic circuit 1210 to the scheduling logic circuit 1230 and the MAC write signal IN_MAC_DATA having the second level (i.e., a logic "low(0)" level) is transmitted from the write queue logic circuit 1220 to the scheduling logic circuit 1230, the scheduling logic circuit 1230 may generate and transmit the MAC write enablement signal EN_MAC_DATA having the second level (i.e., a logic "low(0)" level) to the write queue logic circuit 1220. As the MAC mode signal IN_MAC having the first level (i.e., a logic "high(1)" level) is transmitted from the read/MAC queue logic circuit 1210 to the scheduling logic circuit 1230, the scheduling logic circuit 1230 may regard the MAC queue MAC_Q as existing in the read/MAC queue logic circuit 1210. In addition, as the MAC write signal IN_MAC_DATA having the second level (i.e., a logic "low(0)" level) is transmitted from the write queue logic circuit 1220 to the scheduling logic circuit 1230, the scheduling logic circuit 1230 may regard the MAC write queue MAC_WT_Q as being absent from the write queue logic circuit 1220. In such a case, the scheduling logic circuit 1230 may control the read/MAC queue logic circuit 1210 such that the MAC queue MAC_Q is outputted firstly. For the above operation of the scheduling logic circuit 1230, the scheduling logic circuit 1230 may generate and transmit the MAC write enablement signal EN_MAC_DATA having the second level (i.e., a logic "low(0)" level) to the write queue logic circuit 1220. Moreover, the scheduling logic circuit 1230 may stop the generation of the second queue output control signal WQ_OUT. Because the scheduling logic circuit 1230 stops the generation of the second queue output control signal WQ_OUT, the write queue logic circuit 1220 does not output the write queue WT_Q.

Next, referring to FIG. 43, when the MAC mode signal IN_MAC having the first level (i.e., a logic "high(1)" level) is transmitted from the read/MAC queue logic circuit 1210 to the scheduling logic circuit 1230 and the MAC write signal IN_MAC_DATA having the first level (i.e., a logic "high(1)" level) is transmitted from the write queue logic circuit 1220 to the scheduling logic circuit 1230, the scheduling logic circuit 1230 may generate and transmit the MAC write enablement signal EN_MAC_DATA having the first level (i.e., a logic "high(1)" level) to the write queue logic circuit 1220. As the MAC mode signal IN_MAC having the first level (i.e., a logic "high(1)" level) is transmitted from the read/MAC queue logic circuit 1210 to the scheduling logic circuit 1230, the scheduling logic circuit 1230 may regard the MAC queue MAC_Q as existing in the read/MAC queue logic circuit 1210. In addition, as the MAC write signal IN_MAC_DATA having the first level (i.e., a logic "high(1)" level) is transmitted from the write queue logic circuit 1220 to the scheduling logic circuit 1230, the scheduling logic circuit 1230 may regard the MAC write queue MAC_WT_Q as existing in the write queue logic circuit 1220. In such a case, the scheduling logic circuit 1230 may control the write queue logic circuit 1220 such that the MAC write queue MAC_WT_Q in the write queue logic circuit 1220 is outputted before the MAC queue MAC_Q is outputted from the read/MAC queue logic circuit 1210. For the above operation of the scheduling logic circuit 1230, the scheduling logic circuit 1230 may generate and transmit the MAC write enablement signal EN_MAC_DATA having the first level (i.e., a logic "high(1)" level) to the write queue logic circuit 1220. Moreover, the scheduling logic circuit 1230 may generate the second queue output control signal WQ_OUT prior to the first queue output control signal RQ_OUT to output the second queue output control signal WQ_OUT to the write queue logic circuit 1220. The write queue logic circuit 1220 may output the MAC write queue MAC_WT_Q in response to the second queue output control signal WQ_OUT. After the MAC write queue MAC_WT_Q is outputted from the write queue logic circuit 1220, the write queue logic circuit 1220 may decrease the second queue counted value W_CNT by one and may transmit the decreased value of the second queue counted value W_CNT to the scheduling logic circuit 1230.

As described above, the PIM controller 1200 of the PIM system 1000 according to the present embodiment may perform the scheduling operation adjusting an output sequence of the read queue RD_Q, the MAC queue MAC_Q, the memory write queue MEM_WT_Q, and the MAC write queue MAC_WT_Q. This scheduling operation may be performed by the scheduling logic circuit 1230 included in the PIM controller 1200. The scheduling operation may basically output the read queue RD_Q prior to the write queue WT_Q. However, in the event that the number of the write queues WT_Q is over a certain value to cause a lack of space for storing the write queues WT_Q while the read queues RD_Q are outputted, the scheduling operation may be performed to temporarily output the write queue WT_Q prior to the read queue RD_Q. The scheduling logic circuit 1230 may allow an output priority of the MAC queue MAC_Q such that the MAC queue MAC_Q is outputted prior to the read queue RD_Q. The PIM device 1100 may be controlled to perform the MAC arithmetic operation when the MAC queue MAC_Q is outputted from the read/MAC queue logic circuit 1210. Thus, in the event that the MAC write queue MAC_WT_Q exists in the write queue logic circuit 1220 before the MAC queue MAC_Q is outputted from the read/MAC queue logic circuit 1210, the scheduling logic circuit 1230 may perform the scheduling operation such that the MAC queue MAC_Q is outputted after the MAC write queue MAC_WT_Q. This scheduling operation performed by the scheduling logic circuit 1230 will be described hereinafter in more detail with reference to FIGS. 44 to 46.

Figure 44:
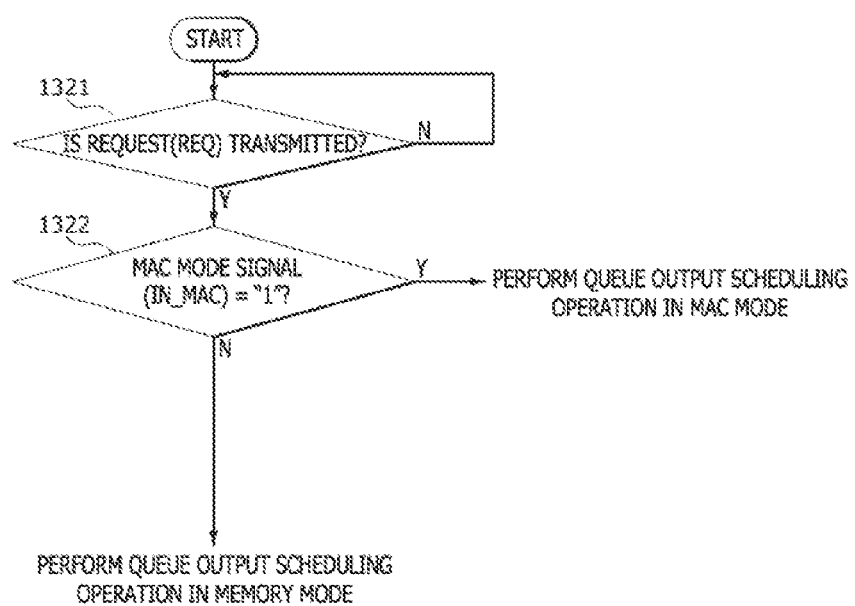
FIG. 44 is a flowchart illustrating a queue output scheduling operation performed by a scheduling logic circuit of a PIM controller included in the PIM system illustrated in FIG. 32.

FIG. 44 is a flowchart illustrating a queue output scheduling operation performed by the scheduling logic circuit 1230 of the PIM controller 1200 included in the PIM system 1000 illustrated in FIG. 32. Referring to FIG. 44, the scheduling logic circuit 1230 of the PIM controller 1200 may determine whether a request REQ is transmitted from the host to the scheduling logic circuit 1230 (see step 1321). If it is determined that a request REQ is transmitted from the host to the scheduling logic circuit 1230, a step 1322 may be executed. If the request REQ is not transmitted from the host to the scheduling logic circuit 1230, the scheduling logic circuit 1230 may maintain a standby status. When it is determined that the request REQ is transmitted from the host to the scheduling logic circuit 1230, the scheduling logic circuit 1230 may determine whether the MAC mode signal IN_MAC has a logic "high(1)" level or a logic "low(0)" level at the step 1322. As described with reference to FIG. 32, when the request REQ is transmitted from the host to the scheduling logic circuit 1230, the read/MAC queue logic circuit 1210 may transmit the MAC mode signal IN_MAC to the scheduling logic circuit 1230. At the step 1322, the scheduling logic circuit 1230 may determine whether the MAC mode signal IN_MAC has a logic "high(1)" level or a logic "low(0)" level. When the MAC mode signal IN_MAC has a logic "high(1)" level, it means a case in which the MAC queue MAC_Q exists in the read/MAC queue logic circuit 1210. In contrast, when a level of the MAC mode signal IN_MAC does not have a logic "high(1)" level (i.e., the MAC mode signal IN_MAC has a logic "low(0)" level), it means a case in which the MAC queue MAC_Q is absent from the read/MAC queue logic circuit 1210. When the MAC mode signal IN_MAC has a logic "high(1)" level at the step 1322, the scheduling logic circuit 1230 may perform the queue output scheduling operation in the MAC mode. When the MAC mode signal IN_MAC has a logic "low(0)" level at the step 1322, the scheduling logic circuit 1230 may perform the queue output scheduling operation in the memory mode.

Figure 45:
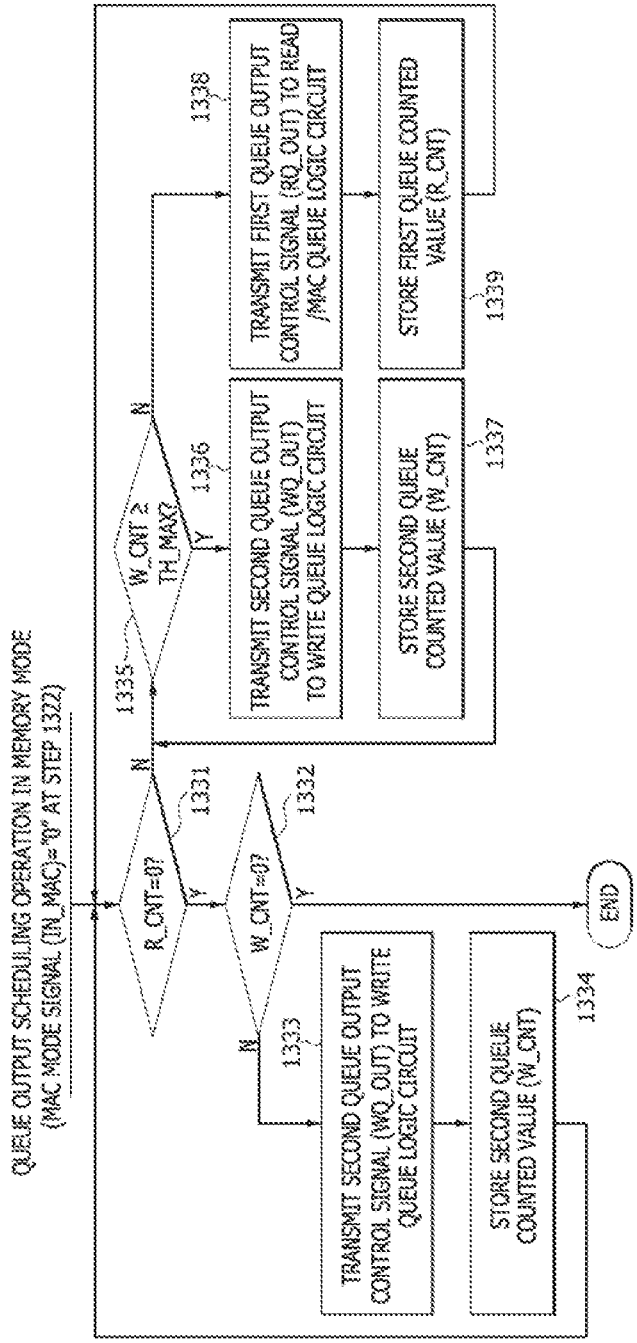
FIG. 45 is a flowchart illustrating a queue output scheduling operation performed in a memory mode by a scheduling logic circuit of a PIM controller included in the PIM system illustrated in FIG. 32.

FIG. 45 is a flowchart illustrating a queue output scheduling operation performed in the memory mode by the scheduling logic circuit 1230 of the PIM controller 1200 included in the PIM system 1000 illustrated in FIG. 32. As described with reference to FIG. 44, when the MAC mode signal IN_MAC has a logic "low(0)" level (i.e., the MAC queue MAC_Q is absent from the read/MAC queue logic circuit 1210) at the step 1322, the scheduling logic circuit 1230 may perform the queue output scheduling operation in the memory mode. Referring to FIG. 45, the scheduling logic circuit 1230 may determine whether the first queue counted value R_CNT is "0" (see step 1331). When the first queue counted value R_CNT is "0", it means that none of the read queues RD_Q and the MAC queues MAC_Q exist in the read/MAC queue logic circuit 1210. When the first queue counted value R_CNT is determined to be "0", whether the second counted value W_CNT is "0" may be determined at a step 1332. When the second counted value W_CNT is "0", it means that the write queue WT_Q is absent from the write queue logic circuit 1220. That is, when the first queue counted value R_CNT is determined to be "0" at the step 1331 and the second counted value W_CNT is determined to be "0" at the step 1332, the queue output scheduling operation may terminate because none of the read queues RD_Q and the write queues WT_Q to be outputted exist in the read/MAC queue logic circuit 1210 and the write queue logic circuit 1220. When the second counted value W_CNT is not "0" (i.e., the write queue WT_Q exists the write queue logic circuit 1220) at the step 1332, the scheduling logic circuit 1230 may transmit the second queue output control signal WQ_OUT to the write queue logic circuit 1220 (see step 1333). As described with reference to FIG. 41, the write queue logic circuit 1220 may output the write queue WT_Q having an output priority in response to the second queue output control signal WQ_OUT and may transmit a value obtained by subtracting one from the second queue counted value W_CNT to the scheduling logic circuit 1230. At a step 1334, the scheduling logic circuit 1230 may store the second queue counted value W_CNT outputted from the write queue logic circuit 1220. Subsequently, the process may be fed back to the step 1331 to determine whether the first queue counted value R_CNT is "0".

In the event that the first queue counted value R_CNT is not "0" (i.e., the read queue RD_Q exists in the read/MAC queue logic circuit 1210) at the step 1331, the scheduling logic circuit 1230 performs the queue output scheduling operation for outputting the read queue RD_Q. Ordinarily, the read request outputted from the host may have a priority over the write request outputted from the host. This is because the read data provided by the read request can be immediately used by the host, whereas a point in time when the data written by the write request are used is not determined clearly. Thus, while the read queues RD_Q are outputted, the write queues WT_Q may be accumulated in the write queue logic circuit 1220. In such a case, the number of the write queues WT_Q which is capable of being stored in the write queue storage region (1221 of FIGS. 31 and 32) may be limited because a storage capacity of the write queue storage region (1221 of FIGS. 31 and 32) in the write queue logic circuit 1220 is determined. Thus, when a portion corresponding to a certain rate of the maximum storage capacity of the write queue storage region (1221 of FIGS. 31 and 32) is filled with the write queues WT_Q, it may be necessary to prepare an empty storage space by preferentially outputting the write queues WT_Q stored in the write queue storage region (1221 of FIGS. 31 and 32) in order to additionally store the write queues WT_Q in the write queue storage region (1221 of FIGS. 31 and 32). Accordingly, it may be necessary to determine whether the second queue counted value W_CNT is less than a maximum threshold value TH_MAX (see step 1335). The maximum threshold value TH_MAX may be defined as the number of the write queues WT_Q that fill a portion corresponding to a certain rate of the maximum storage capacity of the write queue storage region (1221 of FIGS. 31 and 32). In an embodiment, the maximum threshold value TH_MAX may be set as the number of the write queues WT_Q which can be fully stored in the maximum storage capacity of the write queue storage region (1221 of FIGS. 31 and 32). In another embodiment, the maximum threshold value TH_MAX may be set as the number of the write queues WT_Q which can be stored in a portion corresponding to 80% of the maximum storage capacity of the write queue storage region (1221 of FIGS. 31 and 32).

When the second queue counted value W_CNT is determined to be equal to or greater than the maximum threshold value TH_MAX at the step 1335, the write queue WT_Q stored in the write queue logic circuit 1220 may be outputted to provide an additional empty storage space in which the write queue WT_Q is stored. That is, the scheduling logic circuit 1230 may transmit the second queue output control signal WQ_OUT to the write queue logic circuit 1220 (see step 1336). As described with reference to FIG. 41, the write queue logic circuit 1220 may output the write queue WT_Q having an output priority in response to the second queue output control signal WQ_OUT and may transmit a value obtained by subtracting one from the second queue counted value W_CNT to the scheduling logic circuit 1230. At a step 1337, the scheduling logic circuit 1230 may store the second queue counted value W_CNT outputted from the write queue logic circuit 1220. Subsequently, the process may be fed back to the step 1335 to determine whether the second queue counted value W_CNT is less than the maximum threshold value TH_MAX.

When the second queue counted value W_CNT is less than the maximum threshold value TH_MAX at the step 1335, the read queue RD_Q stored in the read/MAC queue logic circuit 1210 may be preferentially outputted because it is unnecessary to prepare an additional empty storage space in which the write queue WT_Q is stored. That is, the scheduling logic circuit 1230 may transmit the first queue output control signal RQ_OUT to the read/MAC queue logic circuit 1210 (see step 1338). As described with reference to FIG. 39, the read/MAC queue logic circuit 1210 may output the read queue RD_Q having an output priority in response to the first queue output control signal RQ_OUT and may transmit a value obtained by subtracting one from the first queue counted value R_CNT to the scheduling logic circuit 1230. At a step 1339, the scheduling logic circuit 1230 may store the first queue counted value R_CNT outputted from the read/MAC queue logic circuit 1210. Subsequently, the process may be fed back to the step 1331 to determine whether the first queue counted value R_CNT is "0".

Figure 46:
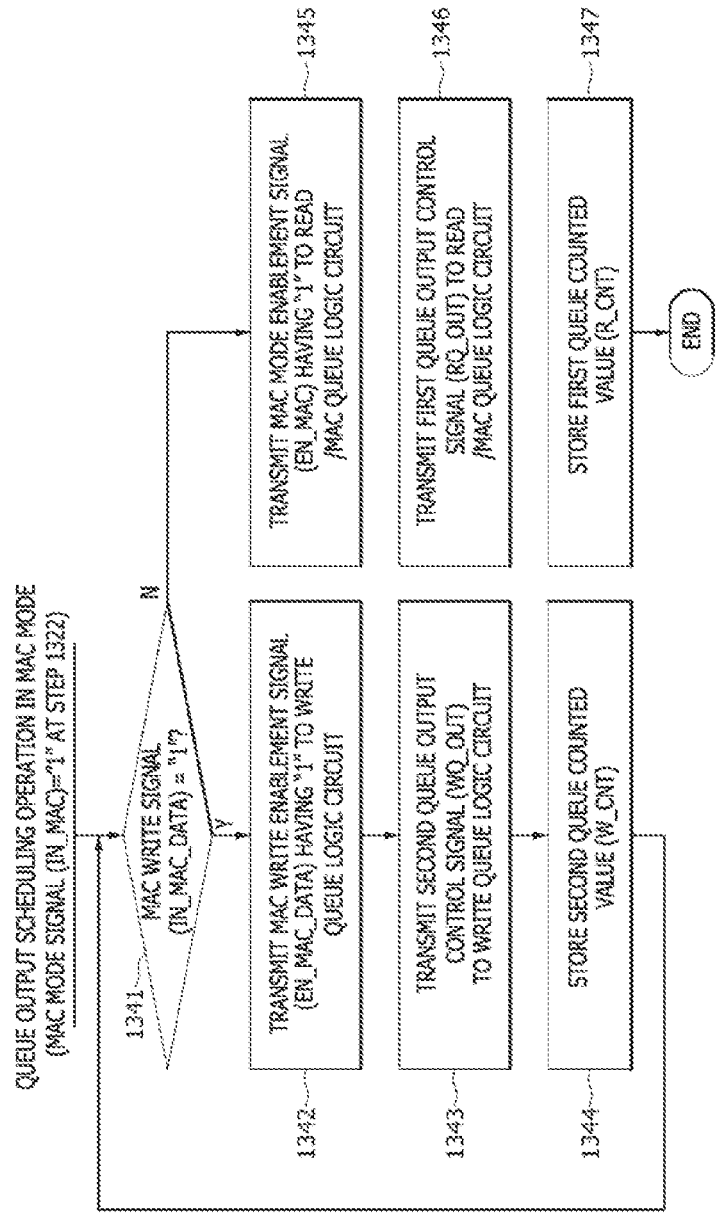
FIG. 46 is a flowchart illustrating a queue output scheduling operation performed in a MAC mode by a scheduling logic circuit of a PIM controller included in the PIM system illustrated in FIG. 32.

FIG. 46 is a flowchart illustrating a queue output scheduling operation performed in the MAC mode by the scheduling logic circuit 1230 of the PIM controller 1200 included in the PIM system 1000 illustrated in FIG. 32. As described with reference to FIG. 44, in the event that the MAC mode signal IN_MAC has a logic "high(1)" level (i.e., the MAC queue MAC_Q exists in the read/MAC queue logic circuit 1210) at the step 1322, the scheduling logic circuit 1230 may perform the queue output scheduling operation in the MAC mode. In the MAC mode, the scheduling logic circuit 1230 may control the read/MAC queue logic circuit 1210 such that the MAC queue MAC_Q stored in the read/MAC queue logic circuit 1210 is preferentially outputted. In such a case, when the MAC write queue MAC_WT_Q exists in the write queue logic circuit 1220, the MAC write queue MAC_WT_Q may be outputted prior to the MAC queue MAC_Q.

Referring to FIG. 46, the scheduling logic circuit 1230 may determine whether the MAC write signal IN_MAC_DATA has a logic "high(1)" level (see step 1341). As described with reference to FIG. 41, in the event that the MAC write queue MAC_WT_Q exists in the write queue logic circuit 1220, the write queue logic circuit 1220 may generate and transmit the MAC write signal IN_MAC_DATA having a logic "high(1)" level to the scheduling logic circuit 1230. When the MAC write signal IN_MAC_DATA is determined to have a logic "high(1)" level, the scheduling logic circuit 1230 may control the write queue logic circuit 1220 such that the MAC write queue MAC_WT_Q in the write queue logic circuit 1220 is preferentially outputted. For the above operation of the scheduling logic circuit 1230, the scheduling logic circuit 1230 may generate and transmit the MAC write enablement signal EN_MAC_DATA having the first level (i.e., a logic "high(1)" level) to the write queue logic circuit 1220 (see step 1342). Moreover, the scheduling logic circuit 1230 may generate and transmit the second queue output control signal WQ_OUT to the write queue logic circuit 1220 (see step 1343). As described with reference to FIG. 43, the write queue logic circuit 1220 receiving the MAC write enablement signal EN_MAC_DATA having a logic "high(1)" level and the second queue output control signal WQ_OUT may output the MAC write queue MAC_WT_Q and may transmit a value obtained by subtracting one from the second queue counted value W_CNT to the scheduling logic circuit 1230. At a step 1344, the scheduling logic circuit 1230 may store the second queue counted value W_CNT outputted from the write queue logic circuit 1220. After the step 1344 is executed, the process may be fed back to the step 1341. That is, the steps 1342, 1343, and 1344 may be iteratively executed until the MAC write signal IN_MAC_DATA is determined to have a logic "low(0)" level at the step 1341.

When the MAC write signal IN_MAC_DATA has a logic "low(0)" level at the step 1341, it means that the MAC write queue MAC_WT_Q is absent from the write queue logic circuit 1220. In such a case, the scheduling logic circuit 1230 may control the read/MAC queue logic circuit 1210 such that the MAC queue MAC_Q is outputted from the read/MAC queue logic circuit 1210. For the above operation of the scheduling logic circuit 1230, the scheduling logic circuit 1230 may transmit the MAC mode enablement signal EN_MAC having a logic "high(1)" level to the read/MAC queue logic circuit 1210 (see step 1345). Subsequently, at a step 1346, the scheduling logic circuit 1230 may transmit the first queue output control signal RQ_OUT to the read/MAC queue logic circuit 1210. As described with reference to FIG. 40, the read/MAC queue logic circuit 1210 receiving the MAC mode enablement signal EN_MAC having a logic "high(1)" level may output the MAC queue MAC_Q stored in the read/MAC queue storage region 1211. The read/MAC queue logic circuit 1210 receiving the first queue output control signal RQ_OUT may transmit a value obtained by subtracting one from the first queue counted value R_CNT to the scheduling logic circuit 1230. At a step 1347, the scheduling logic circuit 1230 may store the first queue counted value R_CNT outputted from the read/MAC queue logic circuit 1210.

Figure 47:
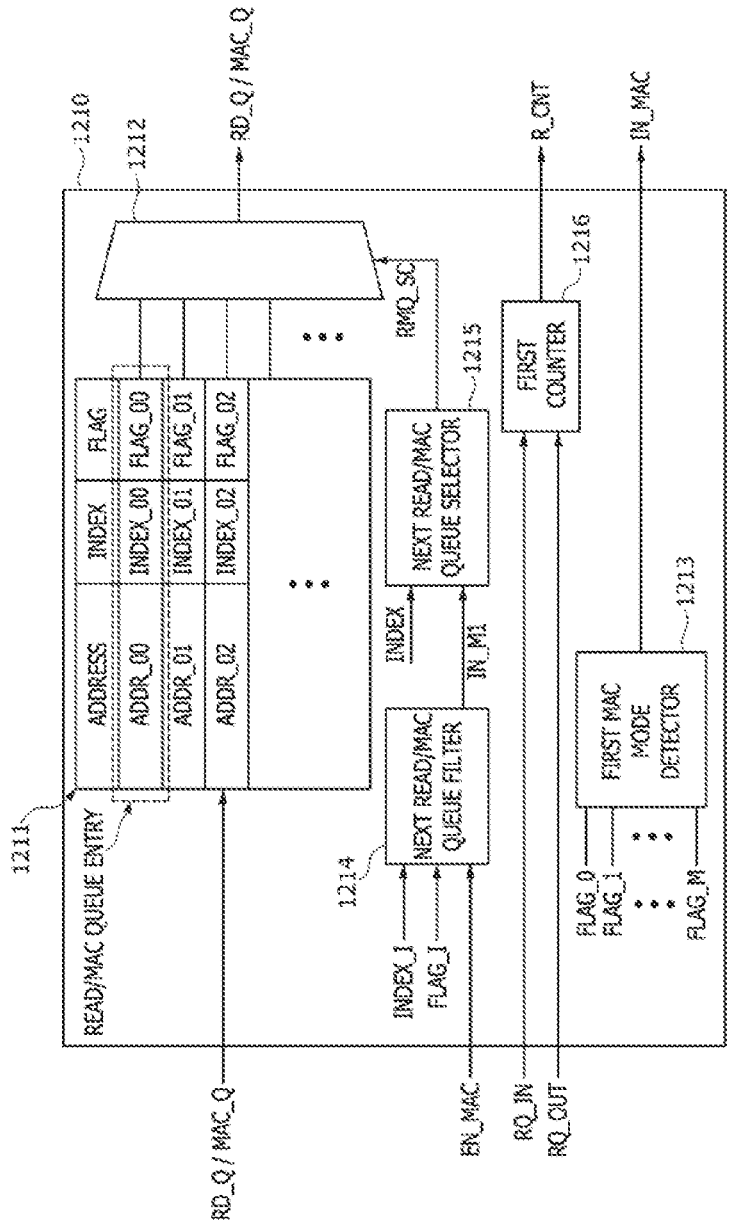
FIG. 47 is a block diagram illustrating a configuration of a read/MAC queue logic circuit included in the PIM system illustrated in FIG. 32.
Figure 48:
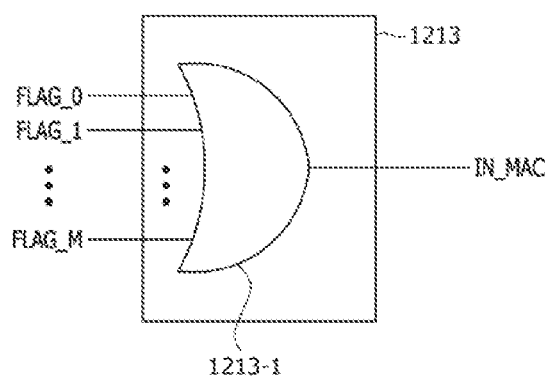
FIG. 48 is a logic symbol illustrating a first MAC mode detector included in the read/MAC queue logic circuit illustrated in FIG. 47.
Figure 49:
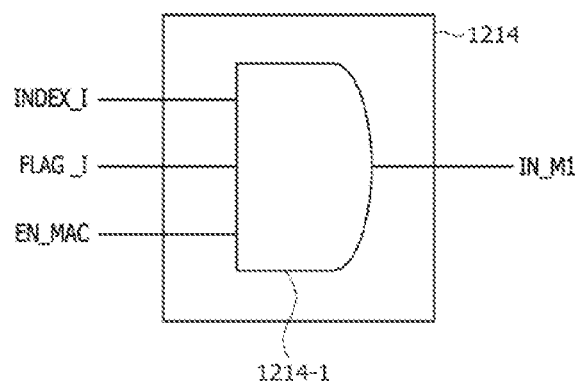
FIG. 49 is a logic symbol illustrating a next read/MAC queue filter included in the read/MAC queue logic circuit illustrated in FIG. 47.

FIG. 47 is a block diagram illustrating a configuration of the read/MAC queue logic circuit 1210 included in the PIM system 1000 illustrated in FIG. 32. FIGS. 48 and 49 are logic symbols illustrating a first MAC mode detector 1213 and a next read/MAC queue filter 1214 included in the read/MAC queue logic circuit 1210 illustrated in FIG. 47, respectively. Referring to FIG. 47, the read/MAC queue logic circuit 1210 may include the read/MAC queue storage region 1211, a read/MAC queue selection/output circuit 1212, the first MAC mode detector 1213, the next read/MAC queue filter 1214, a next read/MAC queue selector 1215, and a first counter 1216. Because the read/MAC queue storage region 1211 was previously described with reference to FIG. 33, the same description will be omitted here for brevity. In the following descriptions, it may be assumed that "N+1"-number of read queues RD_Q (i.e., first to (N+1)$^{th}$ read queues) or "N+1"-number of MAC queues MAC_Q (i.e., first to (N+1)$^{th}$ MAC queues) are stored in the read/MAC queue storage region 1211. The read/MAC queue selection/output circuit 1212 may receive the read queues RD_Q and the MAC queues MAC_Q from the read/MAC queue storage region 1211. The read/MAC queue selection/output circuit 1212 may output one read queue RD_Q or one MAC queue MAC_Q which is selected by a read/MAC queue selection control signal RMQ_SC outputted from the next read/MAC queue selector 1215. In an embodiment, the read/MAC queue selection/output circuit 1212 may be realized using a multiplexer having a plurality of input terminals receiving the read queues RD_Q or the MAC queues MAC_Q, a control input terminal receiving the read/MAC queue selection control signal RMQ_SC, and an output terminal. In such a case, the number of the plurality of input terminals of the multiplexer may be equal to or greater than the number of the read/MAC queue entries in the read/MAC queue storage region 1211.

The first MAC mode detector 1213 may receive flags FLAG_0, FLAG_1, ..., and FLAG_M of the respective read/MAC queue entries in the read/MAC queue storage region 1211 to output the MAC mode signal IN_MAC. As illustrated in FIG. 48, the first MAC mode detector 1213 may include an OR gate 1213-1 performing a logical OR operation of the flags FLAG_0, FLAG_1, ..., and FLAG_M of the respective read/MAC queue entries. When at least one of the flags FLAG_0, FLAG_1, ..., and FLAG_M of the respective read/MAC queue entries has a logic "high(1)" level, it means that the MAC queue MAC_Q is stored in at least one of the read/MAC queue entries. Thus, in such a case, the OR gate 1213-1 may output the MAC mode signal IN_MAC having a logic "high(1)" level which indicates the MAC mode. In contrast, when all of the flags FLAG_0, FLAG_1, ..., and FLAG_M of the respective read/MAC queue entries have a logic "low(0)" level, it means that the read queues RD_Q are stored in the respective read/MAC queue entries and the MAC queue MAC_Q is absent from each of the read/MAC queue entries. Thus, in such a case, the OR gate 1213-1 may output the MAC mode signal IN_MAC having a logic "low(0)" level which indicates the memory mode. The MAC mode signal IN_MAC outputted from the OR gate 1213-1 (i.e., the first MAC mode detector 1213) may be transmitted to the scheduling logic circuit (1230 of FIGS. 31 and 32).

The next read/MAC queue filter 1214 may receive an index INDEX_I (i.e., an I$^{th}$ index) and a flag FLAG_I (i.e., an I$^{th}$ flag) of the I$^{th}$ read/MAC queue entry and the MAC mode enablement signal EN_MAC to output a first MAC index signal IN_M1 (where, "I" is one of natural numbers 1, 2, ..., M, and (M+1)). As illustrated in FIG. 49, the next read/MAC queue filter 1214 may include an AND gate 1214-1 performing a logical AND operation of the I$^{th}$ index INDEX_I, the I$^{th}$ flag FLAG_I, and the MAC mode enablement signal EN_MAC. When the MAC mode enablement signal EN_MAC has a logic "high(1)" level and the I$^{th}$ flag FLAG_I has a logic "high(1)" level, the AND gate 1214-1 may output the I$^{th}$ index INDEX_I as the first MAC index signal IN_M1. The MAC mode enablement signal EN_MAC may be transmitted from the scheduling logic circuit (1230 of FIGS. 31 and 32) to the next read/MAC queue filter 1214. The MAC mode enablement signal EN_MAC may have a logic "high(1)" level in the MAC mode and may have a logic "low(0)" level in the memory mode. Thus, when the MAC mode enablement signal EN_MAC has a logic "high(1)" level and the I$^{th}$ flag FLAG_I has a logic "high(1)" level, the I$^{th}$ index INDEX_I corresponding to the first MAC index signal IN_M1 outputted from the AND gate 1214-1 may mean an index of the read/MAC queue entry in which the MAC queue MAC_Q is stored. In contrast, when the MAC mode enablement signal EN_MAC has a logic "low(0)" level, the first MAC index signal IN_M1 may have a logic "low(0)" level regardless of a logic level of the I$^{th}$ flag FLAG_I. The first MAC index signal IN_M1 outputted from the next read/MAC queue filter 1214 (i.e., the AND gate 1214-1) may be transmitted to the next read/MAC queue selector 1215.

The next read/MAC queue selector 1215 may receive the first MAC index signal IN_M1 (outputted from the next read/MAC queue filter 1214) and the indexes INDEXes (outputted from the read/MAC queue storage region 1211). When the first MAC index signal IN_M1 corresponding to the index of the read/MAC queue entry storing the MAC queue MAC_Q is transmitted from the next read/MAC queue filter 1214 to the next read/MAC queue selector 1215, the next read/MAC queue selector 1215 may transmit the read/MAC queue selection control signal RMQ_SC for outputting the MAC queue MAC_Q stored in the read/MAC queue entry having the index designated by the first MAC index signal IN_M1 to the read/MAC queue selection/output circuit 1212. In contrast, when the first MAC index signal IN_M1 having a logic "low(0)" level is transmitted from the next read/MAC queue filter 1214 to the next read/MAC queue selector 1215, the next read/MAC queue selector 1215 may transmit the read/MAC queue selection control signal RMQ_SC for outputting the read queue RD_Q stored in the read/MAC queue entry including an index having a high priority among the indexes INDEXes to the read/MAC queue selection/output circuit 1212.

The first counter 1216 may count the total number of the read queues RD_Q and the MAC queues MAC_Q stored in the read/MAC queue storage region 1211. In order that the first counter 1216 counts the total number of the read queues RD_Q and the MAC queues MAC_Q, the first counter 1216 may receive the first queue input control signal RQ_IN and the first queue output control signal RQ_OUT from the scheduling logic circuit (1230 of FIGS. 31 and 32). In the event that the read queue RD_Q or the MAC queue MAC_Q is stored in the read/MAC queue storage region 1211 (i.e., the first queue input control signal RQ_IN is transmitted from the scheduling logic circuit 1230 to the first counter 1216), the first counter 1216 may count the total number of the read queues RD_Q and the MAC queues MAC_Q and may increase the counted value by one to output the increased value of the counted value as the first queue counted value R_CNT. In the event that the read queue RD_Q or the MAC queue MAC_Q is outputted from the read/MAC queue storage region 1211 (i.e., the first queue output control signal RQ_OUT is transmitted from the scheduling logic circuit 1230 to the first counter 1216), the first counter 1216 may decrease the counted value by one to output the decreased value of the counted value as the first queue counted value R_CNT. The first queue counted value R_CNT outputted from the first counter 1216 may be transmitted to the scheduling logic circuit 1230.

Figure 50:
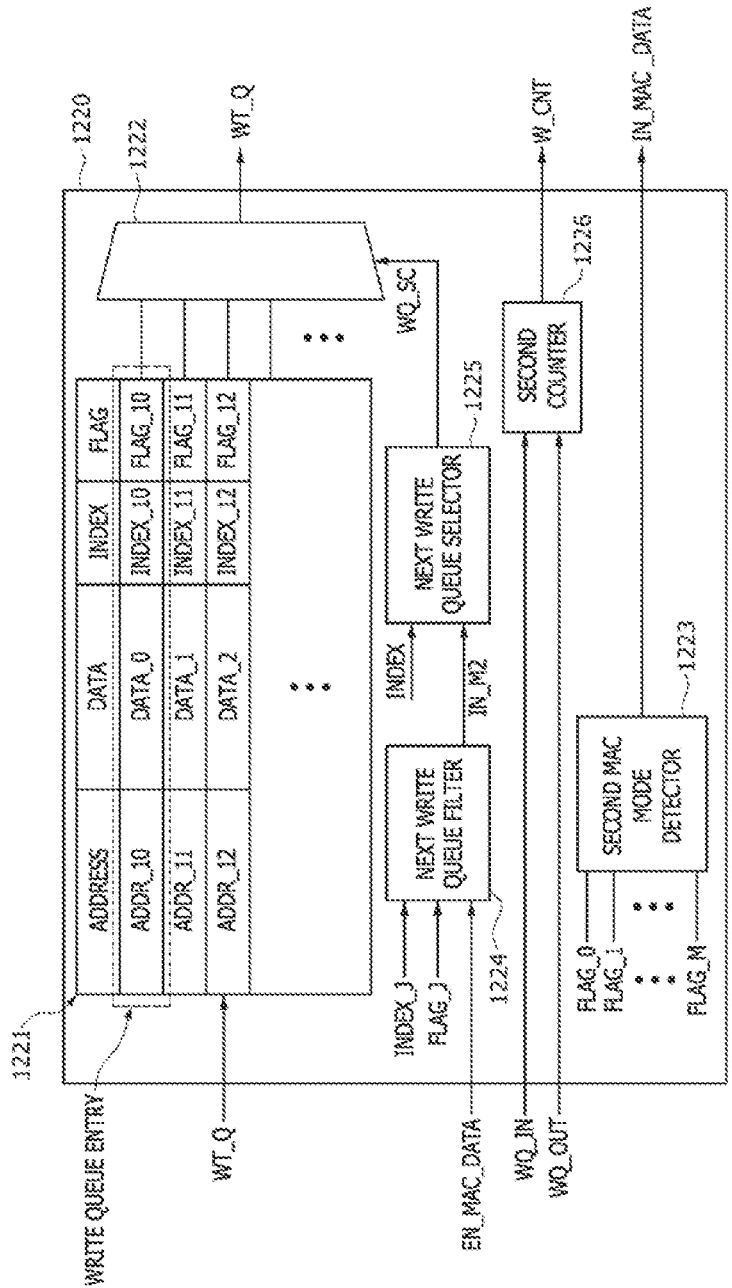
FIG. 50 is a block diagram illustrating a configuration of a write queue logic circuit included in the PIM system illustrated in FIG. 32.
Figure 51:
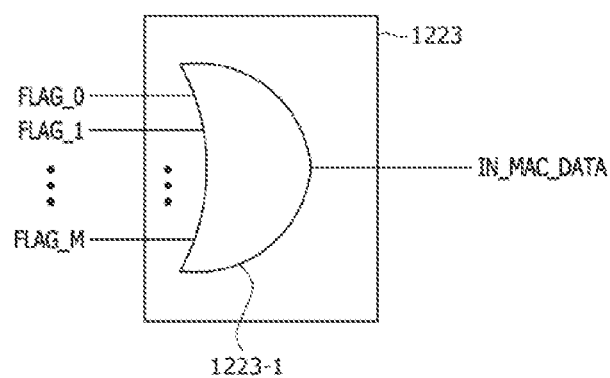
FIG. 51 is a logic symbol illustrating a second MAC mode detector included in the write queue logic circuit illustrated in FIG. 50.
Figure 52:
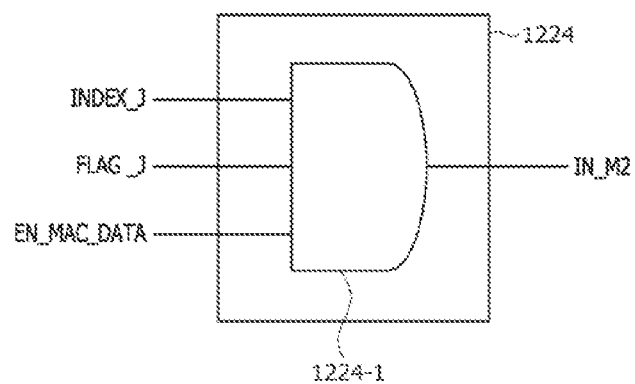
FIG. 52 is a logic symbol illustrating a next write queue filter included in the write queue logic circuit illustrated in FIG. 50.

FIG. 50 is a block diagram illustrating a configuration of the write queue logic circuit 1220 included in the PIM system 1000 illustrated in FIG. 32. FIGS. 51 and 52 are logic symbols illustrating a second MAC mode detector 1223 and a next write queue filter 1224 included in the write queue logic circuit 1220 illustrated in FIG. 50, respectively. Referring to FIG. 50, the write queue logic circuit 1220 may include the write queue storage region 1221, a write queue selection/output circuit 1222, the second MAC mode detector 1223, the next write queue filter 1224, a next write queue selector 1225, and a second counter 1226. Because the write queue storage region 1221 was previously described with reference to FIG. 34, the same description will be omitted here for brevity. In the following descriptions, it may be assumed that "N+1"-number of write queues WT_Q (i.e., first to (N+1)$^{th}$ write queues) or are stored in the write queue storage region 1221. The write queue selection/output circuit 1222 may receive the write queues WT_Q from the write queue storage region 1221. The write queues WT_Q may include the memory write queues MEM_WT_Q and the MAC write queues MAC_WT_Q. The write queue selection/output circuit 1222 may output one write queue WT_Q which is selected by a write queue selection control signal WQ_SC outputted from the next write queue selector 1225. In an embodiment, the write queue selection/output circuit 1222 may be realized using a multiplexer having a plurality of input terminals receiving the write queues WT_Q, a control input terminal receiving the write queue selection control signal WQ_SC, and an output terminal. In such a case, the number of the plurality of input terminals of the multiplexer may be equal to or greater than the number of the write queue entries in the write queue storage region 1221.

The second MAC mode detector 1223 may receive flags FLAG_0, FLAG_1, . . . , and FLAG_M of the respective write queue entries in the write queue storage region 1221 to output the MAC write signal IN_MAC_DATA. As illustrated in FIG. 51, the second MAC mode detector 1223 may include an OR gate 1223-1 performing a logical OR operation of the flags FLAG_0, FLAG_1, . . . , and FLAG_M of the respective write queue entries. When at least one of the flags FLAG_0, FLAG_1, . . . , and FLAG_M of the respective write queue entries has a logic "high(1)" level, it means that the MAC write queue MAC_WT_Q is stored in at least one of the write queue entries. Thus, in such a case, the OR gate 1223-1 may output the MAC write signal IN_MAC_DATA having a logic "high(1)" level for the write operation in the MAC mode. In contrast, when all of the flags FLAG_0, FLAG_1, . . . , and FLAG_M of the respective write queue entries have a logic "low(0)" level, it means that the memory write queues MEM_WT_Q are stored in the respective write queue entries and the MAC write queue MAC_WT_Q is absent from each of the write queue entries. Thus, in such a case, the OR gate 1223-1 may output the MAC write signal IN_MAC_DATA having a logic "low(0)" level for the write operation in the memory mode. The MAC write signal IN_MAC_DATA outputted from the OR gate 1223-1 (i.e., the second MAC mode detector 1223) may be transmitted to the scheduling logic circuit (1230 of FIGS. 31 and 32).

The next write queue filter 1224 may receive an index INDEX_J (i.e., a J$^{th}$ index) and a flag FLAG_J (i.e., a J$^{th}$ flag) of the J$^{th}$ write queue entry and the MAC write enablement signal EN_MAC_DATA to output a second MAC index signal IN_M2 (where, "J" is one of natural numbers 1, 2, . . . , N, and (N+1)). As illustrated in FIG. 52, the next write queue filter 1224 may include an AND gate 1224-1 performing a logical AND operation of the J$^{th}$ index INDEX_J, the J$^{th}$ flag FLAG_J, and the MAC write enablement signal EN_MAC_DATA. When the MAC write enablement signal EN_MAC_DATA has a logic "high(1)" level and the J$^{th}$ flag FLAG_J has a logic "high(1)" level, the AND gate 1224-1 may output the J$^{th}$ index INDEX_J as the second MAC index signal IN_M2. The MAC write enablement signal EN_MAC_DATA may be transmitted from the scheduling logic circuit (1230 of FIGS. 31 and 32) to the next write queue filter 1224. The MAC write enablement signal EN_MAC_DATA may have a logic "high(1)" level when the MAC write queue MAC_WT_Q exists in the write queue storage region 1221 and may have a logic "low(0)" level when the MAC write queue MAC_WT_Q is absent from the write queue storage region 1221. Thus, when the MAC write enablement signal EN_MAC_DATA has a logic "high(1)" level and the J$^{th}$ flag FLAG_J has a logic "high(1)" level, the J$^{th}$ index INDEX_J corresponding to the second MAC index signal IN_M2 outputted from the AND gate 1224-1 may mean an index of the write queue entry in which the MAC write queue MAC_WT_Q is stored. In contrast, when the MAC write enablement signal EN_MAC_DATA has a logic "low(0)" level, the second MAC index signal IN_M2 may have a logic "low(0)" level regardless of a logic level of the J$^{th}$ flag FLAG_J. The second MAC index signal IN_M2 outputted from the next write queue filter 1224 (i.e., the AND gate 1224-1) may be transmitted to the next write queue selector 1225.

The next read/MAC queue selector 1225 may receive the second MAC index signal IN_M2 (outputted from the next write queue filter 1224) and the indexes INDEXes (outputted from the write queue storage region 1221). When the second MAC index signal IN_M2 corresponding to the index of the write queue entry storing the MAC write queue MAC_WT_Q is transmitted from the next write queue filter 1224 to the next write queue selector 1225, the next write queue selector 1225 may transmit the write queue selection control signal WQ_SC for outputting the MAC write queue MAC_WT_Q stored in the write queue entry having the index designated by the second MAC index signal IN_M2 to the write queue selection/output circuit 1222. In contrast, when the second MAC index signal IN_M2 having a logic "low(0)" level is transmitted from the next write queue filter 1224 to the next write queue selector 1225, the next write queue selector 1225 may transmit the write queue selection control signal WQ_SC for outputting the memory write MEM_WT_Q stored in the write queue entry including an index having a high priority among the indexes INDEXes to the write queue selection/output circuit 1222.

The second counter 1226 may count the total number of the memory write queues MEM_WT_Q and the MAC write queues MAC_WT_Q stored in the write queue storage region 1221. In order that the second counter 1226 counts the total number of the memory write queues MEM_WT_Q and the MAC write queues MAC_WT_Q, the first counter 1226 may receive the second queue input control signal WQ_IN and the second queue output control signal WQ_OUT from the scheduling logic circuit (1230 of FIGS. 31 and 32). In the event that the memory write queues MEM_WT_Q or the MAC write queues MAC_WT_Q is stored in the write queue storage region 1221 (i.e., the second queue input control signal WQ_IN is transmitted from the scheduling logic circuit 1230 to the second counter 1226), the second counter 1226 may count the total number of the memory write queues MEM_WT_Q and the MAC write queues MAC_WT_Q and may increase the counted value by one to output the increased value of the counted value as the second queue counted value W_CNT. In the event that the memory write queues MEM_WT_Q or the MAC write queues MAC_WT_Q is outputted from the write queue storage region 1221 (i.e., the second queue output control signal WQ_OUT is transmitted from the scheduling logic circuit 1230 to the second counter 1226), the second counter 1226 may decrease the counted value by one to output the decreased value of the counted value as the second queue counted value W_CNT. The second queue counted value W_CNT outputted from the second counter 1226 may be transmitted to the scheduling logic circuit 1230.

Figure 53:
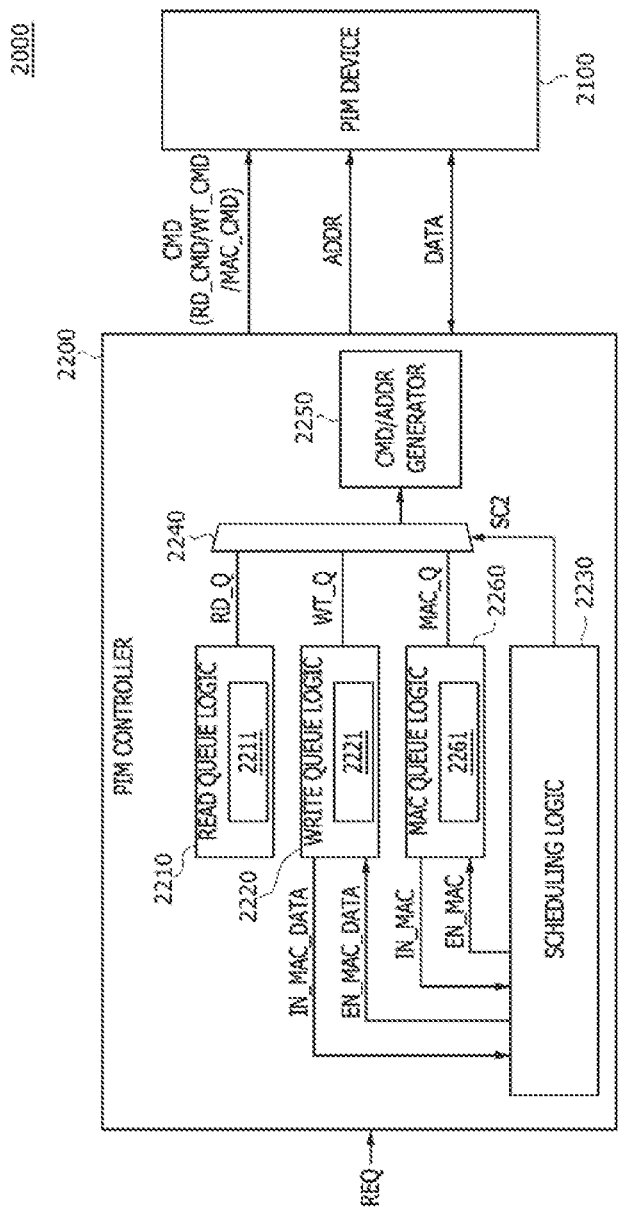
FIG. 53 is a block diagram illustrating a PIM system according to further another embodiment of the present disclosure.

FIG. 53 is a block diagram illustrating a configuration of a PIM system 2000 according to further another embodiment of the present disclosure. Referring to FIG. 53, the PIM system 2000 may include a PIM device 2100 and a PIM controller 2200. The PIM device 2100 may have the same configuration as the PIM device 1100 described with reference to FIG. 32. The PIM controller 2200 may include a read queue logic circuit 2210, a write queue logic circuit 2220, a scheduling logic circuit 2230, a selection/output circuit 2240, a command/address generator 2250, and a MAC queue logic circuit 2260. The read queue logic circuit 2210 may store a read queue RD_Q, which is outputted from a host, in a read queue storage region 2211 included in the read queue logic circuit 2210. The read queue logic circuit 2210 may output the read queue RD_Q in response to a control signal outputted from the scheduling logic circuit 2230. The write queue logic circuit 2220 may store a write queue WT_Q, which is outputted from the host, in a write queue storage region 2221 included in the write queue logic circuit 2220. The write queue logic circuit 2220 may output the write queue WT_Q in response to a control signal outputted from the scheduling logic circuit 2230. The MAC queue logic circuit 2260 may store a MAC queue MAC_Q, which is outputted from the host, in a MAC queue storage region 2261 included in the MAC queue logic circuit 2260. The MAC queue logic circuit 2260 may output the MAC queue MAC_Q in response to a control signal outputted from the scheduling logic circuit 2230. The read queue RD_Q outputted from the read queue logic circuit 2210, the write queue WT_Q outputted from the write queue logic circuit 2220, and the MAC queue MAC_Q outputted from the MAC queue logic circuit 2260 may be inputted to the selection/output circuit 2240.

The MAC queue logic circuit 2260 may transmit a MAC mode signal IN_MAC having a first level (e.g., a logic "high(1)" level) to the scheduling logic circuit 2230 when the MAC queue MAC_Q exists in the MAC queue storage region 2261. In contrast, the MAC queue logic circuit 2260 may transmit the MAC mode signal IN_MAC having a second level (e.g., a logic "low(0)" level) to the scheduling logic circuit 2230 when the MAC queue MAC_Q is absent from the MAC queue storage region 2261. The write queue logic circuit 2220 may transmit a MAC write signal IN_MAC_DATA having the first level (i.e., a logic "high(1)" level) to the scheduling logic circuit 2230 when the MAC writ queue MAC_WT_Q exists in the write queue storage region 2221. In contrast, the write queue logic circuit 2220 may transmit the MAC write signal IN_MAC_DATA having the second level (i.e., a logic "low(0)" level) to the scheduling logic circuit 2230 when the MAC writ queue MAC_WT_Q is absent from the write queue storage region 2221.

The scheduling logic circuit 2230 may transmit a MAC write enablement signal EN_MAC_DATA having a logic "high(1)" level to the write queue logic circuit 2220 when both of the MAC mode signal IN_MAC and the MAC write signal IN_MAC_DATA have a logic "high(1)" level. In contrast, the scheduling logic circuit 2230 may transmit the MAC write enablement signal EN_MAC_DATA having a logic "low(0)" level to the write queue logic circuit 2220 when at least one of the MAC mode signal IN_MAC and the MAC write signal IN_MAC_DATA has a logic "low(0)" level. The scheduling logic circuit 2230 may transmit a MAC mode enablement signal EN_MAC having a logic "high(1)" level to the MAC queue logic circuit 2260 when the MAC mode signal IN_MAC has a logic "high(1)" level. In an embodiment, when the MAC mode signal IN_MAC has a logic "high(1)" level and the MAC write signal IN_MAC_DATA also has a logic "high(1)" level, the scheduling logic circuit 2230 may transmit the MAC mode enablement signal EN_MAC having a logic "high(1)" level to the MAC queue logic circuit 2260 after transmitting the MAC write enablement signal EN_MAC_DATA having a logic "high(1)" level to the write queue logic circuit 2220.

The selection/output circuit 2240 may have a first input terminal, a second input terminal, a third input terminal, a control signal input terminal, and an output terminal. The read queue RD_Q outputted from the read queue logic circuit 2210 may be inputted to the first input terminal of the selection/output circuit 2240. The write queue WT_Q outputted from the write queue logic circuit 2220 may be inputted to the second input terminal of the selection/output circuit 2240. The MAC queue MAC_Q outputted from the MAC queue logic circuit 2260 may be inputted to the third input terminal of the selection/output circuit 2240. A second selection control signal SC2 outputted from the scheduling logic circuit 2230 may be inputted to the control signal input terminal of the selection/output circuit 2240. The output terminal of the selection/output circuit 2240 may be coupled to the command/address generator 2250. The selection/ output circuit 2240 may selectively output one of the read queue RD_Q inputted to the first input terminal, the write queue WT_Q inputted to the second input terminal, and the MAC queue MAC_Q inputted to the third input terminal in response to the second selection control signal SC2 inputted to the control signal input terminal. The queue outputted from the selection/output circuit 2240 may be inputted to the command/address generator 2250. In an embodiment, the selection/output circuit 2240 may be realized using a multiplexer having three input terminals and one output terminal.

The command/address generator 2250 may decode an output signal (i.e., a queue) of the selection/output circuit 2240 to generate and output a command CMD and an address ADDR. In an embodiment, when the read queue RD_Q is outputted from the selection/output circuit 2240, the command/address generator 2250 may generate and output a read command RD_CMD as the command CMD. When the MAC queue MAC_Q is outputted from the selection/output circuit 2240, the command/address generator 2250 may generate and output a MAC command MAC_CMD for controlling a MAC arithmetic operation of the PIM device 2100 as the command CMD. When the write queue WT_Q is outputted from the selection/output circuit 2240, the command/address generator 2250 may generate and output a write command WT_COM as the command CMD.

Figure 54:
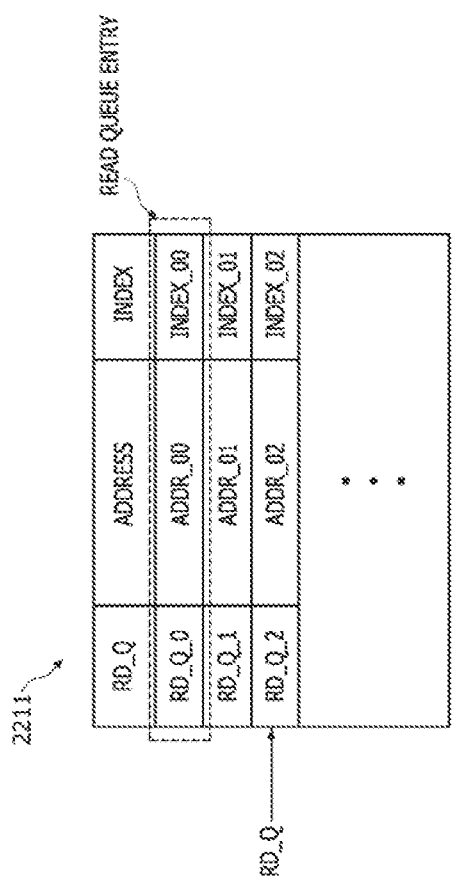
FIG. 54 illustrates a configuration of a read queue storage region included in the PIM system illustrated in FIG. 53.

FIG. 54 illustrates a configuration of the read queue storage region 2211 included in the read queue logic circuit 2210 illustrated in FIG. 53. Referring to FIG. 54, the read queue storage region 2211 may have a plurality of read queue entries. Each of the plurality of read queue entries may store one read queue RD_Q. Each of the read queue entries may include an address and an index. The address in each read queue entry may be a physical address or a logical address of a region having data to be read out, among a plurality of regions in a data storage region included in the PIM device (2100 of FIG. 53). The index in each read queue entry may include information on whether the read queue RD_Q stored in the read queue entry is valid and information on a sequence in which the read queue RD_Q stored in the read queue entry is outputted from the read queue storage region 2211.

Figure 55:
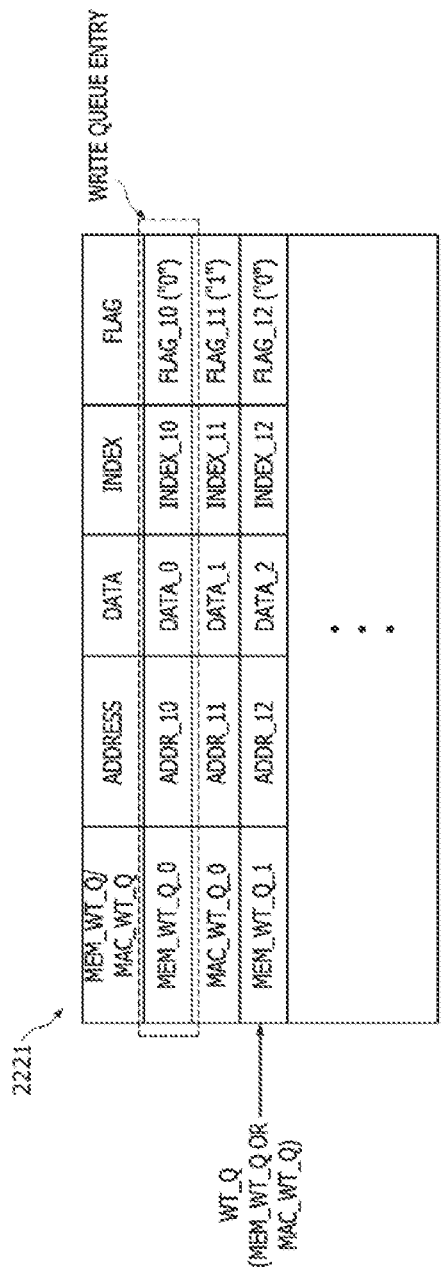
FIG. 55 illustrates a configuration of a write queue storage region included in the PIM system illustrated in FIG. 53.

FIG. 55 illustrates a configuration of the write queue storage region 2221 included in the write queue logic circuit 2220 illustrated in FIG. 53. Referring to FIG. 55, the write queue storage region 2221 may have a plurality of write queue entries. Each of the plurality of write queue entries may store one memory write queue MEM_WT_Q or one MAC write queue MAC_WT_Q. Each of the plurality of write queue entries may include an address, data, an index, and a flag. The address in each write queue entry may be a physical address or a logical address of a region, in which data are written, among a plurality of regions in the data storage region (corresponding to the data storage region 1110 of FIG. 32) included in the PIM device (2100 of FIG. 53). The data DATA in the write queue entries may include write data to be transmitted to the PIM device 2100. The index INDEX in each write queue entry may include information on whether the memory write queue MEM_WT_Q or the MAC write queue MAC_WT_Q stored in the write queue entry is valid and information on a sequence in which the memory write queue MEM_WT_Q or the MAC write queue MAC_WT_Q stored in the write queue entry is outputted from the write queue logic circuit 2220.

The flag FLAG in each write queue entry may include information on whether the queue stored in the write queue entry is the memory write queue MEM_WT_Q or the MAC write queue MAC_WT_Q. In an embodiment, the flag FLAG in the write queue entry may have a first binary number or a second binary number. In an embodiment, the first binary number may be "0", and the second binary number may be "1". In an embodiment, the flag of the write queue entry storing the memory write queue MEM_WT_Q may be set as the first binary number of "0", and the flag of the write queue entry storing the MAC write queue MAC_WT_Q may be set as the second binary number of "1". As illustrated in FIG. 55, a first flag FLAG_10 in the first write queue entry storing the first memory write queue MEM_WT_Q_0 may be set as the first binary number of "0", and a third flag FLAG_12 in the third write queue entry storing the second memory write queue MEM_WT_Q_1 may also be set as the first binary number of "0". In contrast, a second flag FLAG_11 in the second write queue entry storing the first MAC write queue MAC_WT_Q_0 may be set as the second binary number of "1". In an embodiment, the flag FLAG and the index INDEX in each write queue entry may be set at a point in time when the memory write queue MEM_WT_Q or the MAC write queue MAC_WT_Q is stored.

Figure 56:
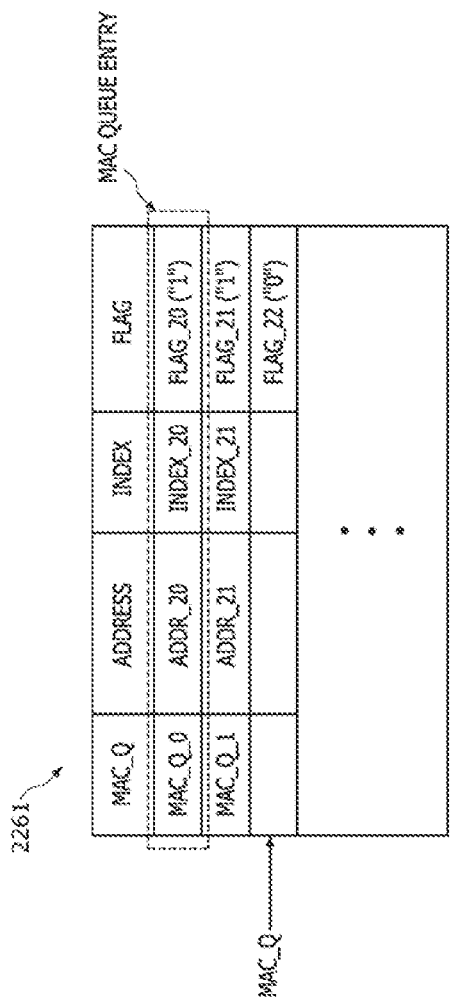
FIG. 56 illustrates a configuration of a MAC queue storage region included in the PIM system illustrated in FIG. 53.

FIG. 56 illustrates a configuration of the MAC queue storage region 2261 included in the MAC queue logic circuit 2260 of the PIM controller illustrated in FIG. 53. Referring to FIG. 56, the MAC queue storage region 2261 may have a plurality of MAC queue entries. Each of the plurality of MAC queue entries may store one MAC queue MAC_Q. Each of the plurality of MAC queue entries may include an address, an index, and a flag. The address in each MAC queue entry may be a physical address or a logical address of a region having data to be used for the MAC arithmetic operation, among a plurality of regions in the data storage region (corresponding to the data storage region 1110 of FIG. 32) included in the PIM device (2100 of FIG. 53). The index in each MAC queue entry may include information on whether the MAC queue MAC_Q stored in the MAC queue entry is valid and information on a sequence in which the MAC queue MAC_Q stored in the MAC queue entry is outputted from the MAC queue logic circuit 2260.

The flag in each MAC queue entry may include information which is capable of determining whether the MAC queue MAC_Q is stored in the MAC queue entry. In an embodiment, the flag may have a first binary number or a second binary number. In an embodiment, the first binary number may be "0", and the second binary number may be "1". In an embodiment, the flag of the MAC queue entry may be set as the first binary number of "0" when the MAC queue MAC_Q is absent from the MAC queue entry. In contrast, the flag of the MAC queue entry may be set as the second binary number of "1" when the MAC queue MAC_Q exists in the MAC queue entry. As illustrated in FIG. 56, a first flag FLAG_20 of the first MAC queue entry storing a first MAC queue MAC_Q_0 and a second flag FLAG_21 of the second MAC queue entry storing a second MAC queue MAC_Q_1 may be set to have the second binary number of "1". In contrast, a third flag FLAG_22 of the third MAC queue entry storing no MAC queue may be set to have the first binary number of "0". In an embodiment, the flag FLAG in the MAC queue entry may be set to have the first binary number of "0" as an initial value and may be set to have the second binary number of "1" at a point in time when the MAC queue MAC_Q is stored in the MAC queue entry. If the MAC queue MAC_Q is outputted from the MAC queue entry of the MAC queue logic circuit 2260, the flag of the MAC queue entry may be changed to have the first binary number of "0" corresponding to the initial value.

Figure 57:
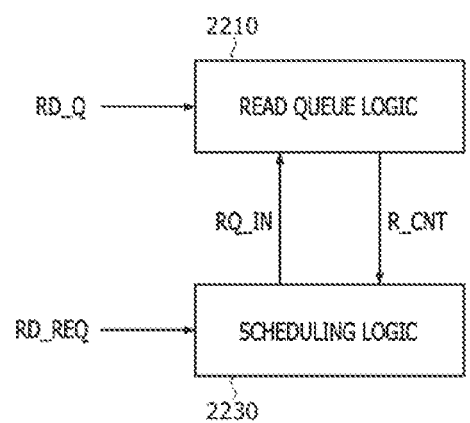
FIG. 57 illustrates an operation for storing a read queue in a read queue logic circuit included in the PIM system illustrated in FIG. 53.

FIG. 57 illustrates an operation for storing the read queue RD_Q in the read queue logic circuit 2210 included in the PIM system 2000 illustrated in FIG. 53. Referring to FIG. 57, in the event that a read request RD_REQ is transmitted from a host to the scheduling logic circuit 2230, the scheduling logic circuit 2230 may transmit a first queue input control signal RQ_IN to the read queue logic circuit 2210. The read queue logic circuit 2210 may store the read queue RD_Q outputted from the host in response to the first queue input control signal RQ_IN. In addition, as described with reference to FIG. 54, the read queue logic circuit 2210 may set the index INDEX and the flag FLAG of the read queue entry in which the read queue RD_Q is stored. Moreover, the read queue logic circuit 2210 may count and increase the number of the read queues RD_Q stored in the read queue logic circuit 2210 by one, thereby generating and outputting a first queue counted value R_CNT corresponding to the increased number of the read queues RD_Q to the scheduling logic circuit 2230.

Figure 58:
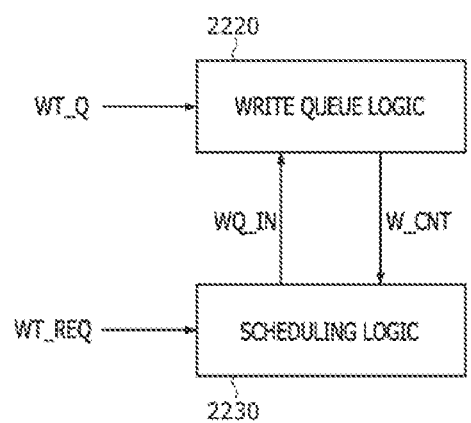
FIG. 58 illustrates an operation for storing a write queue in a write queue logic circuit included in the PIM system illustrated in FIG. 53.

FIG. 58 illustrates an operation for storing the write queue WT_Q in the write queue logic circuit 2220 included in the PIM system 2000 illustrated in FIG. 53. The write queue WT_Q may be the memory write queue MEM_WT_Q or the MAC write queue MAC_WT_Q. Referring to FIG. 58, when a write request WT_REQ is transmitted from the host to the scheduling logic circuit 2230, the scheduling logic circuit 2230 may transmit a second queue input control signal WQ_IN to the write queue logic circuit 2220. The write queue logic circuit 2220 may store the write queue WT_Q outputted from the host in response to the second queue input control signal WQ_IN. In addition, as described with reference to FIG. 55, the write queue logic circuit 2220 may set the index INDEX and the flag FLAG of the write queue entry in which the write queue WT_Q is stored. Moreover, the write queue logic circuit 2220 may count and increase the number of the write queues WT_Q stored in the write queue logic circuit 2220 by one, thereby generating and transmitting a second queue counted value W_CNT corresponding to the increased number of the write queues WT_Q to the scheduling logic circuit 2230.

Figure 59:
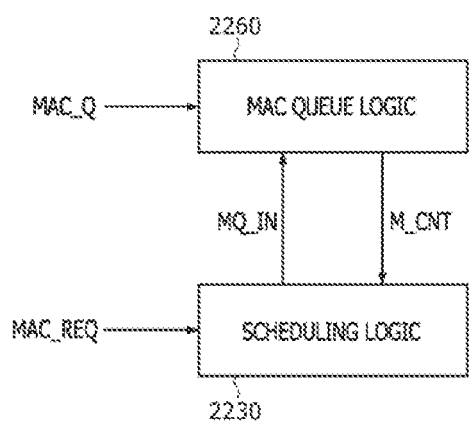
FIG. 59 illustrates an operation for storing a MAC queue in a MAC queue logic circuit included in the PIM system illustrated in FIG. 53.

FIG. 59 illustrates an operation for storing the MAC queue MAC_Q in the MAC queue logic circuit 2260 included in the PIM system 2000 illustrated in FIG. 53. Referring to FIG. 59, when a MAC request MAC_REQ is transmitted from the host to the scheduling logic circuit 2230, the scheduling logic circuit 2230 may transmit a third queue input control signal MQ_IN to the MAC queue logic circuit 2260. The MAC queue logic circuit 2260 may store the MAC queue MAC_Q outputted from the host in response to the third queue input control signal MQ_IN. In addition, as described with reference to FIG. 56, the MAC queue logic circuit 2260 may set the index INDEX and the flag FLAG of the MAC queue entry in which the MAC queue MAC_Q is stored. Moreover, the MAC queue logic circuit 2260 may count and increase the number of the MAC queues MAC_Q stored in the MAC queue logic circuit 2260 by one, thereby generating and transmitting a third queue counted value M_CNT corresponding to the increased number of the write queues WT_Q to the scheduling logic circuit 2230.

Figure 60:
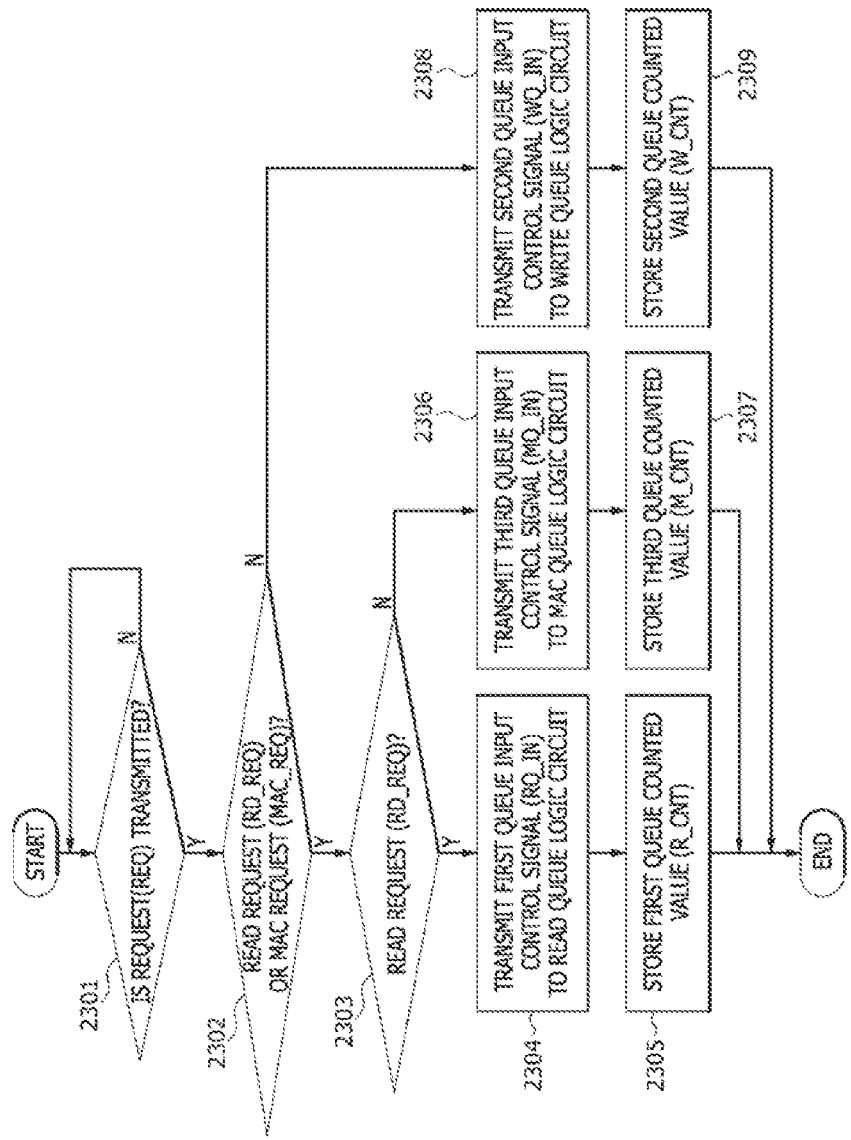
FIG. 60 is a flowchart illustrating an example of a queue storage operation performed by a scheduling logic circuit of a PIM controller included in the PIM system illustrated in FIG. 53.

FIG. 60 is a flowchart illustrating an example of a queue storage operation performed by the scheduling logic circuit 2230 of the PIM controller 2200 included in the PIM system 2000 illustrated in FIG. 53. Referring to FIG. 60, the scheduling logic circuit 2230 of the PIM controller 2200 may determine whether a request REQ is transmitted from the host to the scheduling logic circuit 2230 (see step 2301). If it is determined that the request REQ is transmitted from the host to the scheduling logic circuit 2230, a step 2302 may be executed. If it is determined that the request REQ is not transmitted from the host to the scheduling logic circuit 2230, the scheduling logic circuit 2230 may maintain a standby status. When the request REQ is transmitted from the host to the scheduling logic circuit 2230, the scheduling logic circuit 2230 may determine whether the request REQ is the read request RD_REQ or the MAC request MAC_REQ at the step 2302. When the request REQ is determined to be the read request RD_REQ or the MAC request MAC_REQ at the step 2302, the scheduling logic circuit 2230 may determine whether the request REQ is the read request RD_REQ (see step 2303).

When the request REQ is determined to be the read request RD_REQ at the step 2303, the scheduling logic circuit 2230 may transmit the first queue input control signal RQ_IN to the read queue logic circuit 2210 (see step 2304). As described with reference to FIG. 57, the read queue logic circuit 2210 may store the read queues RD_Q in response to the first queue input control signal RQ_IN. In addition, the read queue logic circuit 2210 may count up the number of the read queues RD_Q stored in the read queue logic circuit 2210 by one to generate and transmit the first queue counted value R_CNT to the scheduling logic circuit 2230. At a step 2305, the scheduling logic circuit 2230 may store the first queue counted value R_CNT.

When the request REQ is the MAC request MAC_REQ at the step 2303, the scheduling logic circuit 2230 may transmit the third queue input control signal MQ_IN to the MAC queue logic circuit 2260 (see step 2306). As described with reference to FIG. 59, the MAC queue logic circuit 2260 may store the MAC queues MAC_Q in response to the third queue input control signal MQ_IN. In addition, the MAC queue logic circuit 2260 may count up the number of the MAC queues MAC_Q stored in the MAC queue logic circuit 2260 by one to generate and transmit the third queue counted value M_CNT to the scheduling logic circuit 2230. At a step 2307, the scheduling logic circuit 2230 may store the third queue counted value M_CNT.

When the request REQ is the write request WT_REQ at the step 2302, the scheduling logic circuit 2230 may transmit the second queue input control signal WQ_IN to the write queue logic circuit 2220 (see step 2308). As described with reference to FIG. 58, the write queue logic circuit 2220 may store the write queues WT_Q in response to the second queue input control signal WQ_IN. In addition, the write queue logic circuit 2220 may count up the number of the write queues WT_Q stored in the write queue logic circuit 2220 by one to generate and transmit the second queue counted value W_CNT to the scheduling logic circuit 2230. At a step 2309, the scheduling logic circuit 2230 may store the second queue counted value W_CNT.

Figure 61:
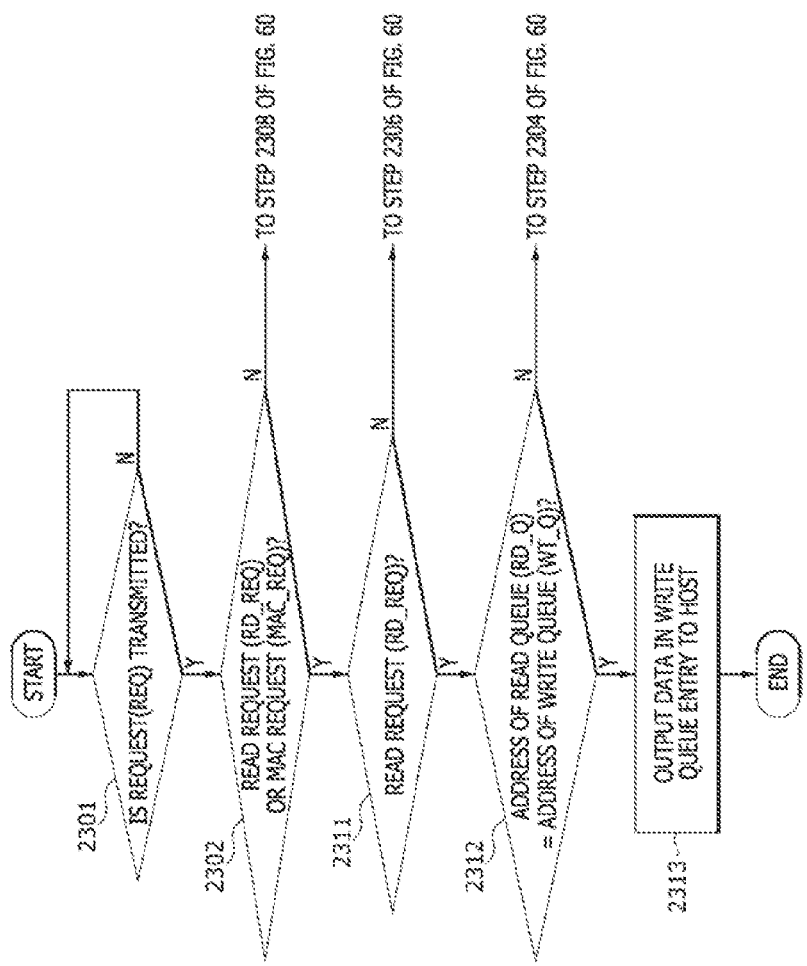
FIG. 61 is a flowchart illustrating another example of a queue storage operation performed by a scheduling logic circuit of a PIM controller included in the PIM system illustrated in FIG. 53.

FIG. 61 is a flowchart illustrating another example of the queue storage operation performed by the scheduling logic circuit 2230 of the PIM controller 2200 included in the PIM system 2000 illustrated in FIG. 53. Referring to FIG. 61, the scheduling logic circuit 2230 of the PIM controller 2200 may determine whether a request REQ is transmitted from the host to the scheduling logic circuit 2230 at the step 2301. If a request REQ is determined to be transmitted from the host to the scheduling logic circuit 2230, the step 2302 may be executed. If the request REQ is not transmitted from the host to the scheduling logic circuit 2230, the scheduling logic circuit 2230 may maintain a standby status. When a request REQ is determined to be transmitted from the host to the scheduling logic circuit 2230, the scheduling logic circuit 2230 may determine whether the request REQ is one of the read request RD_REQ and the MAC request MAC_REQ, or the write request WT_REQ at the step 2302. When the request REQ is not the read request RD_REQ and the MAC request MAC_REQ (i.e., the request REQ is the write request WT_REQ), the step 2308 of FIG. 60 may be executed. When the request REQ is determined to be the read request RD_REQ or the MAC request MAC_REQ at the step 2302, whether the request REQ is the read request RD_REQ or the MAC request MAC_REQ may be determined at a step 2311. When the request REQ is not the read request RD_REQ at the 2311 (i.e., the request REQ is the MAC request MAC_REQ), the step 2306 of FIG. 60 may be executed. When the request REQ is determined to be the read request RD_REQ at the step 2311, the scheduling logic circuit 2230 may determine whether the address of the read queue RD_Q is the same as the address of the write queue WT_Q stored in the write queue logic circuit 2220 (see step 2312). When the address of the read queue RD_Q is different from the address of the write queue WT_Q at the step 2312, the step 2304 of FIG. 60 may be executed. If the address of the read queue RD_Q is determined to be the same as the address of the write queue WT_Q at the step 2312, it means that data to be read out by the host are stored in the write queue logic circuit 2220 before the data to be read out by the host are written into the PIM device 2100. Accordingly, the data in the write queue entry (included the write queue logic circuit 2220) having the same address as the read queue RD_Q may be outputted to the host (see step 2313). In such a case, a process for storing the read queue RD_Q in the read queue logic circuit 2210 will be omitted because the operation for the read queue RD_Q has been already performed.

Figure 62:
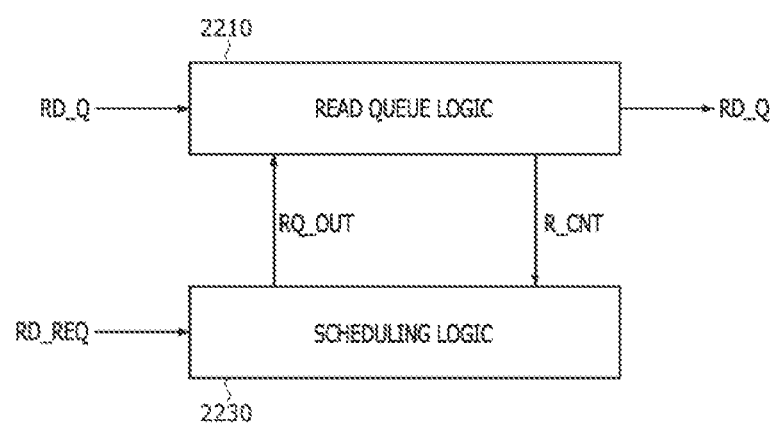
FIG. 62 illustrates an operation for outputting a read queue from a read queue logic circuit included in the PIM system illustrated in FIG. 53.

FIG. 62 illustrates an operation for outputting the read queue RD_Q from the read queue logic circuit 2210 included in the PIM system 2000 illustrated in FIG. 53. Referring to FIG. 62, if the read request RD_REQ is transmitted from the host to the scheduling logic circuit 2230, the read queue RD_Q may be stored in the read queue logic circuit 2210. When the MAC queue MAC_Q is absent from the MAC queue logic circuit 2260, the scheduling logic circuit 2230 may transmit a first queue output control signal RQ_OUT to the read queue logic circuit 2210. In an embodiment, when the MAC queue MAC_Q is absent from the MAC queue logic circuit 2260 and the second queue counted value W_CNT in the write queue logic circuit 2220 is equal to or greater than a maximum threshold value, the scheduling logic circuit 2230 may transmit the first queue output control signal RQ_OUT to the read queue logic circuit 2210 after outputting the write queue WT_Q from the write queue logic circuit 2220. The read queue logic circuit 2210 may output the read queue RD_Q in response to the first queue output control signal RQ_OUT. If the read queue RD_Q is outputted from the read queue logic circuit 2210, the read queue logic circuit 2210 may decrease the first queue counted value R_CNT by one and may transmit the decreased value of the first queue counted value R_CNT to the scheduling logic circuit 2230.

Figure 63:
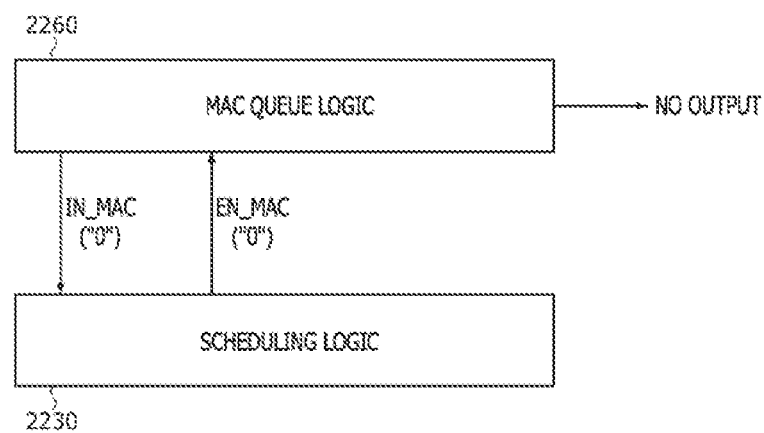
FIGS. 63 and 64 illustrate an operation for outputting a MAC queue from a MAC queue logic circuit included in the PIM system illustrated in FIG. 53.
Figure 64:
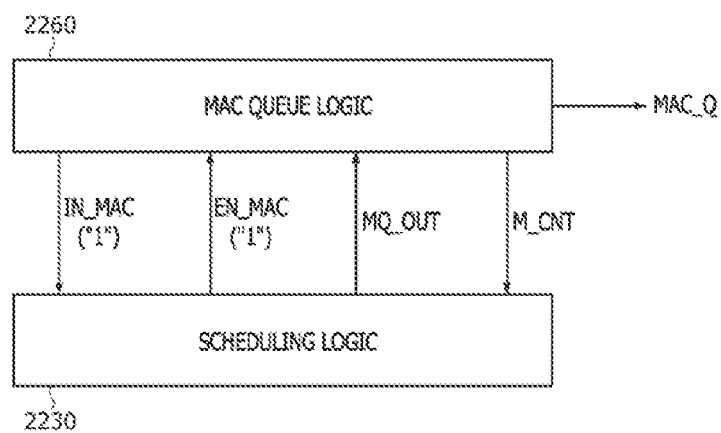

FIGS. 63 and 64 illustrate an operation for outputting the MAC queue MAC_Q from the MAC queue logic circuit 2260 included in the PIM system 2000 illustrated in FIG. 53. Referring to FIG. 63, when the MAC queue MAC_Q is absent from the MAC queue logic circuit 2260, the MAC queue logic circuit 2260 may transmit the MAC mode signal IN_MAC having a logic "low(0)" level to the scheduling logic circuit 2230. The scheduling logic circuit 2230 may transmit the MAC mode enablement signal EN_MAC having a logic "low(0)" level to the MAC queue logic circuit 2260 in response to the MAC mode signal IN_MAC having a logic "low(0)" level. In such a case, no MAC queue MAC_Q is outputted from the MAC queue logic circuit 2260. Next, referring to FIG. 64, when the MAC queue MAC_Q exists in the MAC queue logic circuit 2260, the MAC queue logic circuit 2260 may transmit the MAC mode signal IN_MAC having a logic "high(1)" level to the scheduling logic circuit 2230. The scheduling logic circuit 2230 may transmit the MAC mode enablement signal EN_MAC having a logic "high(1)" level to the MAC queue logic circuit 2260 in response to the MAC mode signal IN_MAC having a logic "high(1)" level. In addition, the scheduling logic circuit 2230 may transmit a third queue output control signal MQ_OUT to the MAC queue logic circuit 2260. The MAC queue logic circuit 2260 may output the MAC queue MAC_Q in response to the third queue output control signal MQ_OUT. If the MAC queue MAC_Q is outputted from the MAC queue logic circuit 2260, the MAC queue logic circuit 2260 may decrease the third queue counted value M_CNT by one and may transmit the decreased value of the third queue counted value M_CNT to the scheduling logic circuit 2230.

Figure 65:
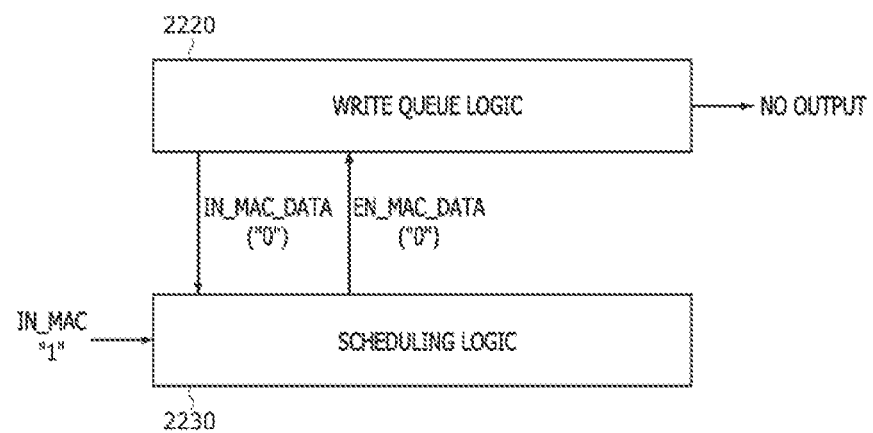
FIGS. 65 and 66 illustrate operations for outputting a memory write queue and a MAC write queue from a write queue logic circuit included in the PIM system illustrated in FIG. 53.
Figure 66:
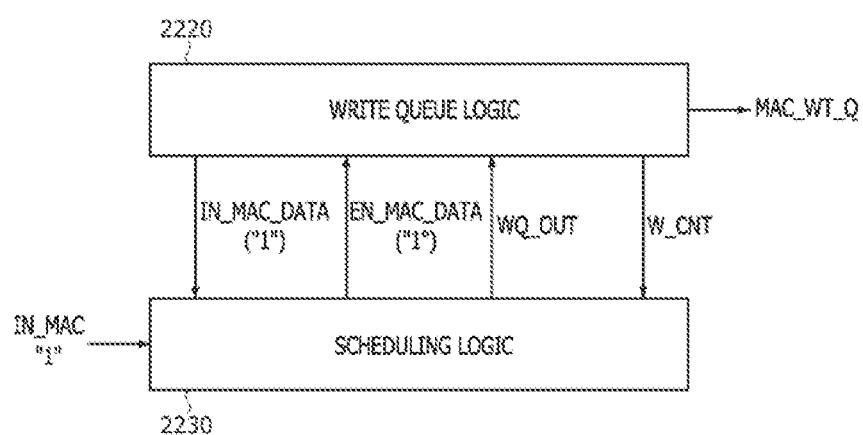

FIGS. 65 and 66 illustrate operations for outputting the memory write queue MEM_WT_Q and the MAC write queue MAC_WT_Q from the write queue logic circuit 2220 included in the PIM system 2000 illustrated in FIG. 53. The scheduling logic circuit 2230 may receive the MAC mode signal IN_MAC having a logic "low(0)" level or a logic "high(1)" level from the MAC queue logic circuit 2260. As described with reference to FIGS. 63 and 64, when the MAC queue MAC_Q exists in the MAC queue logic circuit 2260, the MAC queue logic circuit 2260 may transmit the MAC mode signal IN_MAC having a logic "high(1)" level to the scheduling logic circuit 2230. In contrast, when the MAC queue MAC_Q is absent from the MAC queue logic circuit 2260, the MAC queue logic circuit 2260 may transmit the MAC mode signal IN_MAC having a logic "low(0)" level to the scheduling logic circuit 2230. In the event that the MAC mode signal IN_MAC having a logic "low(0)" level is transmitted to the scheduling logic circuit 2230, the scheduling logic circuit 2230 may perform a scheduling operation such that the read queue RD_Q is preferentially outputted from the read queue logic circuit 2210. However, when the read queue RD_Q is absent from the read queue logic circuit 2210 or the number of the write queues WT_Q stored in the write queue logic circuit 2220 is equal to or greater than the maximum threshold value, the scheduling logic circuit 2230 may perform a scheduling operation such that the write queue WT_Q is preferentially outputted from the write queue logic circuit 2220 prior to the read queue RD_Q. Hereinafter, an operation for outputting the write queue WT_Q will be described in conjunction with a case for which the MAC mode signal IN_MAC having a logic "high(1)" level is transmitted to the scheduling logic circuit 2230 due to the presence of the MAC queue MAC_Q in the MAC queue logic circuit 2260.

First, referring to FIG. 65, when the MAC write queue MAC_WT_Q is absent from the write queue logic circuit 2220, the write queue logic circuit 2220 may generate and transmit the MAC write signal IN_MAC_DATA having a logic "low(0)" level to the scheduling logic circuit 2230. The scheduling logic circuit 2230 may transmit the MAC write enablement signal EN_MAC_DATA having a logic "low (0)" level to the write queue logic circuit 2220 in response to the MAC write signal IN_MAC_DATA having a logic "low(0)" level. Because the MAC queue MAC_Q exists in the MAC queue logic circuit 2260 and the MAC write queue MAC_WT_Q is absent from the write queue logic circuit 2220, the scheduling logic circuit 2230 may inhibit the memory write queue MEM_WT_Q in the write queue logic circuit 2220 from being outputted until the MAC queue MAC_Q is outputted from the MAC queue logic circuit 2260.

Next, referring to FIG. 66, when the MAC write queue MAC_WT_Q exists in the write queue logic circuit 2220, the write queue logic circuit 2220 may generate and transmit the MAC write signal IN_MAC_DATA having a logic "high(1)" level to the scheduling logic circuit 2230. The scheduling logic circuit 2230 may transmit the MAC write enablement signal EN_MAC_DATA having a logic "high (1)" level to the write queue logic circuit 2220 in response to the MAC write signal IN_MAC_DATA having a logic "high(1)" level. Because the MAC queue MAC_Q exists in the MAC queue logic circuit 2260 and the MAC write queue MAC_WT_Q exists in the write queue logic circuit 2220, the scheduling logic circuit 2230 may control the write queue logic circuit 2220 such that the MAC write queue MAC_WT_Q in the write queue logic circuit 2220 is outputted before the MAC queue MAC_Q in the MAC queue logic circuit 2260 is outputted. For the above operation of the scheduling logic circuit 2230, the scheduling logic circuit 2230 may transmit a second queue output control signal WQ_OUT to the write queue logic circuit 2220. The write queue logic circuit 2220 may output the MAC write queue MAC_WT_Q in response to the second queue output control signal WQ_OUT. If the MAC write queue MAC_WT_Q is outputted from the write queue logic circuit 2220, the write queue logic circuit 2220 may decrease the second queue counted value W_CNT by one and may transmit the decreased value of the second queue counted value W_CNT to the scheduling logic circuit 2230.

As described above, the PIM controller 2200 of the PIM system 2000 according to the present embodiment may perform the scheduling operation adjusting an output sequence of the read queue RD_Q, the MAC queue MAC_Q, the memory write queue MEM_WT_Q, and the MAC write queue MAC_WT_Q. This scheduling operation may be performed by the scheduling logic circuit 2230 included in the PIM controller 2200. The scheduling operation may basically output the read queue RD_Q prior to the write queue WT_Q. However, in the event that the number of the write queues WT_Q is over a certain value to cause lack of a space for storing the write queues WT_Q while the read queues RD_Q are outputted, the scheduling operation may be performed to temporarily output the write queue WT_Q prior to the read queue RD_Q. The scheduling logic circuit 1230 may allow the MAC queue MAC_Q to have an output priority over the read queue RD_Q when the MAC queue MAC_Q exists in the MAC queue logic circuit 2260. However, when the MAC write queue MAC_WT_Q exists in the write queue logic circuit 2220, the scheduling logic circuit 1230 may control the write queue logic circuit 2220 such that the MAC write queue MAC_WT_Q is outputted prior to the MAC queue MAC_Q. That is, the scheduling logic circuit 1230 may perform the scheduling operation such that the MAC queue MAC_Q is outputted after the MAC write queue MAC_WT_Q. This scheduling operation perform by the scheduling logic circuit 2230 will be described hereinafter in more detail with reference to FIGS. 67 to 69.

Figure 67:
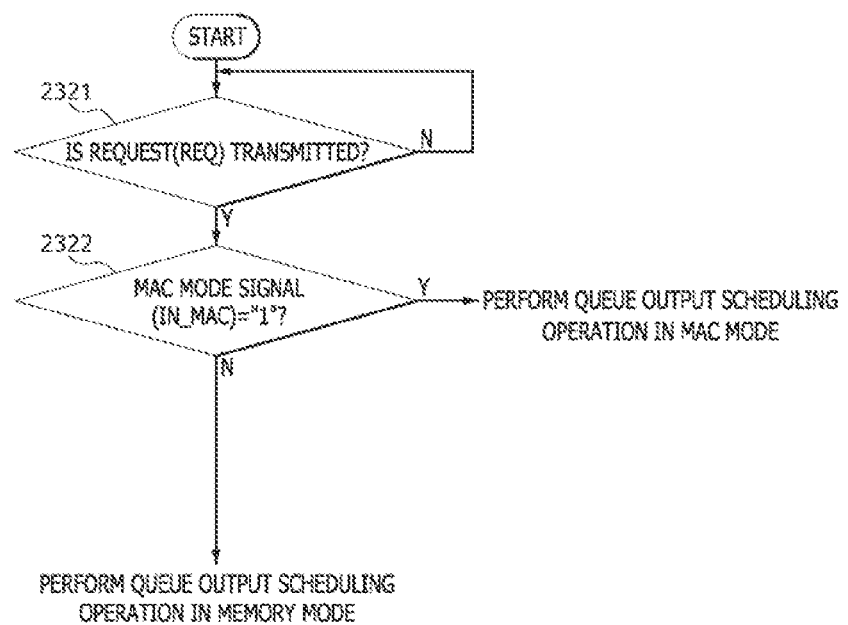
FIG. 67 is a flowchart illustrating a queue output scheduling operation performed by a scheduling logic circuit of a PIM controller included in the PIM system illustrated in FIG. 53.

FIG. 67 is a flowchart illustrating a queue output scheduling operation performed by the scheduling logic circuit 2230 of the PIM controller 2200 included in the PIM system 2000 illustrated in FIG. 53. Referring to FIG. 67, the scheduling logic circuit 2230 of the PIM controller 2200 may determine whether a request REQ is transmitted from the host to the scheduling logic circuit 2230 (see step 2321). If it is determined that a request REQ is transmitted from the host to the scheduling logic circuit 2230, a step 2322 may be executed. If a request REQ is not transmitted from the host to the scheduling logic circuit 2230, the scheduling logic circuit 2230 may maintain a standby status. When it is determined that a request REQ is transmitted from the host to the scheduling logic circuit 2230, the scheduling logic circuit 2230 may determine whether the MAC mode signal IN_MAC has a logic "high(1)" level or a logic "low(0)" level at the step 2322. When the MAC mode signal IN_MAC has a logic "high(1)" level, it means that the MAC queue MAC_Q exists in the MAC queue logic circuit 2260. In contrast, when a level of the MAC mode signal IN_MAC does not have a logic "high(1)" level (i.e., the MAC mode signal IN_MAC has a logic "low(0)" level), it means that the MAC queue MAC_Q is absent from the MAC queue logic circuit 2260. When the MAC mode signal IN_MAC has a logic "high(1)" level at the step 2322, the scheduling logic circuit 2230 may perform the queue output scheduling operation in the MAC mode. When the MAC mode signal IN_MAC has a logic "low(0)" level at the step 2322, the scheduling logic circuit 2230 may perform the queue output scheduling operation in the memory mode.

Figure 68:
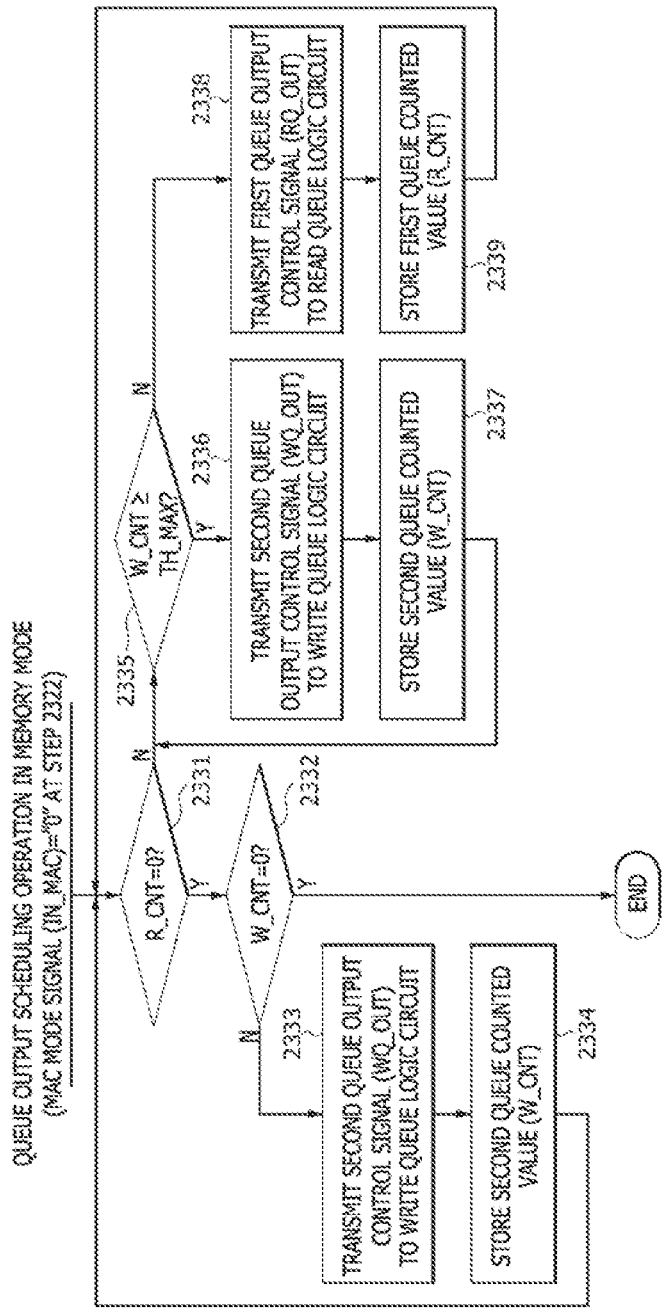
FIG. 68 is a flowchart illustrating a queue output scheduling operation performed in a memory mode by a scheduling logic circuit of a PIM controller included in the PIM system illustrated in FIG. 53.

FIG. 68 is a flowchart illustrating a queue output scheduling operation performed in the memory mode by the scheduling logic circuit 2230 of the PIM controller 2200 included in the PIM system 2000 illustrated in FIG. 53. As described with reference to FIG. 67, when the MAC mode signal IN_MAC has a logic "low(0)" level (i.e., the MAC queue MAC_Q is absent from the MAC queue logic circuit 2260) at the step 2322, the scheduling logic circuit 2230 may perform the queue output scheduling operation in the memory mode. Referring to FIG. 68, the scheduling logic circuit 1230 may determine whether the first queue counted value R_CNT is "0" (see step 2331). When the first queue counted value R_CNT is "0", it means that no read queue RD_Q exist in the read queue logic circuit 2210. When the first queue counted value R_CNT is determined to be "0", whether the second counted value W_CNT is "0" may be determined at a step 2332. When the second counted value W_CNT is determined to be "0", it means that the write queue WT_Q is absent from the write queue logic circuit 2220. That is, when the first queue counted value R_CNT is determined to be "0" at the step 2331 and the second counted value W_CNT is determined to be "0" at the step 2332, the queue output scheduling operation may terminate because none of the read queues RD_Q and the write queues WT_Q to be outputted exist in the read queue logic circuit 2210 and the write queue logic circuit 2220. When the second counted value W_CNT is not "0" (i.e., the write queue WT_Q exists the write queue logic circuit 2220) at the step 2332, the scheduling logic circuit 2230 may transmit the second queue output control signal WQ_OUT to the write queue logic circuit 2220 (see step 2333). The write queue logic circuit 2220 may output the write queue WT_Q having an output priority in response to the second queue output control signal WQ_OUT and may transmit a value obtained by subtracting one from the second queue counted value W_CNT to the scheduling logic circuit 2230. At a step 2334, the scheduling logic circuit 2230 may store the second queue counted value W_CNT outputted from the write queue logic circuit 2220. Subsequently, the process may be fed back to the step 2331 to determine whether the first queue counted value R_CNT is "0".

In the event that the first queue counted value R_CNT is not "0" (i.e., the read queue RD_Q exists in the read queue logic circuit 2210) at the step 2331, the scheduling logic circuit 2230 may determine whether the second queue counted value W_CNT is equal to or greater than a maximum threshold value TH_MAX at a step 2335. The maximum threshold value TH_MAX may be defined as the number of the write queues WT_Q that fill a portion corresponding to a certain rate of the maximum storage capacity of the write queue storage region 2221 included in the write queue logic circuit 2220. In an embodiment, the maximum threshold value TH_MAX may be set as the number of the write queues WT_Q which can be fully stored in the maximum storage capacity of the write queue storage region 2221. In another embodiment, the maximum threshold value TH_MAX may be set as the number of the write queues WT_Q which can be stored in a portion corresponding to 80% of the maximum storage capacity of the write queue storage region 2221.

When the second queue counted value W_CNT is determined to be equal to or greater than the maximum threshold value TH_MAX at the step 2335, the write queue WT_Q stored in the write queue logic circuit 2220 may be outputted to provide an additional empty storage space in which the write queue WT_Q is stored. That is, the scheduling logic circuit 2230 may transmit the second queue output control signal WQ_OUT to the write queue logic circuit 2220 (see step 2336). The write queue logic circuit 2220 may output the write queue WT_Q having an output priority in response to the second queue output control signal WQ_OUT and may transmit a value obtained by subtracting one from the second queue counted value W_CNT to the scheduling logic circuit 2230. At a step 2337, the scheduling logic circuit 2230 may store the second queue counted value W_CNT outputted from the write queue logic circuit 2220. Subsequently, the process may be fed back to the step 2335 to determine whether the second queue counted value W_CNT is less than the maximum threshold value TH_MAX.

When the second queue counted value W_CNT is less than the maximum threshold value TH_MAX at the step 2335, the read queue RD_Q stored in the read queue logic circuit 2210 may be preferentially outputted because it is unnecessary to prepare an additional empty storage space in which the write queue WT_Q is stored. That is, the scheduling logic circuit 2230 may transmit the first queue output control signal RQ_OUT to the read queue logic circuit 2210 (see step 2338). The read queue logic circuit 2210 may output the read queue RD_Q having an output priority in response to the first queue output control signal RQ_OUT and may transmit a value obtained by subtracting one from the first queue counted value R_CNT to the scheduling logic circuit 2230. At a step 2339, the scheduling logic circuit 2230 may store the first queue counted value R_CNT outputted from the read queue logic circuit 2210. Subsequently, the process may be fed back to the step 2331 to determine whether the first queue counted value R_CNT is "0".

Figure 69:
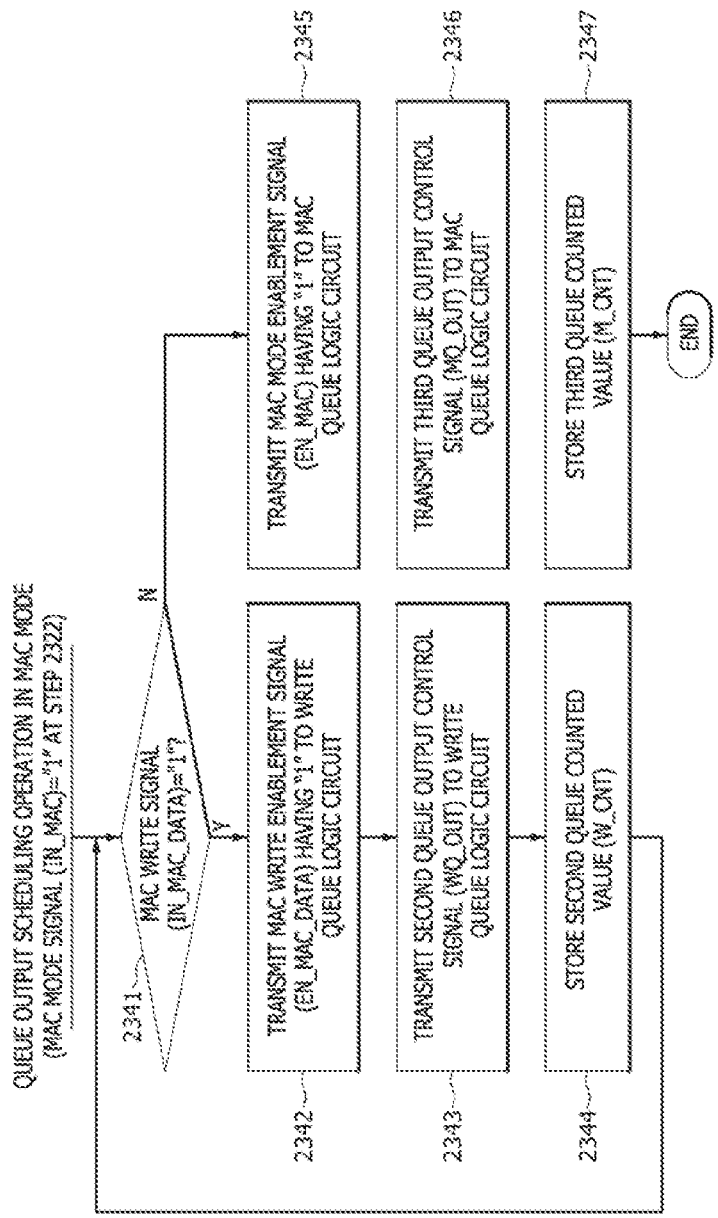
FIG. 69 is a flowchart illustrating a queue output scheduling operation performed in a MAC mode by a scheduling logic circuit of a PIM controller included in the PIM system illustrated in FIG. 53.

FIG. 69 is a flowchart illustrating a queue output scheduling operation performed in the MAC mode by the scheduling logic circuit 2230 of the PIM controller 2200 included in the PIM system 2000 illustrated in FIG. 53. As described with reference to FIG. 67, in the event that the MAC mode signal IN_MAC has a logic "high(1)" level (i.e., the MAC queue MAC_Q exists in the MAC queue logic circuit 2260) at the step 2322, the scheduling logic circuit 2230 may perform the queue output scheduling operation in the MAC mode. In the MAC mode, the scheduling logic circuit 2230 may control the MAC queue logic circuit 2260 such that the MAC queue MAC_Q stored in the MAC queue logic circuit 2260 is preferentially outputted. However, in the event that the MAC write queue MAC_WT_Q exists in the write queue logic circuit 2220, the MAC write queue MAC_WT_Q may be outputted prior to the MAC queue MAC_Q.

Referring to FIG. 69, when the MAC write queue MAC_WT_Q exists in the write queue logic circuit 2220, the write queue logic circuit 2220 may generate and transmit the MAC write signal IN_MAC_DATA having a logic "high(1)" level to the scheduling logic circuit 2230. At a step 2341, the scheduling logic circuit 2230 may determine whether the MAC write signal IN_MAC_DATA has a logic "high(1)" level. When the MAC write signal IN_MAC_DATA is determined to have a logic "high(1)" level, the scheduling logic circuit 2230 may control the write queue logic circuit 2220 such that the MAC write queue MAC_WT_Q in the write queue logic circuit 2220 is preferentially outputted. For the above operation of the scheduling logic circuit 2230, the scheduling logic circuit 2230 may generate and transmit the MAC write enablement signal EN_MAC_DATA having the first level (i.e., a logic "high(1)" level) to the write queue logic circuit 2220 (see step 2342). Moreover, the scheduling logic circuit 2230 may generate and transmit the second queue output control signal WQ_OUT to the write queue logic circuit 2220 (see step 2343). The write queue logic circuit 2220 receiving the MAC write enablement signal EN_MAC_DATA having a logic "high(1)" level and the second queue output control signal WQ_OUT may output the MAC write queue MAC_WT_Q and may transmit a value obtained by subtracting one from the second queue counted value W_CNT to the scheduling logic circuit 2230. At a step 2344, the scheduling logic circuit 2230 may store the second queue counted value W_CNT outputted from the write queue logic circuit 2220. After the step 2344 is executed, the process may be fed back to the step 2341. That is, the steps 2342, 2343, and 2344 may be iteratively executed until the MAC write signal IN_MAC_DATA has a logic "low(0)" level (i.e., all of the MAC write queues MAC_WT_Q in the write queue logic circuit 2220 are outputted) at the step 2341.

When the MAC write signal IN_MAC_DATA has a logic "low(0)" level at the step 2341, it means that the MAC write queue MAC_WT_Q is absent from the write queue logic circuit 2220. In such a case, the scheduling logic circuit 2230 may control the MAC queue logic circuit 2260 such that the MAC queue MAC_Q is outputted from the read queue logic circuit 2260. For the above operation of the scheduling logic circuit 2230, the scheduling logic circuit 2230 may transmit the MAC mode enablement signal EN_MAC having a logic "high(1)" level to the MAC queue logic circuit 2260 (see step 2345). Subsequently, at a step 2346, the scheduling logic circuit 2230 may transmit the third queue output control signal MQ_OUT to the MAC queue logic circuit 2260. The MAC queue logic circuit 2260 receiving the MAC mode enablement signal EN_MAC having a logic "high(1)" level may output the MAC queue MAC_Q stored in the MAC queue storage region 2261. The MAC queue logic circuit 2260 receiving the third queue output control signal MQ_OUT may transmit a value obtained by subtracting one from the third queue counted value M_CNT to the scheduling logic circuit 2230. At a step 2347, the scheduling logic circuit 2230 may store the third queue counted value M_CNT outputted from the MAC queue logic circuit 2260.

Figure 70:
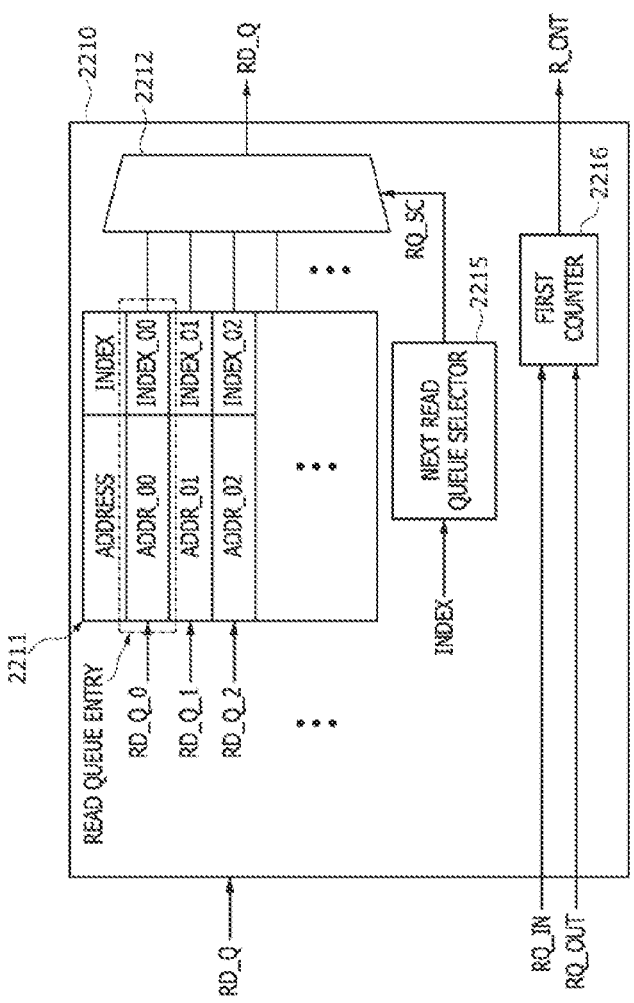
FIG. 70 is a block diagram illustrating a configuration of a read queue logic circuit included in the PIM system illustrated in FIG. 53.

FIG. 70 is a block diagram illustrating a configuration of the read queue logic circuit 2210 included in the PIM system 2000 illustrated in FIG. 53. The write queue logic circuit 2220 included in the PIM system 2000 illustrated in FIG. 53 may have the same configuration as the write queue logic circuit 1220 described with reference to FIGS. 50, 51, and 52. Thus, repeated descriptions of the write queue logic circuit 2220 will be omitted for brevity. Referring to FIG. 70, the read queue logic circuit 2210 may include the read queue storage region 2211, a read queue selection/output circuit 2212, a next read queue selector 2215, and a first counter 2216. The read queue storage region 2211 may have a plurality of read queue entries. Each of the plurality of read queue entries may store one read queue RD_Q. Each of the plurality of read queue entries may include an address ADDRESS and an index INDEX. The address ADDRESS in each read queue entry may be a physical address or a logical address of a region having data to be read out, among a plurality of regions in a data storage region included in the PIM device (2100 of FIG. 53). The index INDEX in each read queue entry may include information on whether the read queue RD_Q stored in the read queue entry is valid and information on a sequence in which the read queue RD_Q stored in the read queue entry is outputted from the read queue logic circuit 2210.

As illustrated in FIG. 70, a first read queue RD_Q_0 having a first address ADDR_00 and a first index INDEX_00 may be stored in a first read queue entry. In addition, a second read queue RD_Q_1 having a second address ADDR_01 and a second index INDEX_01 may be stored in a second read queue entry. Similarly, a third read queue RD_Q_2 having a third address ADDR_02 and a third index INDEX_02 may be stored in a third read queue entry. The present embodiment is illustrated in conjunction with a case for which the first to $(M+1)^{th}$ read queues RD_Q_0, RD_Q_1, ..., and RD_Q_M are sequentially stored in the respective first to last read queue entries when the first to $(M+1)^{th}$ read queues RD_Q_0, RD_Q_1, ..., and RD_Q_M are sequentially transmitted to the read queue logic circuit 2210. However, the present embodiment may be merely an example of the present disclosure. That is, in another embodiment, the read queue RD_Q transmitted to the read queue logic circuit 2210 may be stored in any one of empty read queue entries among all of the read queue entries. In such a case, the index INDEX may include information on a sequence in which the read queue RD_Q stored in the read queue entry is outputted from the read queue storage region 2211.

The read queue selection/output circuit 2212 may receive the read queues RD_Q from the read queue storage region 2211. The read queue selection/output circuit 2212 may selectively output one of the read queues RD_Q received from the read queue storage region 2211 in response to a read queue selection control signal RQ_SC outputted from the next read queue selector 2215. In an embodiment, the read queue selection/output circuit 2212 may be realized using a multiplexer having a plurality of input terminals receiving the read queues RD_Q, a control input terminal receiving the read queue selection control signal RQ_SC, and an output terminal. In such a case, the number of the plurality of input terminals of the multiplexer may be equal to or greater than the number of the read queue entries in the read queue storage region 2211. The next read queue selector 2215 may receive the indexes of the read queue entries from the read queue storage region 2211. The next read queue selector 2215 may detect the read queue entry having a highest output priority through information of the indexes INDEX received from the read queue storage region 2211. In addition, the next read queue selector 2215 may generate and transmit the read queue selection control signal RQ_SC for selectively outputting the read queue RD_Q of the detected read queue entry from the read queue selection/output circuit 2212 to the control input terminal of the read queue selection/output circuit 2212.

The first counter 2216 may count the number of read queues RD_Q stored in the read queue storage region 2211. In order to count the number of read queues RD_Q, the first counter 2216 may receive the first queue input control signal RQ_IN and the first queue output control signal RQ_OUT from the scheduling logic circuit (2230 of FIG. 53). When the read queue RD_Q is stored in the read queue storage region 2211 (i.e., the first queue input control signal RQ_IN is transmitted to the first counter 2216), the first counter 2216 may increase the first queue counted value R_CNT by one and may output the increased value of the first queue counted value R_CNT as the first queue counted value R_CNT. When the read queue RD_Q is outputted from the read queue storage region 2211 (i.e., the first queue output control signal RQ_OUT is transmitted to the first counter 2216), the first counter 2216 may decrease the first queue counted value R_CNT by one and may output the decreased value of the first queue counted value R_CNT as the first queue counted value R_CNT. The first queue counted value R_CNT outputted from the first counter 2216 may be transmitted to the scheduling logic circuit (2230 of FIG. 53).

Figure 71:
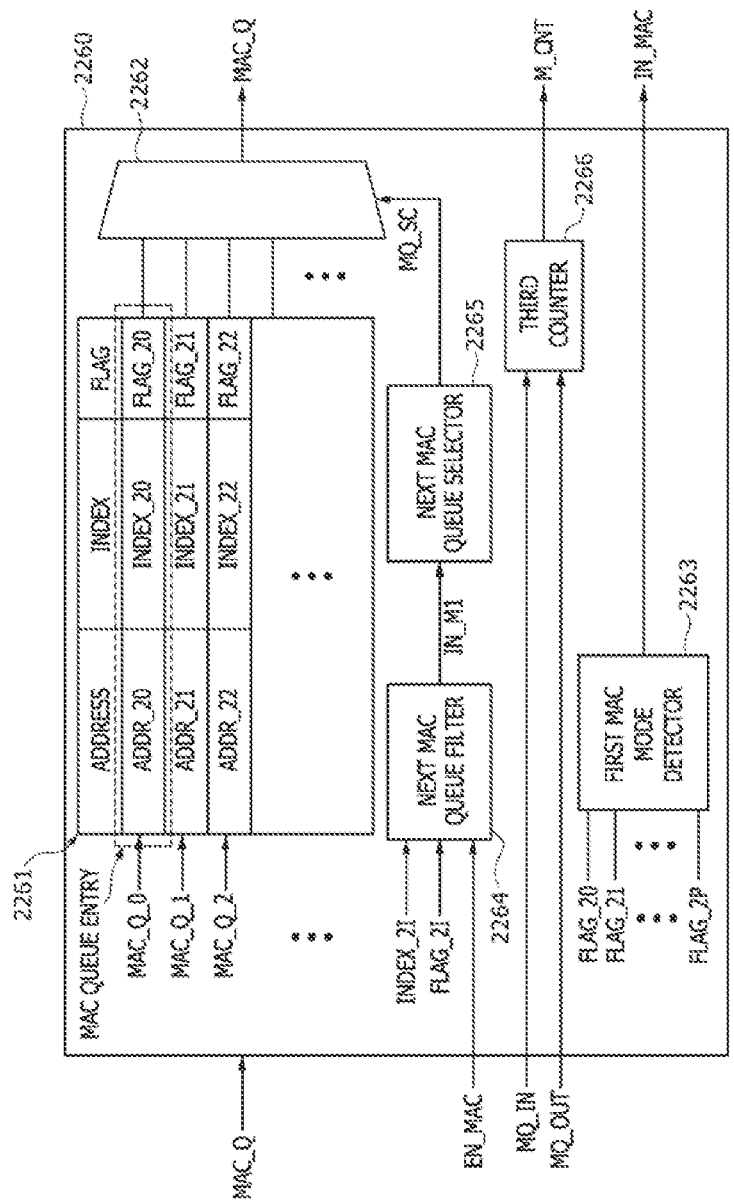
FIG. 71 is a block diagram illustrating a configuration of a MAC queue logic circuit included in the PIM system illustrated in FIG. 53.
Figure 72:
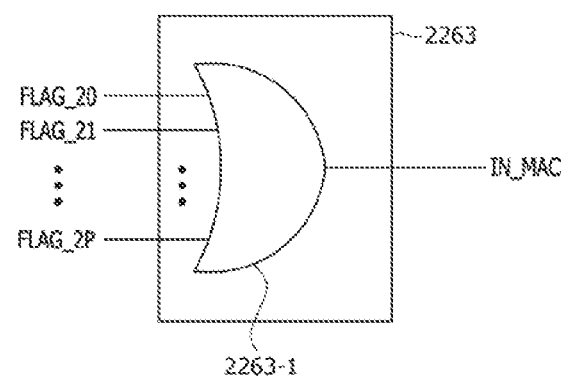
FIG. 72 is a logic symbol illustrating a first MAC mode detector included in the MAC queue logic circuit illustrated in FIG. 71.
Figure 73:
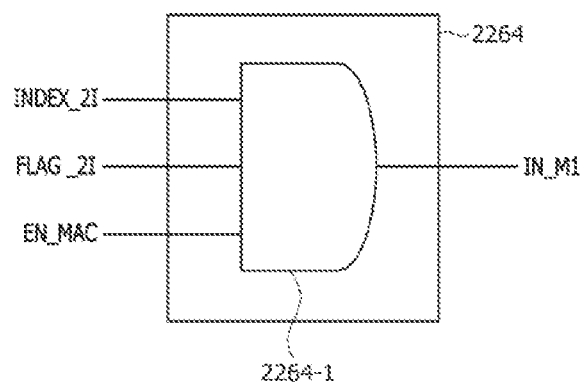
FIG. 73 is a logic symbol illustrating a next MAC queue filter included in the MAC queue logic circuit illustrated in FIG. 71.

FIG. 71 is a block diagram illustrating a configuration of the MAC queue logic circuit 2260 included in the PIM system 2000 illustrated in FIG. 53. FIGS. 72 and 73 show logic symbols illustrating a first MAC mode detector 2263 and a next MAC queue filter 2264 included in the MAC queue logic circuit 2260 illustrated in FIG. 71, respectively. Referring to FIG. 71, the MAC queue logic circuit 2260 may include the MAC queue storage region 2261, a MAC queue selection/output circuit 2262, the first MAC mode detector 2263, the next MAC queue filter 2264, a next MAC queue selector 2265, and a third counter 2266. The MAC queue storage region 2261 may have a plurality of MAC queue entries. Each of the plurality of MAC queue entries may store one MAC queue MAC_Q.

Each of the plurality of MAC queue entries may include an address, an index, and a flag. The address in each MAC queue entry may be a physical address or a logical address of a region having data to be used for the MAC arithmetic operation, among a plurality of regions in a data storage region (corresponding to the data storage region 1110 of FIG. 32) included in the PIM device (2100 of FIG. 53). The index in each MAC queue entry may include information on whether the MAC queue MAC_Q stored in the MAC queue entry is valid and information on a sequence in which the MAC queue MAC_Q stored in the MAC queue entry is outputted from the MAC queue logic circuit 2260. In an embodiment, the index in each MAC queue entry may be set at a point in time when the MAC queue MAC_Q is stored.

The flag in each MAC queue entry may include information which is capable of determining whether the MAC queue MAC_Q is stored in the MAC queue entry. In an embodiment, the flag may have a first binary number or a second binary number. In an embodiment, the first binary number may be "0", and the second binary number may be "1". In an embodiment, the flag of the MAC queue entry may be set as the first binary number of "0" when the MAC queue MAC_Q is absent from the MAC queue entry. In contrast, the flag of the MAC queue entry may be set as the second binary number of "1" when the MAC queue MAC_Q exists in the MAC queue entry. In an embodiment, the flag FLAG in the MAC queue entry may be set at a point in time when the MAC queue MAC_Q is stored in the MAC queue entry.

The MAC queue selection/output circuit 2262 may receive the MAC queues MAC_Q from the MAC queue storage region 2261. The MAC queue selection/output circuit 2262 may output one MAC queue MAC_Q which is selected by a MAC queue selection control signal MQ_SC outputted from the next MAC queue selector 2265. In an embodiment, the MAC queue selection/output circuit 2262 may be realized using a multiplexer having a plurality of input terminals receiving the MAC queues MAC_Q, a control input terminal receiving the MAC queue selection control signal MQ_SC, and an output terminal. In such a case, the number of the plurality of input terminals of the multiplexer may be equal to or greater than the number of the MAC queue entries in the MAC queue storage region 2261.

The first MAC mode detector 2263 may receive a plurality of flags (e.g., first to $(P+1)^{th}$ flags FLAG_20, FLAG_21, ..., and FLAG_2P of the first to $(P+1)^{th}$ MAC queue entries) to output the MAC mode signal IN_MAC. As illustrated in FIG. 72, the first MAC mode detector 2263 may include an OR gate 2263-1 performing a logical OR operation of the flags FLAG_20, FLAG_21, ..., and FLAG_2P of the respective MAC queue entries. When at least one of the flags FLAG_20, FLAG_21, ..., and FLAG_2P of the respective MAC queue entries has a logic "high(1)" level, it means that the MAC queue MAC_Q is stored in at least one of the MAC queue entries. Thus, in such a case, the OR gate 2263-1 may output the MAC mode signal IN_MAC having a logic "high(1)" level which indicates the MAC mode. In contrast, when all of the flags FLAG_20, FLAG_21, ..., and FLAG_2P of the respective MAC queue entries have a logic "low(0)" level, it means that the MAC queue MAC_Q is absent from each of the MAC queue entries. Thus, in such a case, the OR gate 2263-1 may output the MAC mode signal IN_MAC having a logic "low(0)" level which indicates the memory mode. The MAC mode signal IN_MAC outputted from the OR gate 2263-1 (i.e., the first MAC mode detector 2263) may be transmitted to the scheduling logic circuit (2230 of FIG. 53).

The next MAC queue filter 2264 may receive an index INDEX_2I and a flag FLAG_2I of the $I^{th}$ MAC queue entry and the MAC mode enablement signal EN_MAC to output a first MAC index signal IN_M1 (where, "I" is one of natural numbers 1, 2, ..., P, and (P+1)). As illustrated in FIG. 73, the next MAC queue filter 2264 may include an AND gate 2264-1 performing a logical AND operation of the index INDEX_2I, the flag FLAG_2I, and the MAC mode enablement signal EN_MAC. When the MAC mode enablement signal EN_MAC has a logic "high(1)" level and the flag FLAG_2I has a logic "high(1)" level, the AND gate 2264-1 may output the $I^{th}$ index INDEX_2I as the first MAC index signal IN_M1. The MAC mode enablement signal EN_MAC may be transmitted from the scheduling logic circuit (2230 of FIG. 53) to the next MAC queue filter 2264. The $I^{th}$ index INDEX_2I corresponding to the first MAC index signal IN_M1 outputted from the AND gate 2264-1 may mean an index of the MAC queue entry in which the MAC queue MAC_Q is stored. The first MAC index signal IN_M1 outputted from the next MAC queue filter 2264 (i.e., the AND gate 2264-1) may be transmitted to the next MAC queue selector 2265.

The next MAC queue selector 2265 may receive the first MAC index signal IN_M1 from the next MAC queue filter 2264. When the first MAC index signal IN_M1 corresponding to the index of the MAC queue entry storing the MAC queue MAC_Q is transmitted from the next MAC queue filter 2264 to the next MAC queue selector 2265, the next MAC queue selector 2265 may transmit the MAC queue selection control signal MQ_SC for outputting the MAC queue MAC_Q stored in the MAC queue entry having the index designated by the first MAC index signal IN_M1 to the MAC queue selection/output circuit 2262.

The third counter 2266 may count the number of the MAC queues MAC_Q stored in the MAC queue storage region 2261. In order to count the number of the MAC queues MAC_Q, the third counter 2266 may receive the third queue input control signal MQ_IN and the third queue output control signal MQ_OUT from the scheduling logic circuit (2230 of FIG. 53). In the event that the MAC queue MAC_Q is stored in the MAC queue storage region 2261 (i.e., the third queue input control signal MQ_IN is transmitted from the scheduling logic circuit 2230 to the third counter 2266), the third counter 2266 may count the number of the MAC queues MAC_Q and may increase the counted value by one to output the increased value of the counted value as the third queue counted value M_CNT. In the event that the MAC queue MAC_Q is outputted from the MAC queue storage region 2261 (i.e., the third queue output control signal MQ_OUT is transmitted from the scheduling logic circuit 2230 to the third counter 2266), the third counter 2266 may decrease the counted value by one to output the decreased value of the counted value as the third queue counted value M_CNT. The third queue counted value M_CNT outputted from the third counter 2266 may be transmitted to the scheduling logic circuit 2230.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) controller configured to control a PIM device having a memory function and an arithmetic function, the PIM controller comprising:
a read/arithmetic queue logic circuit configured to store a read queue for requesting to read out data stored in the PIM device and an arithmetic queue for requesting an arithmetic operation of the PIM device,
wherein the read/arithmetic queue logic circuit includes a read/arithmetic queue storage region having a plurality of read/arithmetic queue entries, each of which stores the read queue or the arithmetic queue;

wherein each of the plurality of read/arithmetic queue entries includes a flag;

wherein the flag of a read/arithmetic queue entry in which the read queue is stored among the plurality of read/arithmetic queue entries is set to have a first binary number;

wherein the flag of the read/arithmetic queue entry in which the arithmetic queue is stored among the plurality of read/arithmetic queue entries is set to have a second binary number; and wherein the read/arithmetic queue logic circuit is configured to generate an arithmetic mode signal having a first level based on the flag that is set to have a second binary number, and configured to output the arithmetic queue from the read/arithmetic queue logic circuit in response to receiving an arithmetic mode enablement signal having the first level;

a write queue logic circuit configured to store a write queue for requesting to write data in the PIM device, configured to generate an arithmetic write signal having the first level when an arithmetic write queue used for execution of the arithmetic function exists in the write queue logic circuit, and configured to output the write queue from the write queue logic circuit in response to receiving an arithmetic write enablement signal having the first level; and a scheduling logic circuit configured to perform a scheduling operation by adjusting an output sequence of the read queue, the arithmetic queue, and the write queue, configured to transmit the arithmetic mode enablement signal having the first level to the read/arithmetic queue logic circuit in response to receiving the arithmetic mode signal having the first level, and configured to transmit the arithmetic write enablement signal having the first level to the write queue logic circuit in response to receiving the arithmetic write signal having the first level.

2. The PIM controller of claim 1, wherein each of the plurality of read/arithmetic queue entries further includes an index having information on validity and an output sequence of the read queue or the arithmetic queue stored therein.

3. The PIM controller of claim 2, wherein the read/arithmetic queue logic circuit includes:

a first arithmetic mode detector configured to receive the flags of the plurality of read/arithmetic queue entries to output the arithmetic mode signal;

a next read/arithmetic queue filter configured to receive the flag, the index, and the arithmetic mode enablement signal to generate and output a first arithmetic index signal;

a next read/arithmetic queue selector configured to receive an output signal of the next read/arithmetic queue filter and the indexes of the plurality of read/arithmetic queue entries to generate a read/arithmetic queue selection control signal; and a read/arithmetic queue selection/output circuit configured to receive the read queues and the arithmetic queues from the read/arithmetic queue storage region to output one of the read queues and the arithmetic queues, which is selected by the read/arithmetic queue selection control signal.

4. The PIM controller of claim 3, wherein the first binary number and the second binary number are "0" corresponding to a logic "low(0)" level and "1" corresponding to a logic "high(1)" level, respectively; and wherein the first arithmetic mode detector includes an OR gate for performing a logical OR operation of the flags of the read/arithmetic queue entries to output the result of the logical OR operation as the arithmetic mode signal.

5. The PIM controller of claim 3, wherein the next read/arithmetic queue filter is configured to:

output the index of the read/arithmetic queue entry storing the arithmetic queue as the first arithmetic index signal when the flag and the arithmetic mode enablement signal have a logic "high(1)" level; and output the first arithmetic index signal having a logic "low(0)" level when at least one of the flag and the arithmetic mode enablement signal has a logic "low(0)" level.

6. The PIM controller of claim 3, wherein the next read/arithmetic queue filter includes an AND gate for performing a logical AND operation of the flag, the index, and the arithmetic mode enablement signal and for outputting the result of the logical AND operation as the first arithmetic index signal.

7. The PIM controller of claim 3, wherein the next read/arithmetic queue selector is configured to:

generate the read/arithmetic queue selection control signal for selectively outputting the arithmetic queue stored in the read/arithmetic queue entry having the index designated by the first arithmetic index signal when the first arithmetic index signal is outputted from the next read/arithmetic queue filter; and generate the read/arithmetic queue selection control signal for selectively outputting the read queue having an output priority according to the index when the first arithmetic index signal having a logic "low(0)" level is outputted from the next read/arithmetic queue filter.

8. The PIM controller of claim 3, wherein the read/arithmetic queue logic circuit further includes a first counter to count the total number of the read queues and the arithmetic queues stored in the read/arithmetic queue storage region to generate a first queue counted value.

9. The PIM controller of claim 8, wherein the first counter is suitable for:

performing a first operation that increases the first queue counted value by one to transmit the increased value of the first queue counted value to the scheduling logic circuit when the read queue or the arithmetic queue is stored in the read/arithmetic queue logic circuit; and performing a second operation that decreases the first queue counted value by one to transmit the decreased value of the first queue counted value to the scheduling logic circuit when the read queue or the arithmetic queue is outputted from the read/arithmetic queue logic circuit.

10. The PIM controller of claim 9, wherein the first operation is performed in response to a first queue input control signal outputted from the scheduling logic circuit; and wherein the second operation is performed in response to a first queue output control signal outputted from the scheduling logic circuit.

11. The PIM controller of claim 1, wherein the write queue stored in the write queue logic circuit includes the arithmetic write queue and a memory write queue;

wherein the write queue logic circuit includes a write queue storage region having a plurality of write queue entries, each of which stores the memory write queue or the arithmetic write queue;

wherein each of the plurality of write queue entries includes a flag;

wherein the flag of a certain write queue entry of the plurality of write queue entries is set to have a first binary number when the memory write queue is stored in the certain write queue entry; and wherein the flag of the certain write queue entry of the plurality of write queue entries is set to have a second binary number when the arithmetic write queue is stored in the certain write queue entry.

12. The PIM controller of claim 11, wherein each of the plurality of write queue entries further includes an index having information on validity and an output sequence of the memory write queue or the arithmetic write queue stored therein.

13. The PIM controller of claim 12, wherein the write queue logic circuit includes:

a second arithmetic mode detector configured to receive the flags of the plurality of write queue entries to output the arithmetic write signal;

a next write queue filter configured to receive the flag, the index, and the arithmetic mode enablement signal to generate and output a second arithmetic index signal;

a next write queue selector configured to receive an output signal of the next write queue filter and the indexes of the plurality of write queue entries to generate a write queue selection control signal; and a write queue selection/output circuit configured to receive the memory write queues and the arithmetic write queues from the write queue storage region to output one of the memory write queues and the arithmetic write queues, which is selected by the write queue selection control signal.

14. The PIM controller of claim 13, wherein the first binary number and the second binary number are "0" corresponding to a logic "low(0)" level and "1" corresponding to a logic "high(1)" level, respectively; and wherein the second arithmetic mode detector includes an OR gate for performing a logical OR operation of the flags of the write queue entries to output the result of the logical OR operation as the arithmetic write signal.

15. The PIM controller of claim 13, wherein the next write queue filter is configured to:

output the index of the write queue entry storing the arithmetic write queue as the second arithmetic index signal when the flag and the arithmetic write enablement signal have a logic "high(1)" level; and output the second arithmetic index signal having a logic "low(0)" level when at least one of the flag and the arithmetic write enablement signal has a logic "low(0)" level.

16. The PIM controller of claim 13, wherein the next write queue filter includes an AND gate for performing a logical AND operation of the flag, the index, and the arithmetic write enablement signal and outputting the result of the logical AND operation as the second arithmetic index signal.

17. The PIM controller of claim 13, wherein the next write queue selector is configured to:

generate the write queue selection control signal for selectively outputting the arithmetic write queue stored in the write queue entry having the index designated by the second arithmetic index signal when the second arithmetic index signal is outputted from the next write queue filter; and generate the write queue selection control signal for selectively outputting the memory write queue having an output priority according to the index when the second arithmetic index signal having a logic "low(0)" level is outputted from the next write queue filter.

18. The PIM controller of claim 13, wherein the write queue logic circuit further includes a second counter to count the total number of the memory write queues and the arithmetic write queues stored in the write queue storage region to generate a second queue counted value.

19. The PIM controller of claim 18, wherein the second counter is suitable for:

performing a third operation that increases the second queue counted value by one to transmit the increased value of the first queue counted value to the scheduling logic circuit when the memory write queue or the arithmetic write queue is stored in the write queue logic circuit; and performing a fourth operation that decreases the second queue counted value by one to transmit the decreased value of the second queue counted value to the scheduling logic circuit when the memory write queue or the arithmetic write queue is outputted from the write queue logic circuit.

20. The PIM controller of claim 19, wherein the third operation is performed in response to a second queue input control signal outputted from the scheduling logic circuit; and wherein the fourth operation is performed in response to a second queue output control signal outputted from the scheduling logic circuit.

21. The PIM controller of claim 1, wherein the read/arithmetic queue logic circuit is configured to generate and transmit the arithmetic mode signal having a second level to the scheduling logic circuit when the arithmetic queue is absent from the read/arithmetic queue logic circuit.

22. The PIM controller of claim 21, wherein the scheduling logic circuit is configured to generate and transmit the arithmetic mode enablement signal having the second level to the read/arithmetic queue logic circuit in response to receiving the arithmetic mode signal having the second level.

23. The PIM controller of claim 22, wherein the read/arithmetic queue logic circuit is configured to output the read queue having an output priority in response to receiving the arithmetic mode enablement signal having the second level.

24. The PIM controller of claim 1, wherein the write queue stored in the write queue logic circuit includes the arithmetic write queue and a memory write queue; and wherein the write queue logic circuit is configured to generate and transmit the arithmetic write signal having a second level to the scheduling logic circuit when the arithmetic write queue is absent from the write queue logic circuit.

25. The PIM controller of claim 24, wherein the scheduling logic circuit is configured to generate and transmit the arithmetic write enablement signal having the second level to the write queue logic circuit in response to receiving the arithmetic write signal having the second level.

26. The PIM controller of claim 25, wherein the write queue logic circuit is configured to output the memory write queue having an output priority in response to receiving the arithmetic write enablement signal having the second level.

27. The PIM controller of claim 1, wherein the scheduling logic circuit performs the scheduling operation such that the arithmetic write queue in the write queue logic circuit is outputted prior to the arithmetic queue in the read/arithmetic queue logic circuit when the arithmetic mode signal having the first level is outputted from the read/arithmetic queue logic circuit and the arithmetic write signal having the first level is outputted from the write queue logic circuit.

28. The PIM controller of claim 1,
wherein the scheduling logic circuit performs the scheduling operation such that the arithmetic write queue, the arithmetic queue, and the read queue are sequentially outputted when the arithmetic queue exists in the read/arithmetic queue logic circuit and the arithmetic write queue exists in the write queue logic circuit;
wherein the scheduling logic circuit performs the scheduling operation such that the arithmetic queue, the read queue, and the write queue are sequentially outputted when the arithmetic queue exists in the read/arithmetic queue logic circuit and the arithmetic write queue is absent from the write queue logic circuit; and
wherein the scheduling logic circuit performs the scheduling operation such that the read queue and the write queue are sequentially outputted when the arithmetic queue is absent from the read/arithmetic queue logic circuit.

29. The PIM controller of claim 1,
wherein the scheduling logic circuit performs the scheduling operation such that the read queue and the write queue are sequentially outputted when the arithmetic queue is absent from the read/arithmetic queue logic circuit; and
wherein the scheduling logic circuit performs the scheduling operation such that the write queue has an output priority over the read queue until the number of the write queues stored in the write queue logic circuit becomes less than a maximum threshold value when the number of the write queues stored in the write queue logic circuit is equal to or greater than the maximum threshold value.

30. The PIM controller of claim 1, wherein when an address of the read queue transmitted to the read/arithmetic queue logic circuit is the same as an address of the write queue stored in the write queue logic circuit, data of the write queue stored in the write queue logic circuit are transmitted to a host and the read queue transmitted to the read/arithmetic queue logic circuit is not stored in the read/arithmetic queue logic circuit.

* * * * *